United States Patent [19]
Kimura

[11] Patent Number: 5,903,234
[45] Date of Patent: May 11, 1999

[54] VOLTAGE GENERATING APPARATUS

[75] Inventor: Mutsumi Kimura, Suwa, Japan

[73] Assignee: Seiko Epson Corporation, Tokyo, Japan

[21] Appl. No.: 08/930,284

[22] PCT Filed: Jan. 30, 1997

[86] PCT No.: PCT/JP97/00212

§ 371 Date: Oct. 7, 1997

§ 102(e) Date: Oct. 7, 1997

[87] PCT Pub. No.: WO97/29548

PCT Pub. Date: Aug. 14, 1997

[30] Foreign Application Priority Data

| Feb. 9, 1996 | [JP] | Japan | 8-024520 |
| Jun. 3, 1996 | [JP] | Japan | 8-162309 |
| Jun. 21, 1996 | [JP] | Japan | 8-181518 |
| Aug. 2, 1996 | [JP] | Japan | 8-220616 |

[51] Int. Cl.$^6$ .................................................. H03M 1/66
[52] U.S. Cl. .......................................................... 341/144
[58] Field of Search ................................ 341/144, 150, 341/153, 154, 172

[56] References Cited

U.S. PATENT DOCUMENTS

| 4,937,578 | 6/1990 | Shioda . | |
| 5,453,757 | 9/1995 | Date et al. | 341/150 |

FOREIGN PATENT DOCUMENTS

| A-59-107628 | 6/1984 | Japan . |
| A-1-233919 | 9/1989 | Japan . |
| A-3-190429 | 8/1991 | Japan . |
| A-5-102857 | 4/1993 | Japan . |
| A-6-268522 | 9/1994 | Japan . |
| 7-295521 | 11/1995 | Japan . |
| A-7-295520 | 11/1995 | Japan . |
| A-8-286641 | 11/1996 | Japan . |
| 2-217-128 | 10/1989 | United Kingdom . |

*Primary Examiner*—Brian Young
*Attorney, Agent, or Firm*—Oliff & Berridge, PLC

[57] ABSTRACT

The invention provides a method and apparatus for generating a precise and stable voltage at a high speed. More specifically, there is provided a D/A converter constructed using capacitors having capacitance values which are properly deviated from binary-weighted (2n) capacitance values. This D/A converter has the feature that even if the ratios among a plurality of actual capacitances having weighted values are different from the designed values to an extreme degree, the capacitance value of the jth capacitor is always greater than the sum of the capacitance values of the first through (j−1)th capacitors. This ensures that an unwanted reverse change in the output signal of the D/A converter is prevented from occurring. Furthermore, this technique of the invention can be accomplished without having to use an additional circuit such as a compensation circuit, and therefore this technique is easy and inexpensive.

81 Claims, 69 Drawing Sheets

C1:C2:C3:C4:C5:C6 = 1 : 2 : 4 : 8.56 : 19.02 : 42.27

C1:C2:C3:C4:C5:C6 = 1:2:4:8.56:19.02:42.27

DIGITAL INPUT VALUE $\Delta V < Vth$

FIG.14A
(a)
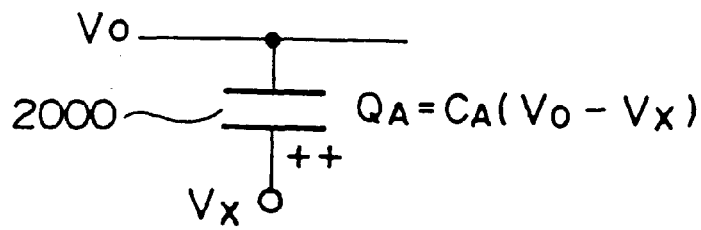
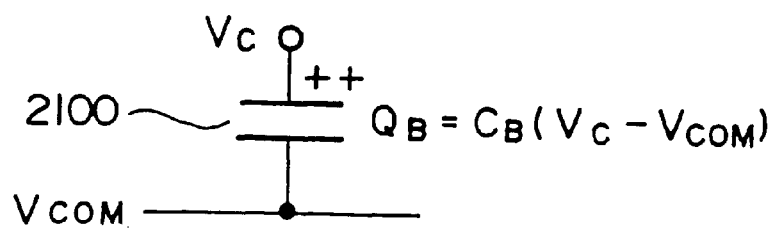
FIG.14B
(b)
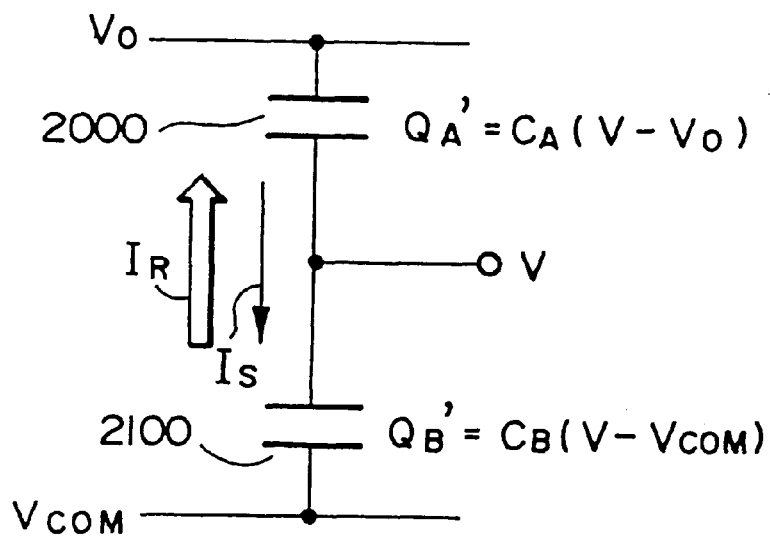

| VOLTAGE NO. | VOLTAGE VALUE |
|---|---|
| Vx16 | ±16.0 |
| Vx15 | ±8.0 |
| Vx14 | ±4.0 |
| Vx13 | ±2.0 |
| Vx12 | ±1.0 |
| Vx11 | ±0.5 |
| Vxs | ±4.0 |

FIG. 32A

| CAPACITOR NO. | CAPACITANCE VALUE(pF) |
|---|---|
| $C_{x16}'$ | 1.1 |
| $C_{x15}'$ | 0.9 |
| $C_{x14}'$ | 1.1 |
| $C_{x13}'$ | 0.9 |
| $C_{x12}'$ | 1.1 |
| $C_{x11}'$ | 0.9 |

| VOLTAGE NO. | VOLTAGE VALUE |
|---|---|
| $V_{x16}'$ | 14.55 |
| $V_{x15}'$ | 8.889 |
| $V_{x14}'$ | 3.636 |
| $V_{x13}'$ | 2.222 |
| $V_{x12}'$ | 0.9091 |
| $V_{x11}'$ | 0.5556 |

FIG. 32B

| CAPACITOR NO. | CAPACITANCE VALUE |
|---|---|
| $C_{x16}''$ | 0.9 |
| $C_{x15}''$ | 0.9 |
| $C_{x14}''$ | 0.9 |
| $C_{x13}''$ | 0.9 |
| $C_{x12}''$ | 0.9 |
| $C_{x11}''$ | 0.9 |

| VOLTAGE NO. | VOLTAGE VALUE |
|---|---|
| $V_{x16}''$ | 16.44 |
| $V_{x15}''$ | 8.222 |
| $V_{x14}''$ | 4.111 |
| $V_{x13}''$ | 2.056 |
| $V_{x12}''$ | 1.028 |
| $V_{x11}''$ | 0.5139 |

FIG. 38

| CAPACITOR NO. | CAPACITANCE VALUE(pF) |
|---|---|
| Cx56 | 1.0 |
| Cx55 | 0.5 |
| Cx54 | 1.0 |
| Cx53 | 0.5 |
| Cx52 | 1.0 |
| Cx51 | 0.5 |
| Cs1 | 2.0 |

| VOLTAGE NO. | VOLTAGE VALUE(V) |
|---|---|
| Vx13 | 13.0 |
| Vx12 | 3.25 |
| Vx11 | 0.8125 |
| Vxs | 3.25 |

| VOLTAGE NO. | VOLTAGE VALUE(V) |
|---|---|
| Vx16 | ±16.0 |
| Vx15 | ±8.0 |
| Vx14 | ±4.0 |
| Vx13 | ±2.0 |
| Vx12 | ±1.0 |
| Vx11 | ±0.5 |
| Vcom | ∓1.0 |
| Vxs | 0 |

| VOLTAGE NO. | VOLTAGE VALUE(V) |
|---|---|
| Vx16 | ±16.0 |
| Vx15 | ±8.0 |
| Vx14 | ±4.0 |
| Vx13 | ±2.0 |
| Vx12 | ±1.0 |
| Vx11 | ±0.5 |
| Vxs | ∓20.0 |
| Vcom | 0 |

| VOLTAGE NO. | VOLTAGE VALUE(V) |
|---|---|
| Vx16 | ±16.0 |
| Vx15 | ±8.0 |
| Vx14 | ±4.0 |
| Vx13 | ±2.0 |
| Vx12 | ±1.0 |
| Vx11 | ±0.5 |
| Vxs | ∓8.0 |
| Vcom | ±3.0 |

6050: SIGNAL LINE PRECHARGING CIRCUIT

FIG.47A

|  | S1 | S2 | S3 |
|---|---|---|---|
| H1 | + | + | + |
| H2 | − | − | − |
| H3 | + | + | + |

FIG.47B

|  | S1 | S2 | S3 |
|---|---|---|---|
| H1 | + | − | + |
| H2 | − | + | − |
| H3 | + | − | + |

BL₁ₛₜ : FIRST BLANKING PERIOD

H₁ₛₜ : FIRST HORIZONTAL SELECTION PERIOD

BL₂ₙd : SECOND BLANKING PERIOD

H₂ₙd : SECOND HORIZONTAL SELECTION PERIOD

VOLTAGE GENERATING APPARATUS

BACKGROUND OF THE INVENTION

FIELD OF THE INVENTION

The present invention relates to a voltage generating apparatus, and more particularly to a D/A converter, a method of designing a D/A converter, a method of precharging signal lines, a circuit for precharging signal lines, and a liquid crystal panel substrate and liquid crystal display device using the above component(s) and method(s).

BACKGROUND OF THE INVENTION

A great number of techniques have been developed to generate a voltage in response to a given signal. However, the problems of these known techniques are that the voltage can deviate from a desired value and that a long time is required for the voltage to reach the final desired value. These problems will be discussed in further detail below.
(1) Deviation of Voltage One known technique of constructing a D/A converter is to use capacitors. The advantage of the D/A converter using capacitors over the D/A converter with resistors is its low power consumption. One type of the D/A converter using capacitors is one with capacitors having capacitance values weighted in a binary fashion. FIG. 74 is a circuit diagram illustrating a conventional D/A converter with binary-weighted capacitors.

This D/A converter shown in FIG. 74 generates an analog output signal corresponding to a 6-bit digital input signal. More specifically, a 6-bit digital signal representing a binary number in the range from "000000" to "111111" (from "0" to "63" in decimal) is input wherein the 6 bits D11–D16 corresponding to the first to sixth digits of the binary number respectively are input via six digital signal lines 5001.

The respective bits D11–D16 of the input digital signal are stored in 2-stage latches A11–A16 and B11–B16. The latches A11–A16 and B11–B16 operate in response to clock signals CL1 and CL2 and also to inverted clock signals nCL1 and nCL2. These clock signals CL1 and CL2 and inverted clock signals nCL1 and nCL2 are generated from the output signal of a shift register (not shown).

The D/A converter has an interconnection line 5002 (at a voltage Vo), interconnection line 5003 (at a voltage Vs), interconnection line 5004 (at ground voltage GND), wherein Vo>Vs>GND. The D/A converter also has an interconnection line 5005 for outputting the analog output signal.

One electrode of each conversion capacitor C11–C16 is connected to the interconnection line 5002. The conversion capacitors C11–C16 are designed to have binary-weighted capacitance values. That is, the ratios of the capacitance values are given by:

C11: C12: C13: C14: C15: C16=1:2:4:8:16:32.

The operation of this D/A converter is described below for the specific case where a digital signal of "000001" is input. In this case, the bit D11 of the input signal is "H" (high), and thus an "H"-level signal is held by the latch A11. On the other hand, the bits D12–D16 of the digital input signal are "L" (low), and therefore the latches A12–A16 hold an "L"-level signal. When a latch pulse is input, the signals held by the 1st-stage latches A11–A16 are transferred to the 2nd-stage latches B11–B16 in response to the clock signal CL2 and the inverted clock signal nCL2.

Then the reset signal R on the interconnection line 5006 is raised to "H" thereby turning on analog switches Ta1–Ta6. As a result, the voltage across each conversion capacitor C11–C16 becomes zero, and thus the charge stored in these capacitors goes out. At the same time, an analog switch T3 is turned on so that a charge corresponding to the difference between the voltage of the interconnection line 5003 (Vs) and the voltage of the interconnection line 5004 (GND) is stored in a reference capacitor Cs1. As a result, the reference capacitor Cs1 has a charge Qs given by $$Qs = Cs1 \cdot Vs \quad (1\text{-}1)$$

Then the reset signal R falls down to "L", and the analog switches Ta1–Ta6 turn off. Furthermore, the set signal S on the interconnection line 5007 is raised to "H". AND operation is performed between the H level of the set signal S and the output level of the respective latches B11–B16. Analog switches Tb1–Tb6 are turned on or off depending on the corresponding results of the AND operation.

In this specific example, the analog switch Tb1 corresponding to the latch B11 is turned on, and, as a result, the conversion capacitor C11 is connected to the reference capacitor Cs1 via the analog switch Tb1. A part of the charge Qs stored in the reference capacitor Cs1 moves into the conversion capacitor C11.

On the other hand, the analog switches Tb2–Tb6 corresponding to the latches B12–B16 are in off-states, and the conversion capacitors C12–C16 are not connected to the reference capacitor Cs1.

As a result of the above operation, the output voltage Vout on the interconnection line 5005 becomes as follows. The charge Qs stored in the reference capacitor Cs1 partially moves into the conversion capacitor C11. After the movement of the charge, the reference capacitor Cs1 has a charge Qs' and the conversion capacitor C11 has a charge Q11' wherein Qs' and Q11' are given by $$Qs' = Cs1 \cdot Vout \quad (1\text{-}2)$$

$$Q11' = C11 \cdot (Vout - Vo) \quad (1\text{-}3)$$

Here, Qs=Qs'+Q11', thus from equations (1-1) through (1-3), the following equation is obtained.

$$Cs1 \cdot Vs = Cs1 \cdot Vout + C11 \cdot (Vout - Vo)$$

From the above equation, Vout is given as $$Vout = (Cs1 \cdot Vs + C11 \cdot Vo)/(Cs1 + C11)$$

The above result has been obtained on the assumption that a digital input signal of "000001" is given. If the above discussion is expanded for general digital input signals, then the Vout becomes $$Vout = (Cs1 \cdot Vs + V11 \Sigma DiCi)/(Cs1 + \Sigma DiCi) \quad (1\text{-}4)$$

where the summation Σ is performed for i=11, 12, 13, 14, 15, and 16, and Di has a value of 1 when the corresponding bits of D11–D16 of the digital signal is at an "H" level while Di has a value of 0 when the corresponding bits of D11–D16 of the digital signal is at an "L" level.

FIG. 75 illustrates the typical conversion characteristic of the conventional D/A converter described above. As can be seen, the analog output signal is a function of the digital input signal wherein the analog output signal varies along a gradually curved line. In other words, the conversion characteristic of the conventional D/A converter is not linear.

The reason for the nonlinearity is that the denominator of equation (1-4) has a term (ΣDiCi) which varies depending on the values of the bits D11–D16 of the digital input signal, and the variation in this term causes a deviation from the proportional relationship. To avoid the above problem, it is required that the denominator should be a constant.

Furthermore, the conventional D/A converter has discontinuities in its conversion characteristic, which can cause a deviation from a desired output voltage. In FIG. 75, for example, there is a discontinuous reverse change at a point where the digital input signal has a value of "32" in decimal (100000 in binary). That is, the analog output voltage for the input of "32" becomes lower than the output voltage for the input of "31" (011111 in binary). The above discontinuity occurs if the ratio of Add the conversion capacitance C16 corresponding to the most significant bit to the sum of the conversion capacitances C11–C15 corresponding to the less significant bits has a deviation from an ideal ratio 32:31.

In practice, it is difficult to produce capacitors without introducing any deviation from the ideal values. In particular, in the case of a large capacitance, there is a tendency that the error from the designed value becomes large. For the above reason, the analog output voltage can deviate from the ideal value corresponding to the digital input signal, and the analog output voltage can even decrease with the increase in the digital input signal. This anomalous reduction in the analog output voltage is usually called reversing phenomenon.

(2) Long time required for the output voltage to reach a desired value

It is known in the technology of active matrix display devices, in particular active matrix liquid crystal display device, to precharge signal lines to proper voltages before supplying an image signal onto the signal lines thereby reducing the amount of charge which has to be put or removed onto or from the signal lines by the image signal itself, thus increasing the speed of driving the liquid crystal.

FIGS. 76A and 76B are simplified schematic representations of the operation of precharging signal lines and its effects for the case where a liquid crystal display device of the active matrix type is driven in such a manner that the driving polarity is inverted every horizontal scanning period (or every horizontal line).

In FIG. 76B, "S1" denotes a signal line, and "H1, H2" denote first and second scanning lines, respectively. Reference numerals 6012 and 6014 denote switching devices such as TFTs. Reference numerals 6022 and 6024 denote liquid crystal cells. "C30" denotes a stray capacitance associated with the signal line S1 (that is, the equivalent capacitance of the signal line S1). Furthermore, symbols "−" and "+" on the left side of FIG. 76B indicate that these liquid crystal cells 6022 and 6024 are driven in an inverting fashion. Herein, it is assumed that "black" signals are displayed by the liquid crystal cells 6022 and 6024.

As shown in FIG. 76A, the liquid crystal cell 6022 displays a "black" signal (having a black level voltage B1) during a horizontal scanning period T1. During the following horizontal scanning period T2, the liquid crystal cell 6024 displays a "black" signal (having a black level voltage B2). Although "black" is displayed by both the liquid crystal cells, the signal voltages applied to these cells are opposite in polarity. Therefore, the black level voltages B1 and B2 are at the farthest locations from each other.

If precharging is not performed, the whole stray capacitance C30 associated with the signal line S1 is charged (or discharged) by the image signal itself so that the signal line voltage is changed from the black level voltage B1 to the black level voltage B2 along the curve "R1" in FIG. 76A.

On the other hand, if the signal line is precharged to a voltage with the same polarity as that of the image signal before being driven by the image signal, that is, if the signal line S1 is held at a precharging voltage PV2 before the beginning of the period T2, the image signal is now required only to change the signal line voltage from the precharging voltage PV2 to the black level voltage B1 along the curve "R2" in FIG. 76A. In this case, the image signal line is required to charge the stray capacitance C30 associated with the signal line S1 by only a small amount, and thus high-speed driving of the liquid crystal panel is achieved.

If the resolution of the liquid crystal display panel is increased, it is required to drive the liquid crystal panel at a higher speed and thus it is desirable to precharge each signal line in a shorter time. On the other hand, with the increase in the size of the liquid crystal display panel, the length of each signal line increases and the stray capacitance of the signal line correspondingly increases. This results in an increase in the precharging time.

The above increase in the stray capacitance can make it impossible for the signal line voltage to reach precharging voltage in the given precharging time. The error in the precharging voltage due to the insufficient precharging operation causes an error in the pixel brightness level. Although the signal lines can be precharged in a shorter time period, the reduction in the precharging time results in an increase in power consumption.

In view of the above, the object of the present invention is to provide means for generating a precise voltage in a short time period in a stable fashion.

SUMMARY OF THE INVENTION

According to an aspect of the present invention, there is provided a D/A converter including: a plurality of conversion capacitors having capacitance values weighted by factors depending on input bits, one end of each conversion capacitor being maintained at a fixed voltage; a coupling capacitor whose one end is maintained at a fixed voltage; and switches disposed between the other end of each conversion capacitor and the other end of the coupling capacitor, the switches being opened or closed in accordance with the input bits; whereby an analog voltage corresponding to a digital input value is obtained from the common node of the other end of the coupling capacitor and the switches, wherein the designed capacitance values of the plurality of conversion capacitors satisfies equation (1) described below:

$$Coj-dCj > \Sigma_{(i<j)}(Coi+dCi) \text{ (for all } j\text{)} \tag{1}$$

where $Ci$: ith conversion capacitance, $Coi$: designed value of the ith conversion capacitance, $dCi$: dispersion of the ith conversion capacitance, $Cj$: jth conversion capacitance, $Coj$: designed value of the jth conversion capacitance, $dCj$: dispersion of the jth conversion capacitance, $\Sigma_{(i<j)}$: sum for all i smaller than j, and for all j: indicating that the equation should be satisfied for all j.

In this D/A converter, even if a plurality of weighted capacitance values deviate from their ideal values to an extreme degree, the above design ensures that the capacitance value of the jth capacitor is always greater than the sum of capacitance values of the first to (j−1)th capacitors. Thus, a "reverse change in the output signal" no longer occurs. Furthermore, this technique can be accomplished without having to use an additional circuit such as a compensation circuit, and therefore this technique is easy and inexpensive.

In this D/A converter, the conversion capacitors are preferably made up of an insulating film and two electrodes formed of either a thin amorphous film or a thin polysilicon film, the insulating film being disposed between the two electrodes.

In this case, the D/A converter is realized with capacitors formed of a thin amorphous film or thin polysilicon film.

Preferably, the switches may be analog switches constructed using thin film transistors (TFTs);

the conversion capacitors may be made up of an insulating film and two electrodes formed of either a thin amorphous film or a thin polysilicon film, the insulating film being disposed between the two electrodes; and the thin film transistors (TFTs) forming the analog switches and the conversion capacitors may be formed on the same substrate.

In this preferable mode, the D/A converter is constructed with thin film capacitors and thin film transistors (TFTs) all formed on the same substrate. That is, the whole parts of the D/A converter can be easily constructed into a compact form using the thin film technology.

According to another aspect of the invention, there is provided a method of designing the above D/A converter, the method including the following steps:

(step 1)

Coi and dCi are set for all i;

(step 2)

j is set such that j=2;

(step 3)

it is checked whether equation (1) described above is satisfied or not, and if it is concluded that equation (1) is not satisfied, the value of Coj is modified;

(step 4)

j is incremented; and (step 5)

steps 3 and 4 are performed repeatedly for all j.

In this method of designing the D/A converter, the dispersions in the capacitances dCi (for all i) are limited within the particular ranges so that no reverse change occurs in the output voltage even if the actual capacitances deviate from their ideal values, as long as the deviations are within the above ranges. If the above allowable ranges of capacitances are properly determined taking into account the variations in production conditions, it is possible to produce the D/A converter with high reliability.

In this designing method, the initial values of Coi may be set to binary-weighted values. In this case, it is possible to design the D/A converter with capacitors having binary-weighted capacitance values, in which no reverse change in the output voltage occurs.

According to still another aspect of the invention, there is provided a D/A converter including: a plurality of conversion capacitors having capacitance values weighted by factors depending on input bits, one end of each conversion capacitor being maintained at a fixed voltage; a coupling capacitor whose one end is maintained at a fixed voltage; and switches disposed between the other end of each conversion capacitor and the other end of the coupling capacitor, the switches being opened or closed in accordance with the input bits; whereby an analog voltage corresponding to a digital input value is obtained from the common node of the other end of the coupling capacitor and the switches, wherein the designed capacitance values of the plurality of conversion capacitors satisfies equation (2) described below:

$$\{Vc \cdot Cs + Vo(Coj - dcj)\}/\{Cs + (Coj - dcj)\} - \{Vc \cdot Cs + Vo(\Sigma_{(i<j)}(Coi + dCi))\}/\{Cs + \Sigma_{(i<j)}(Coi + dCi)\} > -Vth \text{(for all } j\text{)} \quad (2)$$

where

Cs: coupling capacitance,

Vc: voltage at the other end of the coupling capacitor before the switch is closed, Vo: voltage at the other end of the conversion capacitors before the switch is closed, Coi: designed value of the ith conversion capacitance, dCi: dispersion of the ith conversion capacitance, Coj: designed value of the jth conversion capacitance, dCj: dispersion of the jth conversion capacitance, Vth: maximum change (visually recognizable threshold value) in the output voltage of the D/A converter, which cannot be recognized by human eyes when an image is displayed in such a manner that the brightness of the image corresponds to the output voltage of the D/A converter, $\Sigma_{(i<j)}$: sum for all i smaller than j, and for all j: indicating that the equation should be satisfied for all j.

In this D/A converter, even if a reverse change occurs in the output voltage, the amount of the reverse change never exceeds the visually recognizable threshold value (Vth). Therefore, when an image is displayed in accordance with the brightness information represented by the output of the D/A converter, the reverse change cannot be recognized by human eyes. Thus, no degradation in image quality occurs. In practice, the visually recognizable threshold value (Vth) is of the order of 20 mV.

According to a further aspect of the invention, there is provided a method of designing the above D/A converter, the method including the following steps:

(step 1)

Coi and dCi are set for all i;

(step 2)

j is set such that j=2;

(step 3)

it is checked whether equation (2) described above is satisfied or not, and if it is concluded that equation (2) is not satisfied, the value of Coj is modified;

(step 4)

j is incremented; and (step 5) steps 3 and 4 are performed repeatedly for all j.

In this method of designing the D/A converter, the dispersions in the capacitances dCi are limited within the particular ranges so that no reverse change occurs in the output voltage even if the actual capacitances deviate from their ideal values, as long as the deviations are within the above ranges. Since the amount of the reverse change never exceeds the visually recognizable threshold value (Vth), no degradation in image quality occurs. If the above allowable ranges of capacitances are properly determined taking into account the variations in production conditions, it is possible to produce the D/A converter with high reliability.

According to another aspect of the invention, there is provided a liquid crystal panel substrate, including: a plurality of scanning lines; a plurality of signal lines; thin film elements disposed at respective intersections between the scanning lines and the signal lines, for controlling the electrical connections between a liquid crystal and the signal lines; and a driving circuit for driving the plurality of signal lines;

the liquid crystal panel substrate being characterized in that the driving circuit for driving the plurality of signal lines includes the D/A converter described above.

With this technique, it is possible to realize a liquid crystal panel substrate having a D/A converter which produces no conversion error which can cause a reversing change in the image brightness, or a small conversion error, if produced, within the allowable range which cannot be recognized.

In this liquid crystal panel substrate according to the invention, the conversion capacitors and the switches forming the D/A converter may be produced by the same production process on the same substrate as the production process and the substrate for those thin film elements provided to control the electrical connections between a liquid crystal and the signal lines.

The common use of the same production process makes it easy to produce the liquid crystal panel substrate.

According to another aspect of the invention, there is provided a liquid crystal display device using the liquid crystal panel substrate described above. With this technique, it is possible to realize a high-reliability liquid crystal display device which encounters no reversing change in the image brightness due to an conversion error of the D/A converter, or a small reversing change, if encountered, within the allowable range which cannot be recognized.

According to still another aspect of the present invention, there is provided a D/A converter for converting a digital signal consisting of n (integer) bits Di (i=1, 2, . . . , n) to an analog output signal Vout, the D/A converter including:

n conversion capacitors Cxi corresponding to the respective bits Di of the digital signal;

at least one conversion selection line along which n different voltages Vxi corresponding to the respective bits Di of the digital signal;

an output line via which the analog output signal Vout is output; and a first reference voltage line connected to one electrode of each conversion capacitor Cxi and maintained at a voltage Vs1;

wherein the other side electrodes of those of the conversion capacitors Cxi corresponding to those of the bits Di of the digital signal in an on-state are connected to the conversion selection line so that conversion charges corresponding to the differences between the voltages Vxi and Vs1 are stored in the corresponding conversion capacitors Cxi;

the other side electrodes of those of the conversion capacitors Cxi corresponding to those of the bits Di of the digital signal in an off-state are connected to a predetermined line;

after the conversion charges have been stored, the other side electrodes are electrically disconnected from the conversion selection line or the predetermined line and then connected to the output line so that the conversion charges are all combined together and an analog output signal Vout corresponding to the total charge is output.

In this mode of the D/A converter according to the invention, there are provided conversion capacitors Cx1–Cxn corresponding to the respective bits D1–Dn of the digital input signal. A voltage equal to Vs1 is supplied to one electrode of each conversion capacitor Cx1–Cxn. On the other hand, voltages Vx1–Vxn or a predetermined voltage are supplied to the other side electrodes of the respective conversion capacitors Cx1–Cxn.

When some bits of D1–Dn of the digital input signal are in an on-state, the voltages Vx1–Vxn are supplied to the other side electrodes of the corresponding conversion capacitors Cx1–Cxn, and thus charges corresponding to the differences between voltages Vx1–Vxn and voltage Vs1 are stored in these conversion capacitors.

On the other hand, the predetermined voltage is supplied to the other side electrodes of those conversion capacitors Cx1–Cxn corresponding to the off-state bits of the digital input signal D1–Dn. If the above predetermined voltage is equal to the voltage applied to the first side electrode, no charge is stored. In the case where the other side electrodes of the conversion capacitors Cx1–Cxn are connected to the first reference voltage line, the voltages on both electrodes become equal.

Alternatively, when some bits of D1–Dn of the digital input signal are in an off-state, the other side electrodes of the corresponding conversion capacitors of Cx1–Cxn may be connected to another interconnection line different from the first reference voltage line.

In any case, in the D/A converter in this mode of the invention, the charges stored in the respective conversion capacitors Cx1–Cxn vary depending on whether the respective bits D1–Dn of the digital input signal are in an on- or off-state. If the above voltages Vx1–Vxn and the above predetermined voltage are properly set so that the analog output voltage correctly varies in accordance with the digital input signal represented by the on/off state of the respective bits D1–Dn, then correct D/A conversion can be achieved. The above voltages may be adjusted easily even after the completion of the production of the D/A converter. Discontinuity in the D/A conversion characteristic can be removed by properly performing the above voltage adjustment.

Preferably, the D/A converter may further include:

a second reference voltage line maintained at a voltage Vs2; and a reference capacitor Cs formed on the output line, for storing a reference charge corresponding to the difference between the voltages Vs1 and Vs2 on the first and second reference voltage lines;

wherein the predetermined line, to which the other side electrodes of those of the conversion capacitors Cxi corresponding to those of the bits Di of the digital signal in the off-state are connected, constitute the first reference voltage line;

the total charge is the sum of the conversion charges and the reference charge; and the analog output signal Vout is given by $$Vout=(\Sigma Cxi(Di \cdot Vxi+Vs1(1-Di))+Cs \cdot Vs2)/(\Sigma Cxi+Cs)$$

where Di have a value of 1 when the corresponding bits Di of the digital signal are in the on-state while they have a value of 0 when the corresponding bits Di of the digital signal are in the off-state.

In this D/A converter according to the invention, since the same voltage Vs1 is supplied to both electrodes of those of conversion capacitors Cx1–Cxn corresponding to the off-state bits of D1–Dn of the digital input signal, no charge is stored in those conversion capacitors.

On the other hand, the reference charge is given to the reference capacitor Cs regardless of the on/off state of the bits D1–Dn of the digital input signal so that the analog output signal Vout on the output line is raised by a fixed amount.

The above equation can be obtained as follows. The sum of the charges $\Sigma Qi$ initially stored in the conversion capacitors Ci is given by $$\Sigma Qi=\Sigma Cxi(Di(Vxi-Vs1))$$

where Di has a value of 1 when the corresponding bits of D11–D16 of the digital signal is at an "H" level while Di has a value of 0 when the corresponding bits of D11–D16 of the digital signal is at an "L" level.

The charge Qs stored in the reference capacitor Cs is given by $$Qs = Cs(Vs2 - Vs1)$$

After that, the conversion capacitors Ci are disconnected from the conversion selection lines and the predetermined line, and are connected to the output line. In this state, if the total charge stored in the conversion capacitors Ci is denoted by $\Sigma Qi'$, and the charge stored in the reference capacitor Cs is denoted by Qs', then the following equations hold.

$$\Sigma Qi' = \Sigma Cxi(Vout - Vs1)$$

$$Qs' = Cs(Vout - Vs1)$$

Herein the following equation holds:

$$\Sigma Qi + Qs = \Sigma Qi' + Qs'$$

Thus, $$\Sigma Cxi(Di(Vxi - Vs1)) + Cs(Vs2 - Vs1) = \Sigma Cxi(Vout - Vs1) + Cs(Vout - Vs1)$$

From the above equation, Vout is given as $$Vout = (\Sigma Cxi(Di \cdot Vxi + Vs1(1 - Di)) + Cs \cdot Vs2)/(\Sigma Cxi + Cs)$$

In the above equation, the denominator is constant regardless of the value of the digital input signal Di. Therefore, the analog output signal Vout becomes proportional to the digital input signal Di. Thus, a linear D/A conversion characteristic is obtained.

Preferably, the D/A converter further includes
a first switch connected between the other side electrodes of the conversion capacitors Cxi and the conversion selection line;
a second switch connected between the other side electrodes of the conversion capacitors Cxi and the predetermined line; and
a third switch connected between the other side electrodes of the conversion capacitors Cxi and the output line.
Alternatively, the D/A converter may further include
a first switch connected between the other side electrodes of the conversion capacitors Cxi and the conversion selection line;
a second switch connected between the other side electrodes of the conversion capacitors Cxi and the first reference voltage line;
a third switch connected between the other side electrodes of the conversion capacitors Cxi and the output line; and
a fourth switch for controlling electric connection so that an voltage is applied to the reference capacitor Cs from either the first or second reference voltage line.

In this D/A converter, as described above, the application of the voltages to the conversion capacitors Cxi and the reference capacitor Cs is controlled by the above switches.

In this D/A converter, it is preferable that there be provided n conversion selection lines for supplying n different voltages Vxi. This is the most simple way of supplying n different voltages Vxi.

Alternatively, the D/A converter may further include a high voltage line, a low voltage line, and n–1 resistors connected in series between the high voltage line and the low voltage line;
wherein the conversion selection lines comprise: a line connecting a resistor directly to the high voltage line; lines connecting adjacent resistors; and a line connecting a resistor directly to the low voltage line.

In this D/A converter according to the invention, the interconnection line between the high voltage line and the resistor directly connected to the high voltage line serves as the conversion selection line at the highest voltage of voltages Vxi. Since the voltage drop increases with the number of resistors, the interconnection lines which connect adjacent resistors serve as the conversion selection lines whose voltage decreases from resistor to resistor. The interconnection line between the low voltage line and the resistor directly connected to the low voltage line serves as the conversion selection line at the lowest voltage.

In the D/A converter according to the present invention, it is preferable that there be provided one conversion selection line, the voltage supplied on which varies with time so that n different voltages Vxi are supplied.

More specifically, it is preferable that the D/A converter further include:
n conversion pulse lines corresponding to the respective n conversion capacitors Cxi;
wherein whenever the time-varying voltage on the conversion selection line reaches a voltage Vxi to be supplied to a corresponding conversion capacitor Cxi, a pulse signal is applied to a corresponding one of the conversion pulse lines; and
in response to the pulse signal, the voltage Vxi is supplied to the conversion capacitor Cxi.

In this mode of D/A converter according to the invention, as described above, various voltages can be obtained by the time-varying voltage supplied via only one conversion selection line, which is the smallest possible number of conversion selection lines. That is, when pulse signals are input to n conversion pulse lines, a desired voltage corresponding to the input pulse signals is obtained.

In the D/A converter according to the present invention, it is preferable that the n different voltages Vxi supplied to the conversion selection lines form a geometric progression with a common ratio of 2.

This makes it possible to store charges into the respective conversion capacitors Cxi in such a manner that the amounts of the charges correspond to the binary-weighted values. Thus, the D/A converter has a linear D/A conversion characteristic.

According to a further aspect of the invention, there is provided a D/A converter for converting a digital signal consisting of n (integer) bits Di (i=1, 2, . . . , n) to an analog output signal Vout, the D/A converter including:
n conversion capacitors Cxi corresponding to the respective bits Di of the digital signal;
at least one conversion selection line via which different voltages Vxi are supplied;
wherein the voltages Vxi and the capacitance values of the conversion capacitors Cxi are set so that conversion charges corresponding to the respective bit values Di of the digital signal are stored in the corresponding conversion capacitors Cxi and so that an analog output signal Vout corresponding to the total value or the sum of the conversion charges is output.

In this D/A converter according to the invention, as described above, a plurality of different voltages Vxi are used to store conversion charges in accordance with the bit values Di of the digital signal. The voltages Vxi may be adjusted in accordance with the actual capacitance values of the conversion capacitors Cxi corresponding to the respective voltages Vxi. Thus, it is possible to realize a D/A converter having a linear D/A conversion characteristic.

According to another aspect of the invention, there is provided a D/A conversion method for converting a digital signal consisting of n (integer) bits Di (i=1, 2, ..., n) to an analog output signal Vout, the method including the steps of:

for each on-state bit of the digital signal, storing a conversion charge into the corresponding one of n conversion capacitors Cxi in accordance with the corresponding voltage of n different voltages Vi, while maintaining the conversion charges, stored in those of the conversion capacitors Cxi corresponding to the off-state bits Di of the digital signal, constant regardless of the bits Di; and determining the sum of the conversion charges and supplying an analog output signal Vout corresponding to the total charge equal to the sum of the conversion charges.

In the D/A conversion method according to the present invention, it is preferable that if the capacitance values of the conversion capacitors Cxi are different from their designed values, the voltages Vi are adjusted so that the corresponding conversion charges become substantially equal to their designed values. For example, when the actual capacitance values of the conversion capacitors Cxi' are different from their designed values Cxi0, if the mean value of the actual capacitances is equal to the designed value, the voltages Vxi' are adjusted such that $$Vxi'=(Cxi0/Cxi')\times Vxi0.$$

On the other hand, when the actual capacitance values of the conversion capacitors Cxi' are different from their designed values, and the mean value of the actual capacitances is not equal to the designed value, the voltages Vxi' are adjusted such that $$Vxi'=(Cxi0/Cxi')\times(\Sigma Cxi'+Cs)/(\Sigma Cxi0+Cs)\times Vxi0.$$

This technique makes it possible to obtain an analog output voltage equal to the designed value even if the capacitance values of the conversion capacitors Cxi are different from their designed values. Thus, it is possible to achieve a linear D/A conversion characteristic by properly performing the adjustment described above.

In the D/A conversion method according to the present invention, it is also preferable that a reference charge be stored in a reference capacitor so that a corresponding increase occurs in the analog output signal Vout regardless of the on/off state of the digital signal Di;

and that the total charge be the sum of the conversion charges and the reference charge.

Thus, it is possible to raise the lowest value of the analog output voltage Vout.

In the D/A converter according to the present invention, if the capacitance value of the reference capacitor is different from its designed value, the applied voltage may be adjusted so that the reference charge becomes substantially equal to its designed value.

The above adjustment may be performed in a similar manner to that employed when the conversion capacitors Cxi are different from their designed values.

According to still another aspect of the invention, there is provided a D/A conversion method for converting a digital signal consisting of n (integer) bits Di (i=1, 2, ..., n) to an analog output signal Vout, the method including the steps of:

for each on-state bit Di of the digital signal, selecting one voltage from a plurality of different voltages Vxi in accordance with each on-state bit Di of the digital signal, and storing a corresponding conversion charge into the corresponding one of the n conversion capacitors Cxi, while maintaining the conversion charges, stored in those of the conversion capacitors Cxi corresponding to the off-state bits Di of the digital signal, constant regardless of the bits Di; and determining the sum of the conversion charges and supplying an analog output signal Vout corresponding to the total charge equal to the sum of the conversion charges.

In this D/A conversion method according to the invention, a plurality of different voltages Vxi are used to store conversion charges in accordance with the bit values Di of the digital signal wherein the voltages Vxi may be adjusted in accordance with the actual capacitance values of the conversion capacitors Cxi corresponding to the respective voltages Vxi. Thus, it is possible to achieve D/A conversion with good linearity.

According to another aspect of the invention, there is provided a liquid crystal panel substrate serving as one of two substrates of a liquid crystal panel, the substrate including:

a driving circuit for driving the liquid crystal panel; a pixel electrode for applying a voltage to a liquid crystal; and a thin film transistor for controlling the supply of the voltage to the pixel electrode; wherein the driving circuit includes the D/A converter described above.

In this liquid crystal panel substrate according to the invention, since the D/A converter having good linearity is employed, it is possible to realize a liquid crystal panel which encounters no reverse change in the gray level of the image.

In the liquid crystal panel substrate according to the present invention, it is preferable that at least either the conversion capacitors Cxi or the reference capacitor Cs be produced on the same substrate using the same production process as that used to produce the thin film transistor.

According to still another aspect of the invention, there is provided a liquid crystal display device using the liquid crystal panel substrate described above.

In the liquid crystal display device according to the present invention, it is preferable that:

one horizontal scanning period comprises a scanning signal selection period and a blanking period disposed between the selection period and the following selection period; and the storage of the total charge and the supply of the analog output signal Vout are performed during the blanking period.

In the liquid crystal display device according to the present invention, it is also preferable that:

one horizontal scanning period comprises a scanning signal selection period and a blanking period disposed between the selection period and the following selection period;

the storage of the total charge is started in the blanking period; and in the following horizontal scanning period, the storage of the total charge is completed and the analog output signal Vout is supplied.

In this liquid crystal display device according to the present invention, the time period from the start of the storage of the total charge to the end of the storage operation can be set to a long enough value so that the storage can be performed to a sufficient degree.

According to a further aspect of the invention, there is provided a method of precharging signal lines of a display device of the active matrix type, the display device including a plurality of scanning lines; a plurality of signal lines; switching elements connected to the respective scanning lines and the respective signal lines, the precharging being performed before supplying an image signal to the signal lines, the method including the steps of:

preparing switches such that each signal line has its own one switch serving to select one of different precharging DC voltages and selectively connect the signal line to the selected precharging DC voltage; and operating the switches so that the signal lines are connected to one of the precharging DC voltages, thereby precharging the signal line into the same polarity as the polarity of the image signal relative to the center voltage of its amplitude.

In display devices of the active matrix type, in particular liquid crystal display device of the active matrix type, it is required to prevent the liquid crystal from degradation by periodically inverting the polarity of the driving signal. Several techniques are employed in the tart to invert the driving signal. The polarity of the precharging voltage on signal lines should also be inverted in a proper manner in accordance with the polarity of the driving signal which is inverted in accordance with the particular technique. One technique of inverting the precharging polarity is to generate a pulse at the same repetition rate as that of the inverting driving signal and supply the pulse to the signal lines thereby precharging them. However, in this technique, additional interconnection lines are needed to transmit the pulse to the signal lines. Since these interconnection lines are also charged and discharged in the precharging operation, additional power consumption occurs. In particular, when the precharging is performed at a high speed, the above power consumption becomes high. Furthermore, with the increase in the size of the liquid crystal panel, the length of the interconnection lines increases and their stray capacitance correspondingly increases. As a result, the time constant associated with each interconnection line increases and thus the waveform of the precharging pulse becomes dull. This causes degradation in the precharging accuracy. When the signal lines are driven line by line while inverting the polarity of the driving signal every signal line (this driving mode is referred to as the driving with inversion every signal line), it is required that the precharging be performed into both polarities at the same time. This makes it difficult for the above technique to be employed.

In view of the above, the invention offers the novel precharging technique in which a plurality of different DC voltages are prepared, and the precharging is performed by connecting the signal lines to proper DC voltages depending on the polarity of the inverting driving signal applied to the liquid crystal. The above connection is controlled by operating switches disposed between the DC voltages and the signal lines.

In this technique, the charging or discharging associated with the precharging operation occurs only on the signal lines, and therefore the increase in the power consumption with the increase in the precharging speed can be minimized. Furthermore, it is possible to apply precise voltages to the signal lines. That is, the precharging accuracy (stability) can be improved. Furthermore, this technique can be applied to various inverting driving techniques if the operation of switches are properly controlled.

In the method of precharging signal lines according to the invention, there may be provided interconnection lines maintained at the respective precharging DC voltages wherein the interconnection lines are provided such that each precharging DC voltage has its own interconnection line.

In this method, since there are provided a plurality of precharging voltage lines, it is possible to adapt the precharging operation to various inverting driving techniques simply by controlling the operations of switches.

In the method of precharging signal lines according to the invention, it is preferable that the equivalent capacitance of each interconnection line be greater than the equivalent capacitance of each signal line.

If the equivalent capacitances (stray capacitances) of the precharging voltage lines are sufficiently great compared with the equivalent capacitances (stray capacitances) of the signal lines, then the effects of the capacitances of the signal lines can be neglected, and thus the precharging accuracy can be further improved.

Although the precharging voltage lines themselves have rather large capacitances, the capacitances may be further increased by using additional capacitors formed for example of the gate insulating film of MOS transistors.

In the method of precharging signal lines according to the invention, the precharging polarity may be inverted with time every one or more scanning lines.

In this method, the polarity of the precharging voltage is inverted in accordance with the polarity of the liquid crystal driving signal inverted every fixed number of scanning lines. The inversion in the polarity of driving signal every fixed number of scanning lines is effective to prevent flicker, unwanted gradual change in brightness, and cross-talk in the vertical direction.

In the method of precharging signal lines according to the invention, when the display device of the active matrix type is driven line by line, the precharging polarity may be periodically inverted every one or more signal lines.

In this method, the polarity of precharging voltage is inverted in accordance with the line-by-line driving voltage applied to the liquid crystal and also in accordance with the driving voltage inverted every signal line. The inversion in the polarity of liquid crystal driving signal every signal line is effective to prevent flicker and cross-talk in the vertical and horizontal directions. When this precharging method of the invention is coupled with such a driving method, high-accuracy precharging can be performed at a high speed.

In the method of precharging signal lines according to the invention, when the display device of the active matrix type is driven pixel by pixel, the precharging polarity may be periodically inverted every one or more signal lines.

In this method, when the liquid crystal is driven pixel by pixel while inverting the polarity of the driving voltage every signal line, the precharging voltage is inverted into polarity consistent with the driving signal.

In the method of precharging signal lines according to the invention, the precharging of the signal lines may be performed in such a manner that at least some signal lines are simultaneously subjected to the precharging during a certain period in a horizontal selection period prior to a horizontal blanking period.

In this method, precharging is performed making efficient use of the horizontal scanning period and the horizontal blanking period.

In the method of precharging signal lines according to the invention, when the display device of the active matrix type is driven pixel by pixel, the switches connected to the respective signal lines may be sequentially switched at predetermined times in a horizontal blanking period and a horizontal selection period before performing the pixel-by-pixel driving operation, thereby precharging the signal lines.

In this method, when the liquid crystal is driven pixel by pixel, precharging is also performed pixel by pixel. Since each signal line is subjected to the precharging operation at a time which is earlier by an equal amount than the time when the image signal is supplied to each signal line, a further improvement in the precharging accuracy can be achieved.

In the method of precharging signal lines according to the invention, the different precharging DC voltages may be set to correspond to the respective gray levels of the image signal.

In this method, high-speed driving of the liquid crystal can be achieved by precharging the signal lines to a voltage substantially equal to the center of the amplitude of the image signal.

In the method of precharging signal lines according to the invention, the charging/discharging currents of the signal lines may be adjusted by controlling the period of time for which the switches are connected to the signal lines thereby precharging the signal lines to predetermined voltage levels.

In this precharging method, the signal lines are precharged to desired voltages by controlling the connection period during which the signal lines are connected to the precharging voltages thereby controlling the integrals of the moved charges (that is, the amounts of currents).

If the absolute values of the precharging voltages are large enough compared with the voltages to which the signal lines are actually precharged, the precharging operation can be performed at a high speed. Thus, the time required for precharging the signal lines can be reduced.

According to another aspect of the invention, there is provided a method of precharging signal lines of a display device of the active matrix type, the display device including a plurality of scanning lines; a plurality of signal lines; switching elements connected to the respective scanning lines and the respective signal lines, the precharging being performed before supplying an image signal to the signal lines, the method including the steps of:

preparing a first precharging voltage line, a second precharging voltage line having a voltage different from that of the first precharging voltage line, and switches such that each signal line has its own one switch serving to connect the signal line to either the first precharging voltage line or the second precharging voltage line; and operating the switches so that the signal lines are connected to either the first precharging voltage line or the second precharging voltage line thereby precharging the signal lines, wherein the voltages on the first and second precharging voltage lines are periodically inverted.

In this precharging method, the precharging voltages are not fixed to particular values, but the first and second precharging voltage lines are periodically inverted. This allows the switches to be constructed in a simplified fashion.

According to another aspect of the invention, there is provided a circuit for precharging signal lines of a display device of the active matrix type, the display device including: a plurality of scanning lines; a plurality of signal lines; switching elements connected to the respective scanning lines and the respective signal lines, the precharging being performed before supplying an image signal to the signal lines, the circuit further including:

a first precharging voltage line;

a second precharging voltage line having a voltage different from that of the first precharging voltage line;

switches for selectively connecting the signal lines to either the first precharging voltage line or the second precharging voltage line; and a switching controller for controlling the on/off operation of the switches.

This circuit is an implementation of the precharging method described above. In this circuit, the operations of the switches can be controlled by the switching controller so that the signal lines are precharged into polarity consistent with the driving signal in accordance with any of various liquid crystal driving methods.

According to still another aspect of the invention, there is provided a circuit for precharging signal lines of a liquid crystal display device, the display device including: a plurality of scanning lines; a plurality of signal lines; switching elements connected to the respective scanning lines and the respective signal lines, the precharging being performed before supplying an image signal to the signal lines, the circuit further including:

preparing a first precharging voltage line, a second precharging voltage line having a voltage different from that of the first precharging voltage line;

first switches provided such that each signal line has its own one first switch for switching the connection/disconnection between the signal line and the first precharging voltage line;

second switches provided such that each signal line has its own one second switch for switching the connection/disconnection between the signal line and the second precharging voltage line; and a switching controller for controlling the on/off operation of the first and second switches.

In this precharging circuit, switches are provided between the respective signal lines and the first and second precharging voltage lines. That is, each signal line has two switches (first and second switches). The switching controller turns on and off the first and second switches in a complementary fashion so that each signal line is connected to only one of signal lines thereby precharging each signal line.

In the above circuit according to the invention, there may be further provided a shift register for generating a pulse used to precharge the signal lines in a pixel-by-pixel fashion.

The shift register provided in this precharging circuit makes it possible to perform precharging in a pixel-by-pixel fashion in accordance with the operation of driving the liquid crystal in the pixel-by-pixel fashion.

In the above circuit according to the invention, the shift register may also serve as a shift register for sequentially supplying an image signal to the signal lines.

This allows the shift register to be used in a more efficient fashion.

According to still another aspect of the invention, there is provided a liquid crystal panel substrate having the above circuit for precharging signal lines.

This technique makes it possible to provide a liquid crystal panel substrate having a precharging circuit capable of precisely precharging signal lines at a high speed. The precharging circuit may be produced using for example thin film transistors formed on the substrate.

In the above liquid crystal panel substrate according to the present invention, the same production process may be used to produce, on the same substrate, the circuit for precharging signal lines and switching elements for controlling the electrical connections between the liquid crystal and the signal lines, the switches being disposed at respective intersections between the scanning lines and the signal lines.

In this liquid crystal panel substrate, since the switching transistors of the liquid crystal matrix and the transistors of the precharging circuit are all formed on the common substrate using the common production process, they can be produced easily.

According to another aspect of the invention, there is provided a liquid crystal display device constructed using the liquid crystal panel substrate described above.

This makes it possible to realize a high-performance liquid crystal display device capable of performing high-accuracy precharging.

BRIEF DESCRIPTION OF THE DRAWINGS

FIGS. 14A and 14B are schematic representations of the principle of a capacitor division D/A converter;

FIGS. 32A and 32B are tables illustrating the method of adjusting the conversion capacitors and voltages according to the fourth embodiment of the invention;

FIG. 38 is a table illustrating the conversion capacitances and voltage according to the seventh embodiment of the invention;

FIGS. 47A and 47B are diagrams illustrating the operation of driving the liquid crystal display device in a periodically inverting fashion;

DETAILED DESCRIPTION OF PREFERRED EMBODIMENTS

Before describing the specific embodiments of the invention, the conversion principle of the capacitance division type D/A converter and the reverse change in the output signal of the D/A converter will be described first.
(The conversion principle of the capacitance division D/A converter)

When there are two capacitors 2000 and 2100 as shown in FIG. 14A, the charge QA stored in the capacitor 2000 (the charge stored on the electrode held at a voltage VX) and the charge QB stored in the capacitor 2100 (the charge stored on the electrode held at a voltage VC) are given by QA=CA (VX−Vo) and QB=CB(VC−VCOM) as represented on the right side of FIG. 14A, where CA is the capacitance of the capacitor 2000 and CB is the capacitance of the capacitor 2100.

If the capacitors 2000 and 2100 are connected to each other as shown in FIG. 14B, a flow of current occurs depending on the relative magnitudes of VC and VX (a current IS occurs when VC<VX while a current IR occurs when VC>VX), and an output voltage V appears at the common node of the two capacitors.

After the connection, the charge QA' stored in the capacitor 2000 (on the electrode held at a voltage V) and the charge QB' stored in the capacitor 2100 (on the electrode held at a voltage V) become QA'=CA(V−Vo) and QB'=CB(V−VCOM) as represented on the right side of FIG. 15B.

Since no change occurs in the total amount of charge, QA+QB=QA'+QB'. From these equations, the output voltage V can be determined as V=(CA·VX+CB·VC)/(CA+CB). If the capacitance CA of the capacitor 2000 varies in response to the digital input signal, a corresponding change occurs in the analog conversion output voltage (V). In this invention, the capacitor 2000 is referred to as the "conversion capacitor" and the capacitor 2100 is referred to as the "coupling capacitor".

Figure 15:
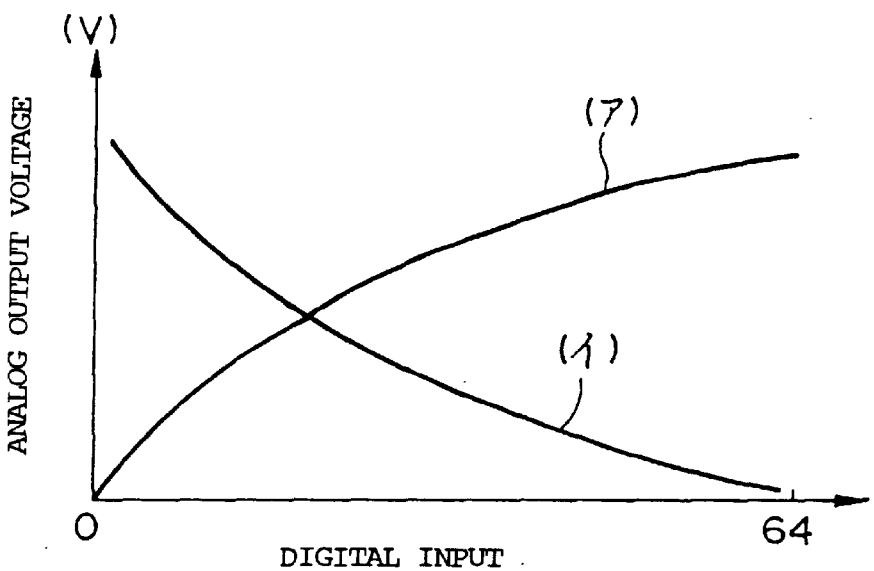
FIG. 15 is a graph illustrating an example of the input-output characteristic of the capacitor division D/A converter.

When the voltages of the capacitors are set such that VC<VX, if the conversion capacitor increases with the increase in the digital input signal, then the input-output characteristic becomes as represented by the curve A in FIG. 15 in which the output increases with the input. If the voltages at the capacitors are set such that VC>VX, the output decreases with the increase in the input as represented by the curve B in FIG. 15.
(Reverse Change in the Output Signal of D/A converter)

Figure 16:
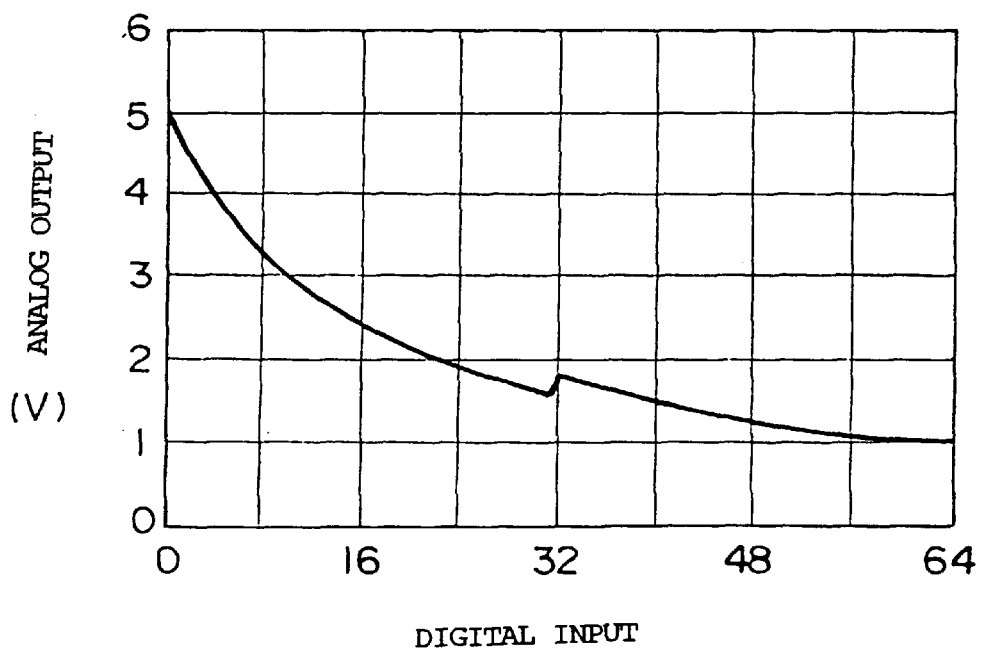
FIG. 16 is a graph illustrating a problem associated with the capacitor division D/A converter wherein the problem has been found by the inventors of the present invention.

(1) By way of example, the D/A converter is assumed here to have a characteristic such as the curve B in FIG. 15. When the digital input signal changes from "31" to "32", the output voltage increases as shown in FIG. 16 although the output voltage is expected to decrease (this phenomenon is called the reverse change in the output voltage).

(2) Reason for the Reverse Change in the Output Voltage

Figure 17A:
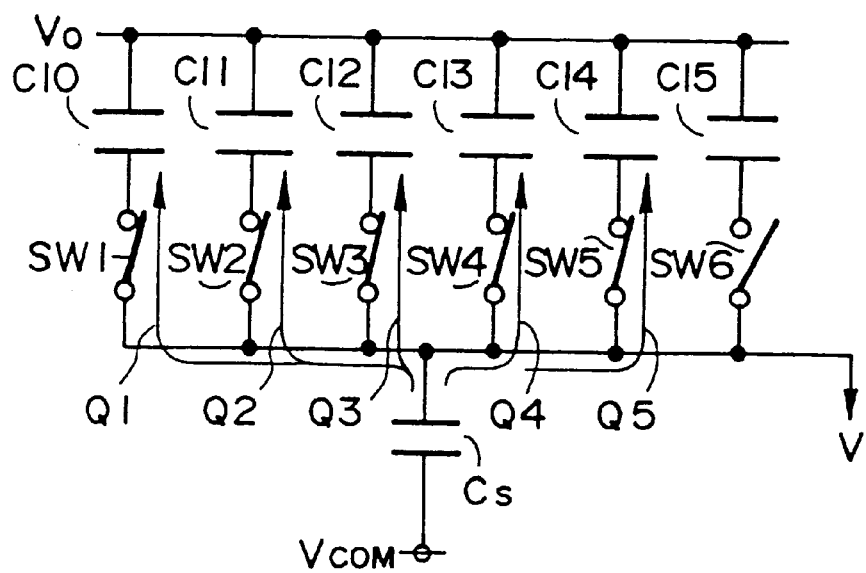
FIGS. 17A and 17B are diagrams qualitatively illustrating the reason for the problem shown in FIG. 16.

FIG. 17A illustrates the basic circuit of a D/A converter using binary-weighted capacitors (conversion capacitors) C10–C15. In FIG. 17A, CS denotes a coupling capacitor, and SW1 through SW6 denote switches which are opened or closed depending on whether the corresponding bits of the digital input signal are in "1" or "0" state.

The design values of the conversion capacitors C10–C15 are "1", "2", "4", "8", "16", and "32", respectively. In practice, however, the actual capacitances can have rather great deviations from the design values, as shown in FIG. 18.

Figure 18:
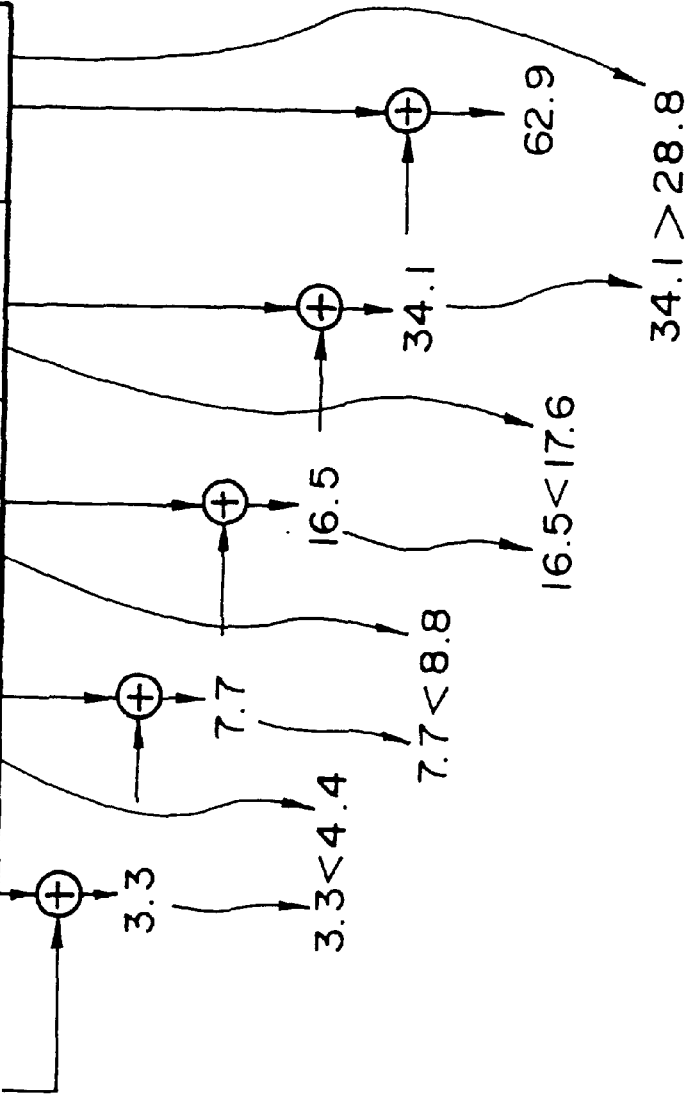
FIG. 18 is a diagram quantitatively illustrating the reason for the problem shown in FIG. 16.

In FIG. 18, it is assumed that each capacitance has an error of 10% relative to the designed value, which is the maximum allowable error "0", "1", wherein the capacitances C10–C15 are greater than the designed values by 10% and the capacitance C15 is smaller than the designed value by 10%. That is, the actual values of the conversion capacitors C10–C15 are assumed to be "1.1", "2.2", "4.4", "8.8", "17.6", and "28.7", respectively.

If a digital input signal equal to "31" is input, the switches SW1–SW5 are turned on while only the SW6 is maintained in the off state as shown in FIG. 17A. As a result, movements of charges Q1–Q5 occur (in directions represented by the arrows in the figure), and an analog conversion voltage "V" is obtained at the common connection node between the coupling capacitor CS and the conversion capacitors C11–C15.

Figure 17B:
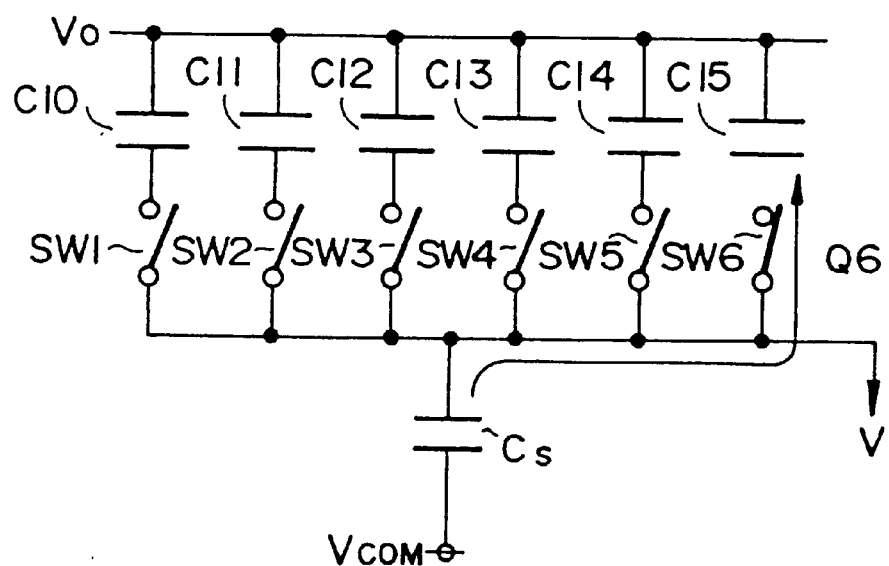

After that, all capacitors are reset, and if a digital input signal equal to "32" is applied to the A/D converter, then the switches SW1–SW5 are turned off and only the switch SW6 is turned on as shown in FIG. 17B. As a result, movement of charge Q6 occurs (in a direction denoted by an arrow in the figure). Since the amount of the moved charge Q6 shown in FIG. 17B is smaller than the total amount of moved charges (Q1+Q2+Q3+Q4+Q5) shown in FIG. 17A, the analog conversion output voltage (V) under the condition shown in FIG. 17B becomes greater than that obtained under the condition shown in FIG. 17A. Thus, an unwanted reverse change in the output voltage occurs as shown in FIG. 16.

The charge stored in a capacitor is determined by the product of its capacitance and the voltage across it. If the voltage across the capacitor is fixed, the charge stored in the capacitor is determined only by its capacitance. Therefore, if the capacitance corresponding to a certain bit (j) is smaller than the sum of all capacitances corresponding to the bits at the lower-order digits (i) as shown at the bottom of FIG. 18, a reverse change in the output voltage occurs.

In the case of FIG. 18, the capacitance C15 has an error opposite in direction to the errors of the other capacitors, and the conversion capacitance C15 (=28.8) is smaller than the sum of the conversion capacitances C11–C14 (=34.1). This inversion in capacitance causes an inversion in the output for the input of "32" as shown in FIG. 16.

In the above specific example, it is assumed that only the capacitance C15 has a negative deviation in capacitance value and that the other capacitances C11–C14 all have a positive deviation. However, in practice, the capacitance values of the capacitors C11–C14 can deviate in random directions, and therefore a similar reverse change can also occur at other bits.

When a background color whose brightness gradually varies is displayed on the liquid crystal panel, if a reverse change in the output signal occurs, a dark point surrounded by a brighter background color is created. This gives an unnatural impression to a user watching the liquid crystal panel. This type of degradation in picture quality is easily perceptible by users, and thus can be a significant defect.
(First Embodiment)
(a) Features of the first embodiment In view of the above, in this first embodiment of the invention, there is provided a D/A converter in which the unwanted reverse change in the output signal is completely prevented.

In this embodiment, the capacitances are determined so that a reverse change in the capacitance values never occurs even in the worst case in which only the capacitance associated with a certain bit (j) deviates from its designed value in a direction opposite to the direction in which all capacitances associated with lower-order bits (i) deviate from their designed values.

Figure 1:
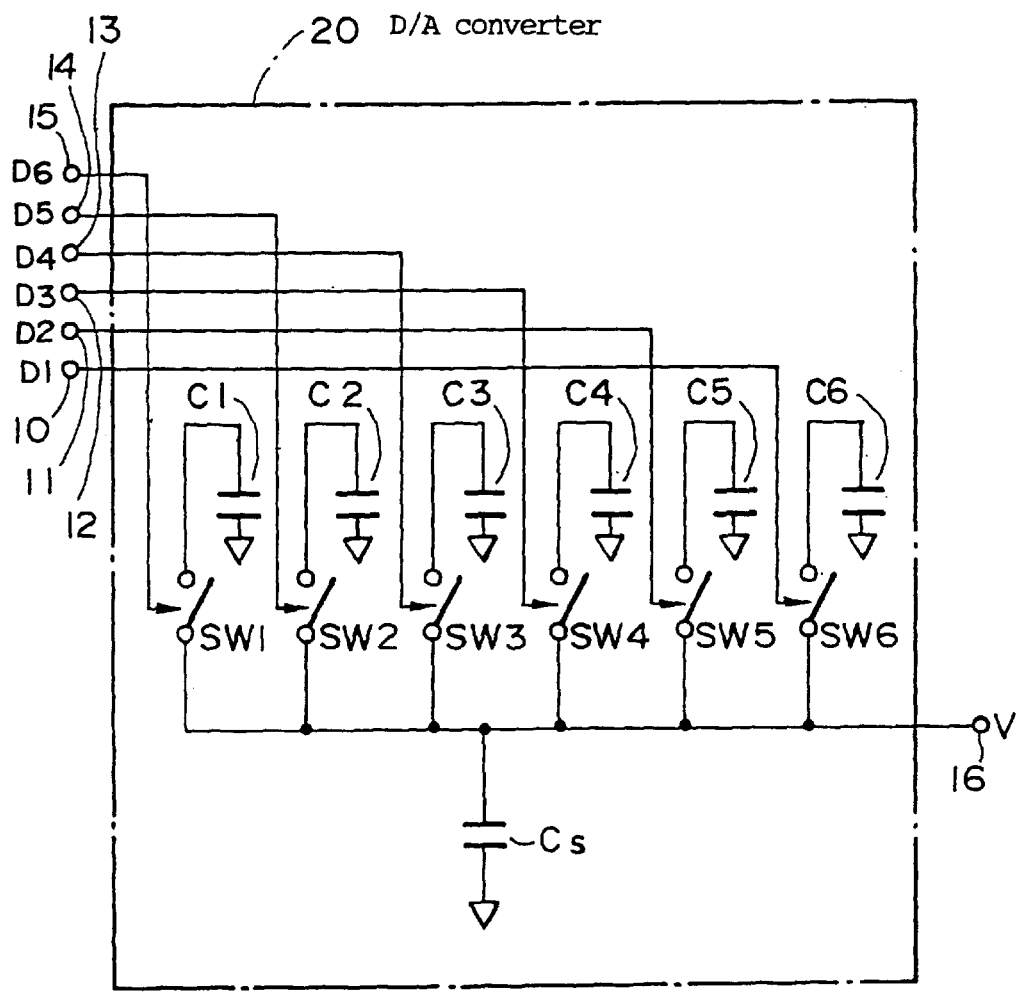
FIG. 1 is a circuit diagram illustrating the major part of a D/A converter according to the present invention.

FIG. 1 illustrates the D/A converter 20 according to the first embodiment of the invention. The feature of the D/A converter 20 is that the capacitors C1–C6 are designed to have capacitances in ratio such as C1: C2: C3: C4: C5: C6=1:2:4:8.56:19.02:42.27, as shown on the bottom of FIG. 1.

In FIG. 1, reference numerals 10–15 denote input terminals, and reference numeral 16 denotes an output terminal. CS denotes a coupling capacitor.

Figure 2:
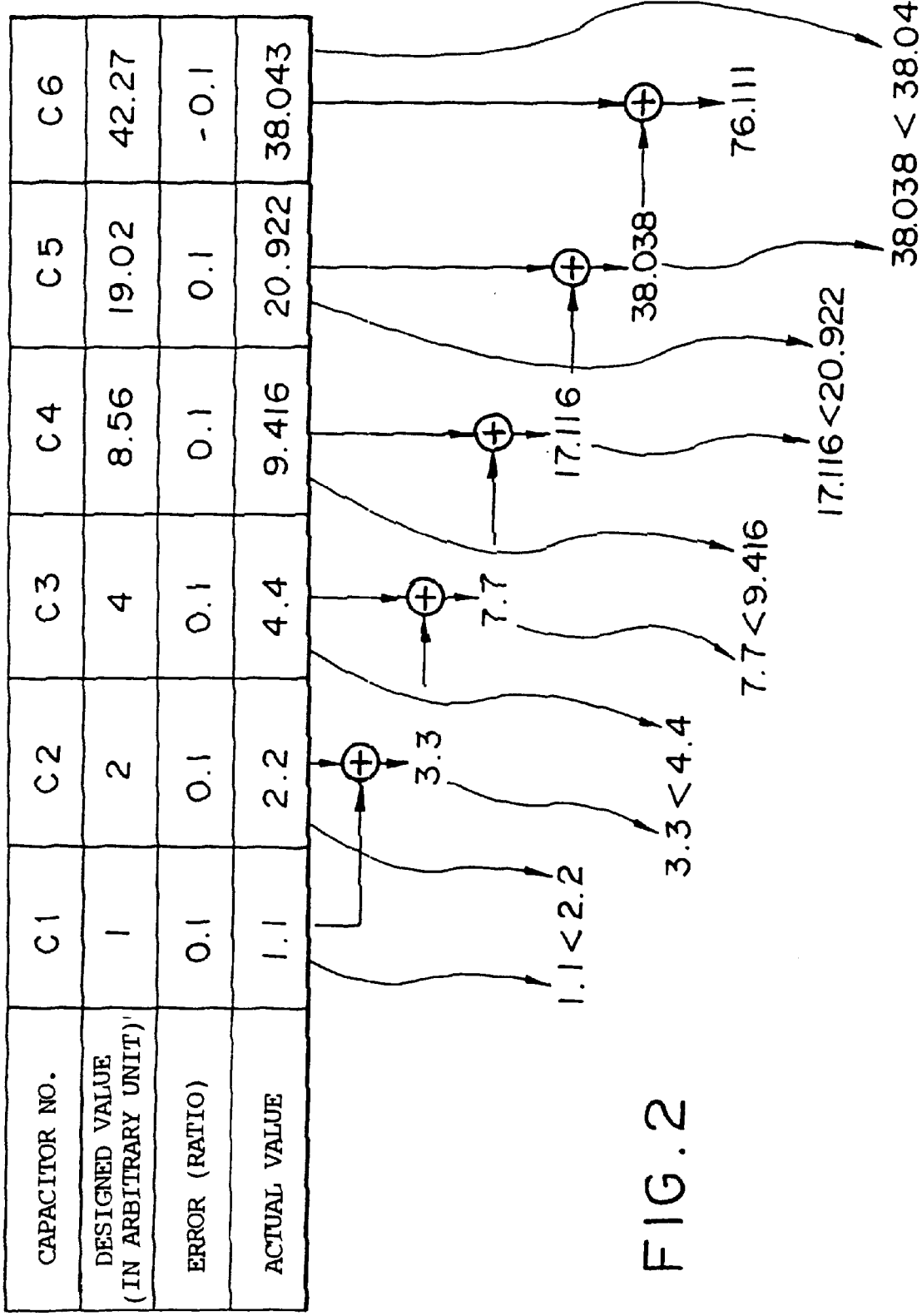
FIG. 2 is a schematic illustration of the principle of determining the practical capacitance values for the conversion capacitors C1–C6 shown in FIG. 1.

FIG. 2 is a table corresponding to FIG. 18 described above. The bottom row of the table illustrates the capacitances used in the D/A converter 20 of the present embodiment, for the respective bits (j). Furthermore, below the table, there are also shown the sum of capacitances of lower-order bits for each bit.

Figure 3:
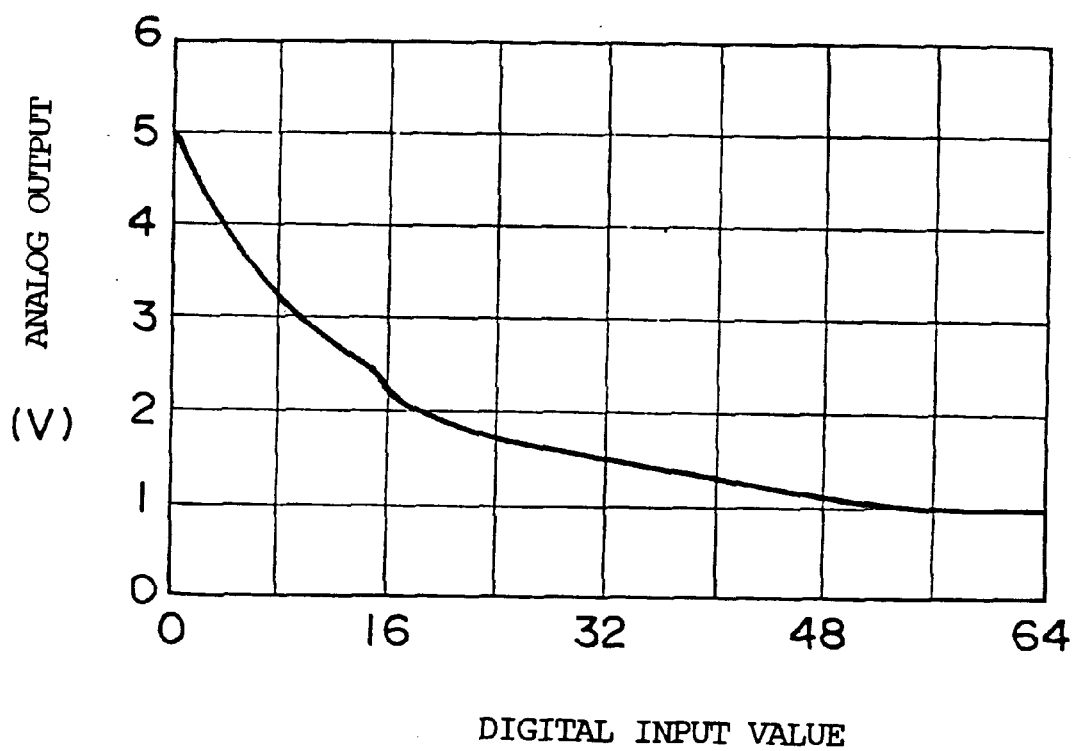
FIG. 3 is a graph illustrating a typical input-output characteristic of the D/A converter shown in FIG. 1.

As can be seen from FIG. 2, in the present embodiment, unlike the conventional technique shown in FIG. 18, no inversion in capacitance value occurs at the transition in the input signal from "31" to "32". Therefore, as shown in FIG. 3, the D/A converter has no reverse change in its output voltage. Furthermore, in the present embodiment, no reverse change in the output voltage occurs even if the capacitances associated with the respective bits deviate from the designed values in any manner (that is, even in the worst case).

(b) Design Procedure

The procedure of designing the capacitances of conversion capacitors will be described below.

To accommodate the worst variations in capacitance, the capacitances are selected so that any two adjacent capacitors meet the following condition:

$$Coj-dCj > \Sigma_{(i<j)}(Coi+dCi) \text{ (for all j)} \quad (1)$$

where

Ci: ith conversion capacitance,

Coi: designed value of the ith conversion capacitance, dCi: dispersion of the ith conversion capacitance, Cj: jth conversion capacitance, Coj: designed value of the jth conversion capacitance, dCj: dispersion of the jth conversion capacitance, $\Sigma_{(i<j)}$: sum for all i smaller than j, and for all j; indicating that the equation should be satisfied for all j.

Note that although dCi has a positive (+) sign, dCj has a negative (−) sign.

If the conversion capacitances are selected so that equation (1) is met, the jth capacitance is always greater than the sum of the 1st through (j−1)th capacitances even when the ratios among the weighted capacitances deviate in the worst manner. This means that the inversion in the weighted capacitance values no long occurs. Thus, the above setting of the capacitances ensures that the unwanted reverse change in the output signal of the D/A converter is prevented from occurring. Furthermore, this technique can be accomplished without having to use an additional circuit such as a compensation circuit, and therefore this technique is easy and inexpensive.

In the present embodiment of the invention, the designed values of the conversion capacitances are deviated from the theoretical values (binary-weighted values). The above deviations cause an increase in the conversion error of the D/A converter. However, when the D/A converter is used in a driving circuit for displaying an image, the effect of such the deviation of the weighting factor associated with each bit from the theoretical value (binary weighting factor) on the displayed image is not perceptible by human eyes. That is, the such the deviation does not cause an unnatural impression to a user. On the other hand, if the unwanted reverse change in the output signal occurs, a dark point surrounded by a bright background is created, which is easily perceptible by human eyes. Thus, the reverse change in the output signal causes significant degradation in image quality.

The present embodiment of the invention is based on the knowledge, newly developed by the inventor of the present invention, that human eyes have such characteristics and thus the prevention of the reverse change in the output signal is more important than the conversion accuracy.

Figure 4:
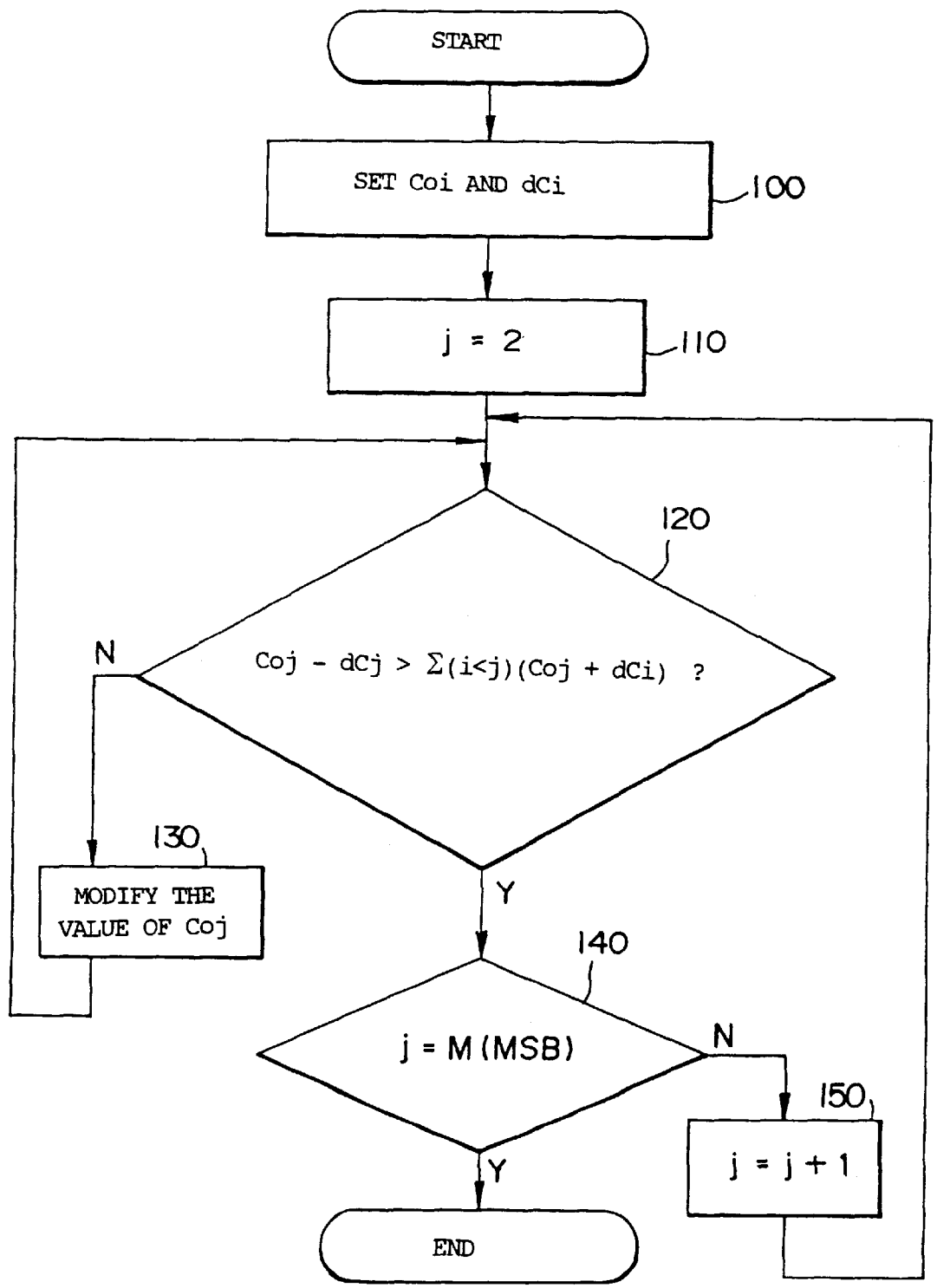
FIG. 4 is a flow chart illustrating the procedure of determining the practical capacitance values for the conversion capacitors C1–C6 shown in FIG. 1.
Figure 5:
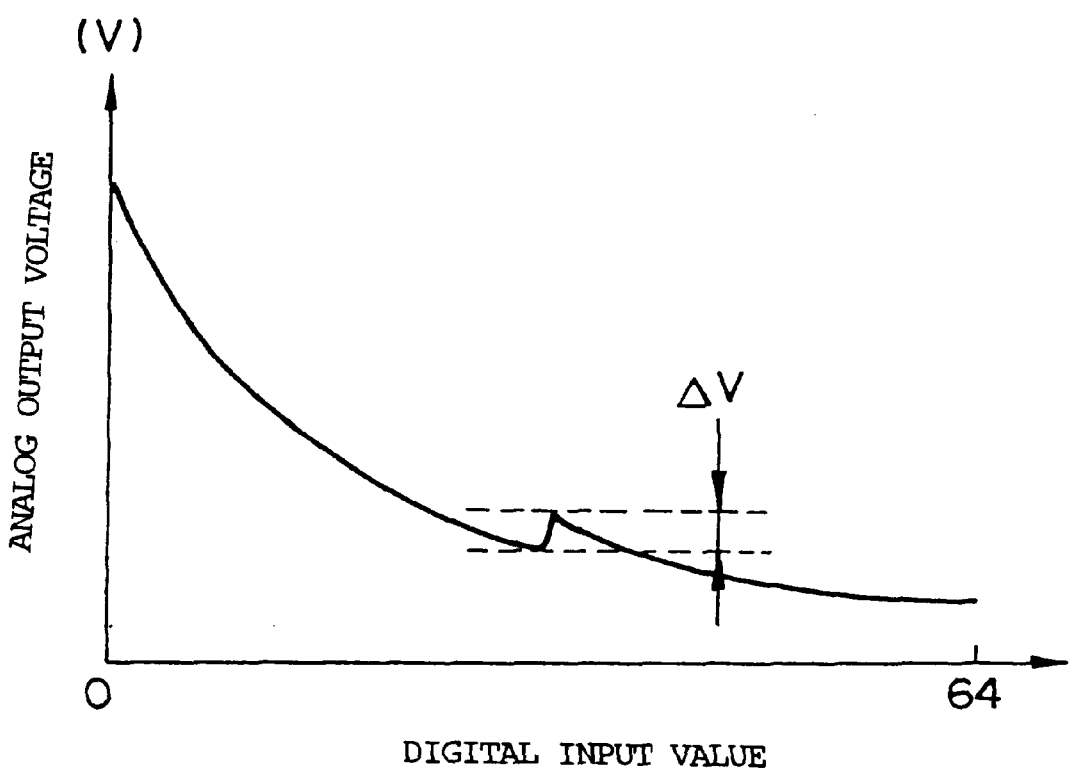
FIG. 5 is a graph illustrating an example of the input-output characteristic of the D/A converter according to the present invention.

The procedure of determining the values of capacitances is specifically shown in FIG. 4.

First, the designed values of conversion capacitances (Ci) and the predicted dispersions (dCi) thereof are given (step 100). The predicted dispersion (dCi) should be determined taking into account the accuracy of patterning the capacitors and the abilities of other production processes so that the capacitors can be produced with high enough reliability.

Then the value of j is set to j=2 (step 110), and equation (1) is evaluated (step 120). If equation (1) is not satisfied, the value of Coj is modified (step 130). In the modification of Coj, it is desirable that the smallest value of Coj of those which can satisfy equation (1) is selected so that the conversion error is minimized.

If it is concluded in step 120 that equation (1) is satisfied, a judgement of whether j corresponds to the MSB (most significant bit) is made (step 140). If a negative conclusion is made, j is incremented (step 150). In this way, the above steps 120m 130, and 140 are performed repeatedly for all possible values of j.

(Second Embodiment)

In the first embodiment described above, the design is performed so that the reverse change in the output signal is completely prevented. In some applications, however, the design may be performed in a less rigorous manner.

For example, a greater tolerance may be introduced in the design of the capacitance values and a reverse change ($\Delta$V) less than a threshold value (Vth) is allowed.

Herein in this embodiment, the concept of a visually recognizable threshold is introduced, and the conversion capacitances are determined so that the reverse voltage change ($\Delta$V) does not exceed the visually recognizable threshold. The "visually recognizable threshold" refers to the maximum change in the output voltage of the D/A converter which cannot be recognized by human eyes when an image is displayed so that the brightness of the image corresponds to the output voltage. In practice, the visually recognizable threshold value (Vth) is of the order of 20 mV.

In the D/A converter of the capacitance division type shown in FIG. 1, the output voltage (V), as described above with reference to FIGS. 14A and 14B, is given by {(voltage at the end of a conversion capacitor)·(conversion capacitance)+(voltage at the end of a coupling capacitor)·(coupling capacitor)}/(sum of the conversion capacitance and coupling capacitance).

Therefore, if the worst-case deviation of the capacitances is taken into account, the capacitances should be determined so that the following equation (2) is satisfied.

$$\{Vc \cdot Cs + Vo(Coj-dcj)\}/\{Cs+(Coj-dcj)\} - \{Vc \cdot Cs + Vo(\Sigma_{(i<j)}(Coi+dCi))\}/\{Cs+\Sigma_{(i<j)}(Coi+dCi)\} > -Vth \text{ (for all j)} \quad (2)$$

where

Cs: coupling capacitance,

Vc: voltage at the other end of the coupling capacitor before the switch is closed, Vo: voltage at the other end of the conversion capacitors before the switch is closed, Coi: designed value of the ith conversion capacitance, dCi: dispersion of the ith conversion capacitance, Coj: designed value of the jth conversion capacitance, dCj: dispersion of the jth conversion capacitance, and Vth: maximum difference (visually recognizable threshold) in the output of the D/A converter, which cannot be visually recognized by a human user when an image is displayed in accordance with the output voltage of the D/A converter, $\Sigma_{(i-j)}$: sum for all i smaller than j.

Figure 6:
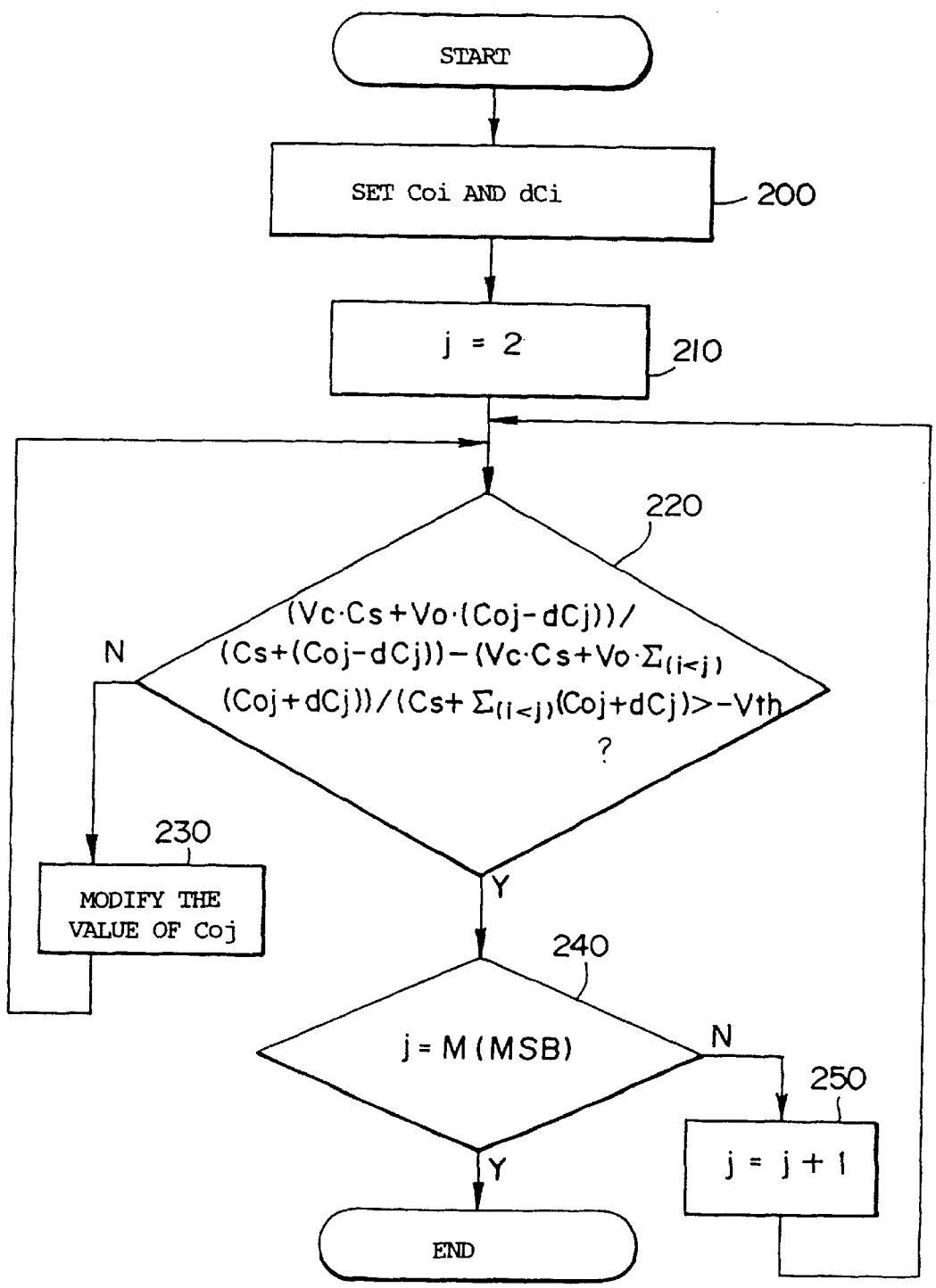
FIG. 6 is a flow chart illustrating the procedure of designing the D/A converter having the input-output characteristic shown in FIG. 5.

In the above equation (1), "for all j" refers to the requirement that the equation should be met for all j. The design may be performed according to the flowchart including steps 200 to 250 shown in FIG. 6, in a similar manner to that described above with reference to FIG. 4.

(Third Embodiment)

In this third embodiment, the D/A converter described above is mounted on a liquid crystal display panel substrate used in a liquid crystal display device.

(a) Brief description of the liquid crystal display device

Figure 11:
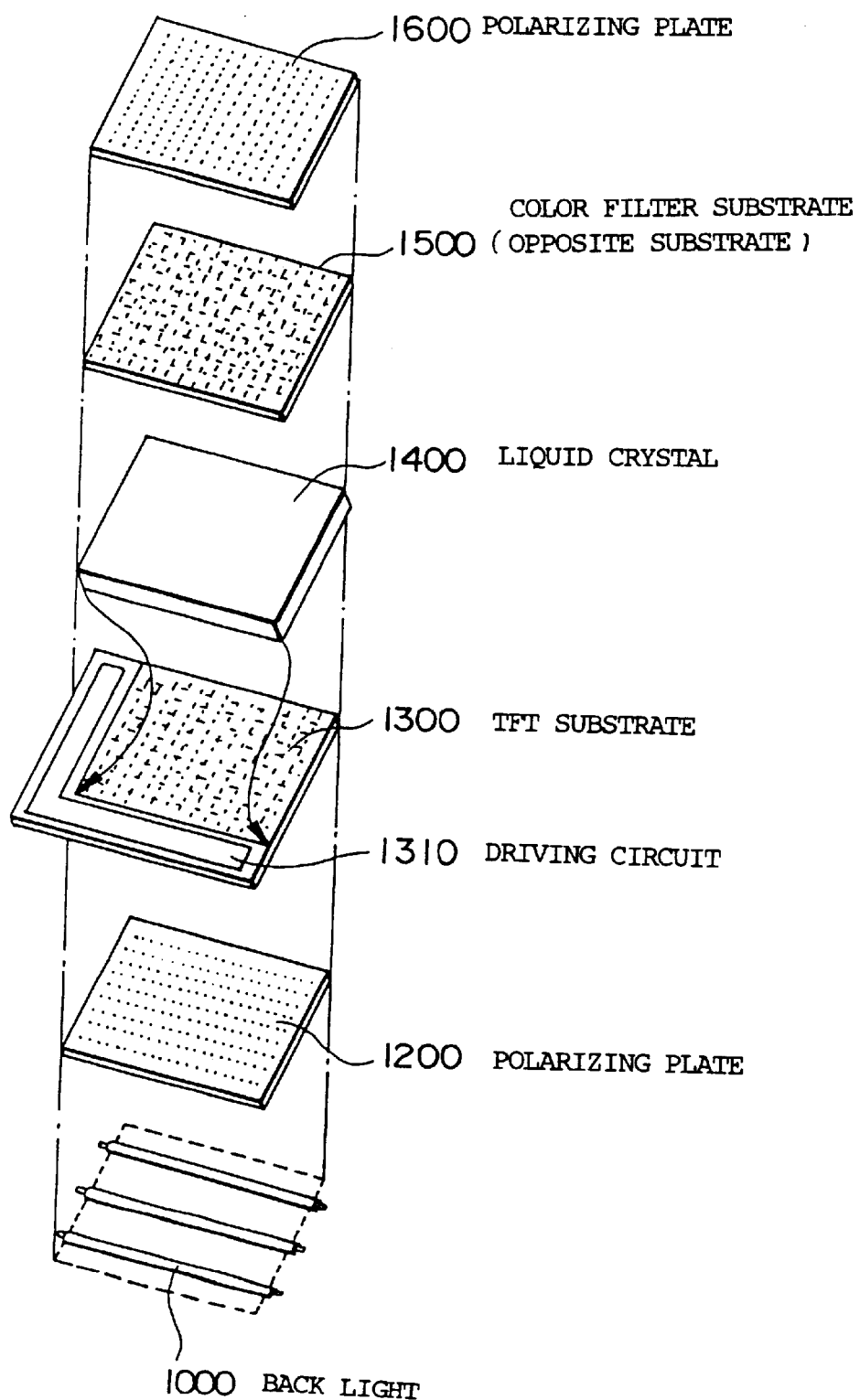
FIG. 11 is a schematic diagram illustrating the construction of the liquid crystal display device according to the present invention.

The liquid crystal display device includes, for example as shown in FIG. 11, a back light 1000, a polarizing plate 1200, a TFT substrate 1300, a liquid crystal 1400, an opposite substrate (color filter substrate) 1500, and a polarizing plate 1600. In this specific embodiment, a driving circuit 1310 is formed on the TFT substrate 1300.

Figure 12:
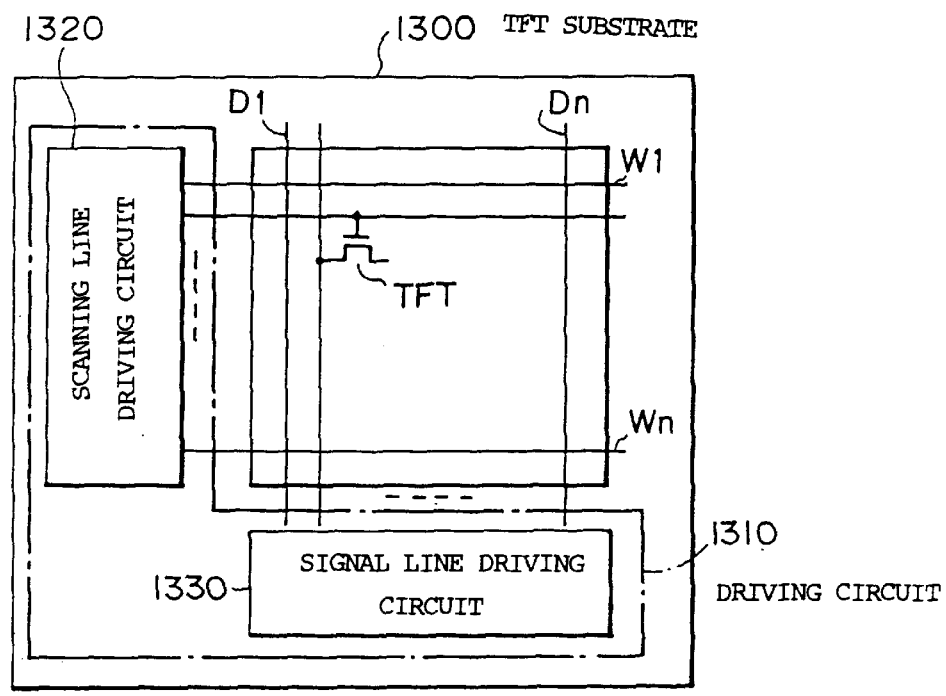
FIG. 12 is a schematic diagram illustrating an example of the construction of a liquid crystal panel substrate according to the invention.
Figure 13:
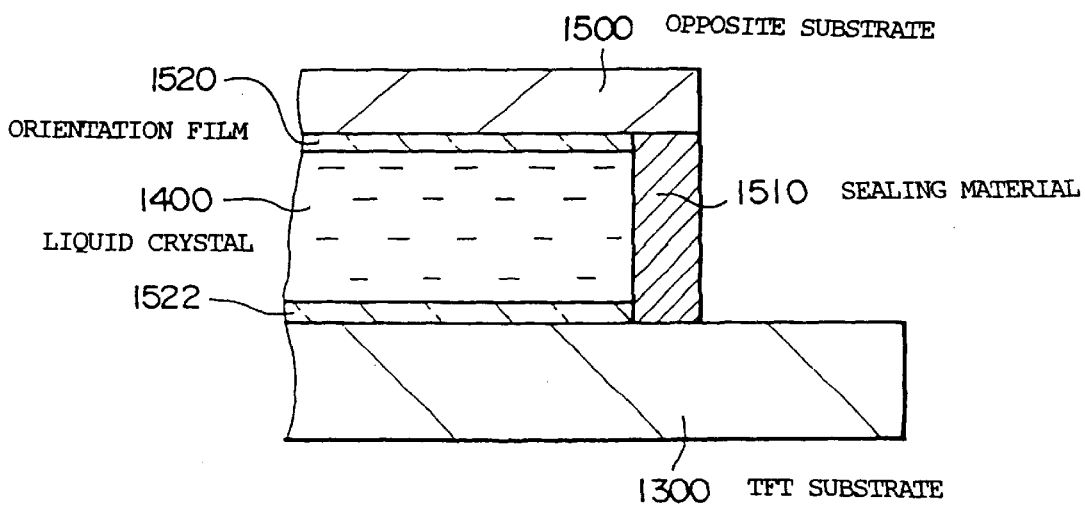
FIG. 13 is a cross-sectional view illustrating the major part of the liquid crystal panel substrate shown in FIG. 12.

On the TFT substrate 1300, as shown in FIG. 12, there are provided scanning lines W1–Wn, signal lines D1–Dn, pixel TFTs, a scanning line driving circuit 1320, and a signal line driving circuit 1330. The liquid crystal, as shown in FIG. 13, is sealed between the TFT substrate 1300 and the opposite substrate 1500. Reference numerals 1520 and 1522 denotes orientation films.

(b) Signal line driving circuit

Figure 7:
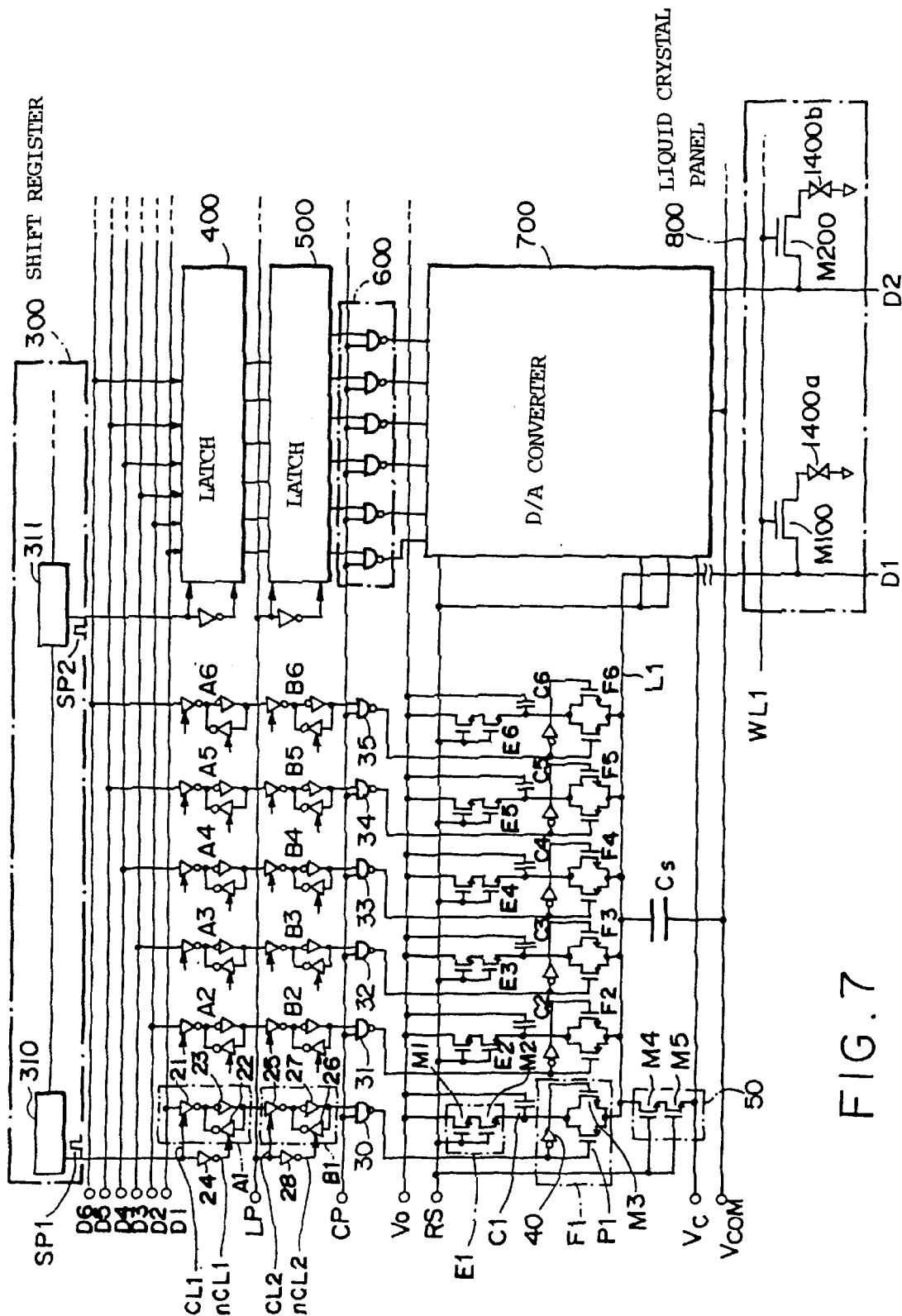
FIG. 7 is a circuit diagram illustrating a specific example of the construction of a liquid crystal display device using the D/A converter according to the present invention.

As shown in FIG. 7 (on the right side thereof), the signal line driving circuit 1330 includes a shift register 1300, a latch 400, a larch 500, a gate circuit 600, and a D/A converter 700.

The shift register 300 includes as many stages of registers (310, 311) as there are data lines (such as D1) in the liquid crystal panel 800. Sampling pulses (SP1, SP2, etc.) used to sample the digital input signal consisting of 6 bits D1–D6 are generated by the shift register 300. The sampling pulses (SP1, SP2, etc.) are used in the latch 400 as clock signals (CL1, etc.).

As shown on the left side of FIG. 7, the latch 400 includes temporary memory circuits A1–A6 composed of clocked inverters and also includes an inverter 224 for generating an inverted clock signal (nCL1). The temporary memory circuit A1 includes three inverters 21, 22, and 23.

Similarly, the latch 500 includes temporary memory circuits B1–B6 composed of clocked inverters and also includes an inverter 28 for generating an inverted clock signal (nCL2). The temporary memory circuit B1 includes three inverters 25, 26, and 27. An external latch pulse (LP) is applied to the latch 500.

The gate circuit 600 includes 2-input NAND gates 30–35 wherein a coupling pulse (CP) is commonly applied to the respective gates.

The D/A converter 700 is designed in accordance with the procedure described above in the previous embodiment. That is, the capacitances C1–C6 are set to values different from the usually employed binary-weighted values so that the conversion error of the D/A converter does not cause an inversion in the brightness, or the inversion in the brightness is suppressed to a low level which cannot be recognized.

A switch E1 consisting of n-type MOS transistors (M1, M2) is used to reset the conversion capacitance C1. The on/off operation of the switch E1 is controlled by a reset signal (RS). Furthermore, there are also provided switches E2–E6 constructed in a similar manner. An analog switch F1 is used to control the electric connection between the conversion capacitor C1 and the coupling capacitor CS, wherein the analog switch F1 includes a pMOS transistor P1, nMOS transistor M3, and an inverter 40. There are also similar analog switches F2–F6.

A switch 50 consisting of nMOS transistors M4 and M5 is used to reset the coupling capacitor CS, wherein the on/off operation of the switch 50 is controlled by the reset signal (RS).

Figure 8A:
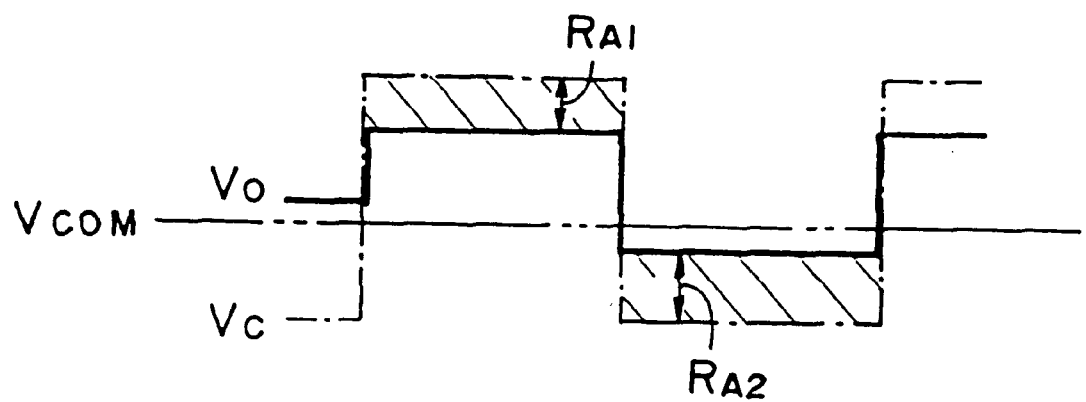
FIGS. 8A and 8B are diagrams illustrating the relative relationships among voltages VO, VC, and VCOM of the liquid crystal display device shown in FIG. 7.
Figure 8B:
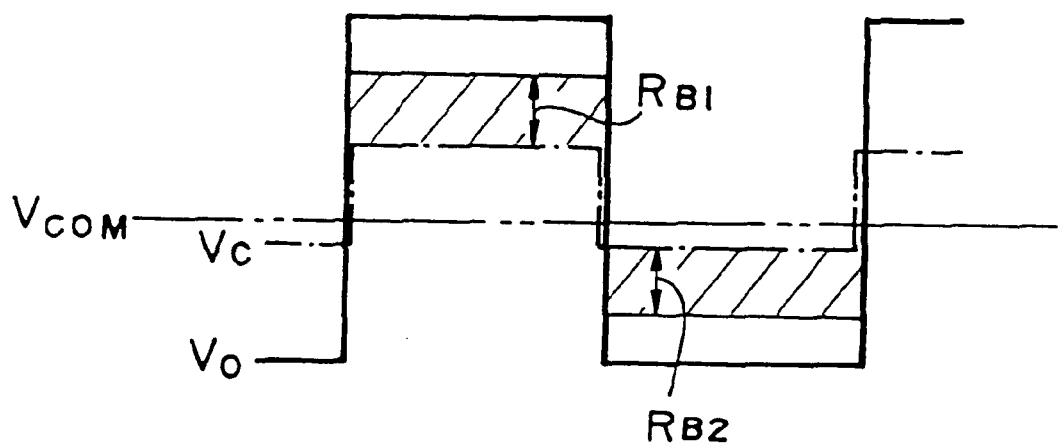

The operating voltages Vo, VC, and VCOM used in the D/A converter 700 have the relationships shown in FIG. 8A or 8B. If the operating voltages are set as shown in FIG. 8A, then VC>Vo, and thus a subtraction-type D/A converter having a characteristic such as that represented by the curve B in FIG. 15 is obtained. The voltages Vo and VC are periodically inverted to drive liquid crystal cells in a periodically inverted fashion. In FIG. 8A, the dynamic range of the D/A converter is given by RA1 and RA2.

On the other hand, if the operating voltage is set as shown in FIG. 8B, then VC<Vo, and thus the D/A converter is of the addition-type having a characteristic such as that represented by the curve A in FIG. 15. In this case, the dynamic range of the D/A converter is given by RB1 and RB2.

(c) Operation of the signal line driving circuit

Figure 9:
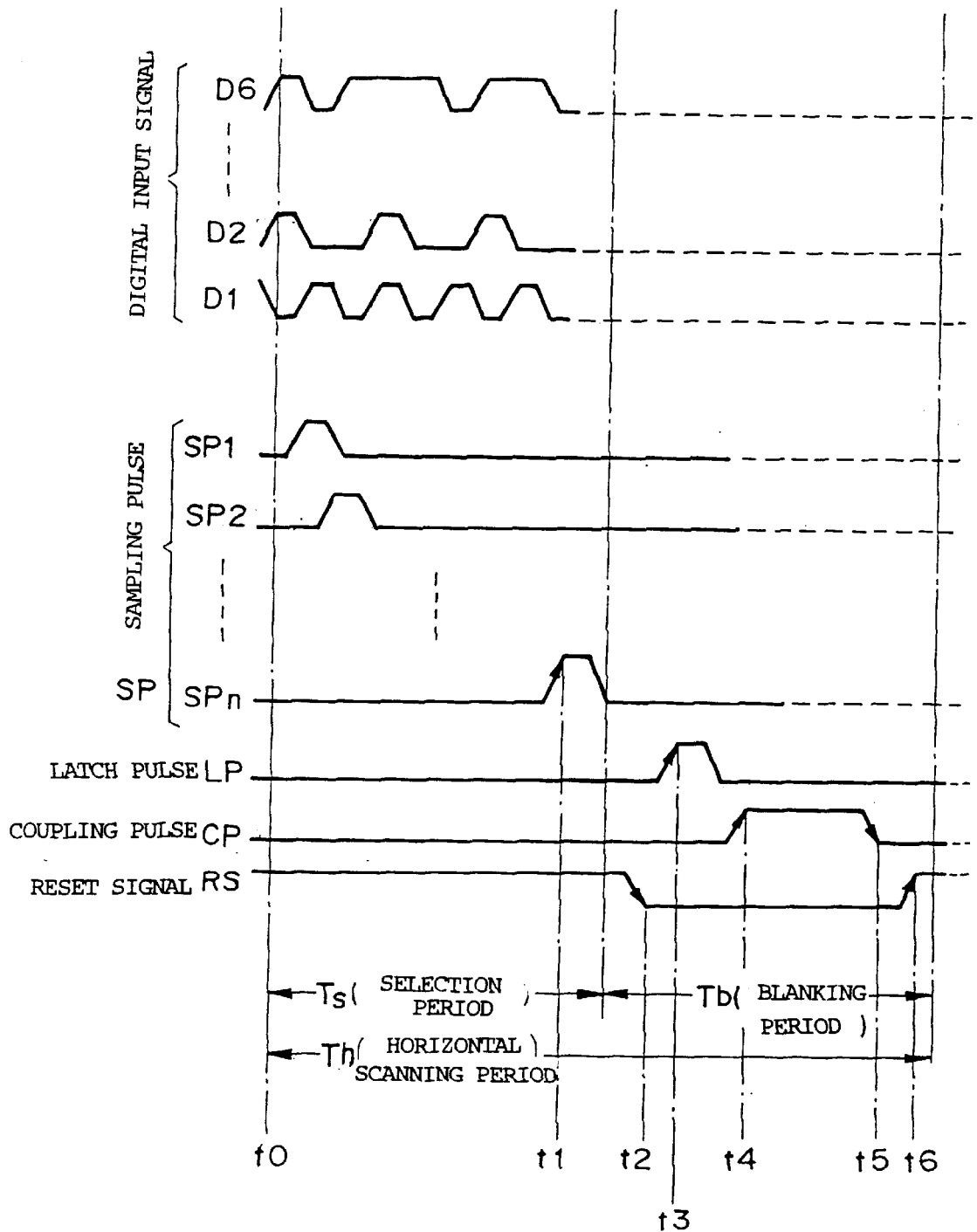
FIG. 9 is a diagram illustrating an example of the operation of the liquid crystal display device shown in FIG. 7.

FIG. 9 illustrates an example of the operation timing associated with the signal line driving circuit shown in FIG. 7. In the operation of the liquid crystal display panel 800, one horizontal scanning period (Th) consists of a selection period (Ts) and a blanking period (Tb).

Sampling pulses SP1–SPn are generated by the shift register 300 during a time period from t0 to t1. In response to these sampling pulses, one line image data is captured by the latch 400. During this period of time, the reset signal RS is in an H state and thus the conversion capacitances and coupling capacitance are reset. At time t2, the reset signal RS falls down to an "L" level thereby terminating the reset period. At time t3 after that, the latch pulse LP rises to an "H" level. In response to the L-to-H transition of the latch pulse LP, the image data stored in the latch 400 is transferred to the latch 500.

When the coupling pulse CP rises to "H" at time t4, the conversion capacitors C1–C6 are connected to the coupling capacitor CS. During a period of time from t4 to t5, D/A conversion is performed. The reset signal RS rises again to "H" at time t6 thereby resetting the respective capacitors.

Figure 10:
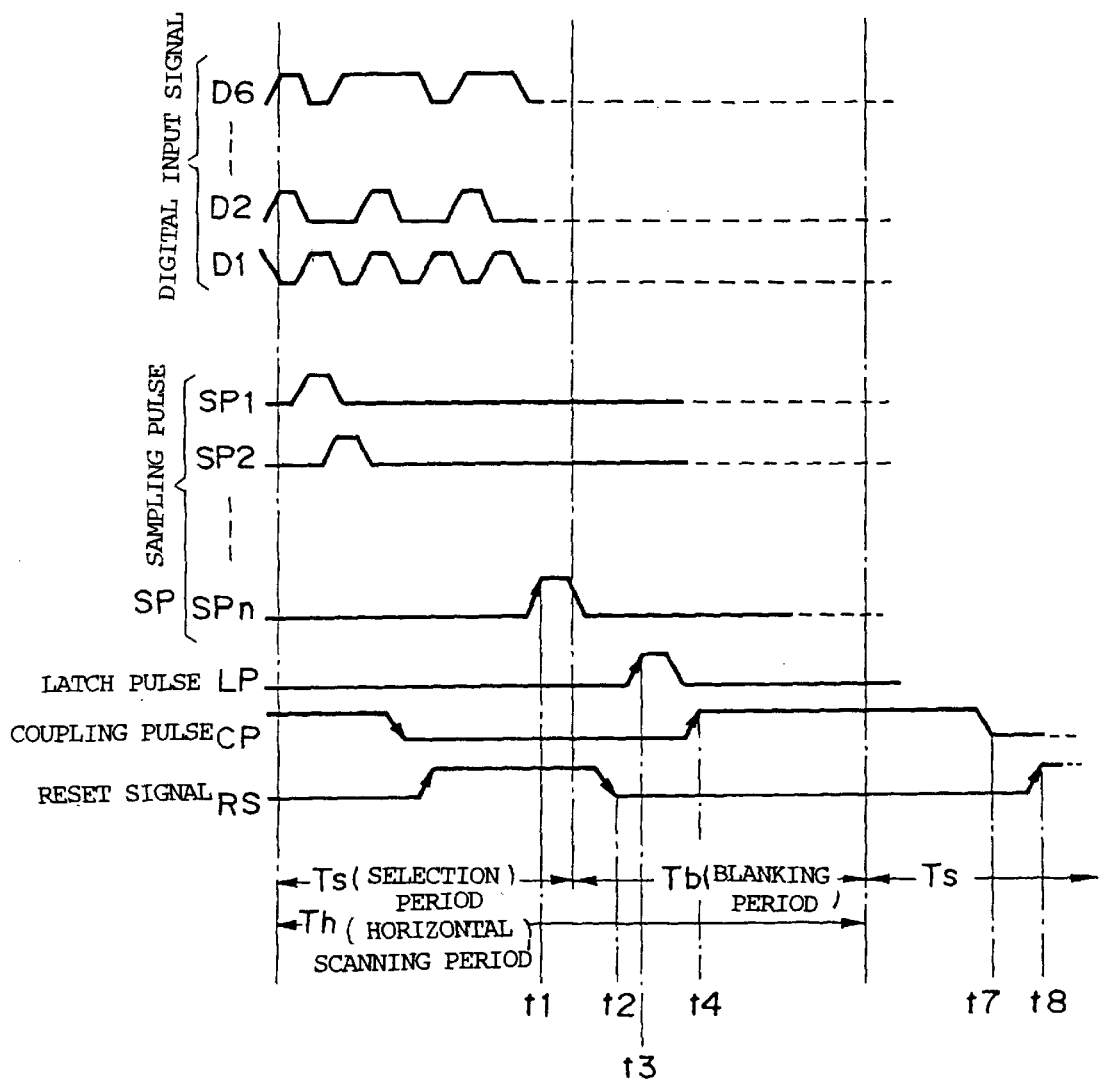
FIG. 10 is a diagram illustrating another example of the operation of the liquid crystal display device shown in FIG. 7.

As shown in FIG. 10, the D/A conversion may be performed during a longer period from t4 to t7 so that more precise D/A conversion can be achieved.

The liquid crystal display device provided with the driving circuit constructed in the above-described manner has the advantage that no inversion in the brightness due to the D/A conversion error occurs or the inversion is suppressed to a low enough level that cannot be recognized.

(d) Process of producing capacitors and TFTs

Referring to FIGS. 19–25, the process (low temperature polysilicon process) of producing the TFTs used to construct the D/A converter, the TFTs used to construct pixels, and the conversion capacitors used to construct the D/A converter will be described below. To simplify the production process, the TFTs of the D/A converter, the TFTs of the pixels, and the conversion capacitors of the D/A converter are all produced by the same process.

The coupling capacitor of the D/A converter is not produced intentionally in the D/A converter but realized by stray capacitance between the source bus line and the opposite substrate. Therefore, the production process of the coupling capacitor is not described herein.

Figure 19:
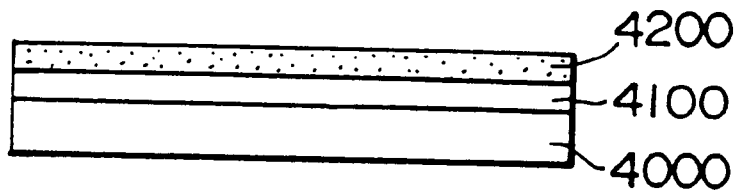
FIG. 19 is a cross-sectional view illustrating a first step in the production method of forming TFTs and MOS capacitors on the same substrate, according to the present invention.

First, as shown in FIG. 19, a buffer layer 4100 is formed on a substrate 4000, and then an amorphous silicon layer 4200 is formed on the buffer layer 4100.

Figure 20:
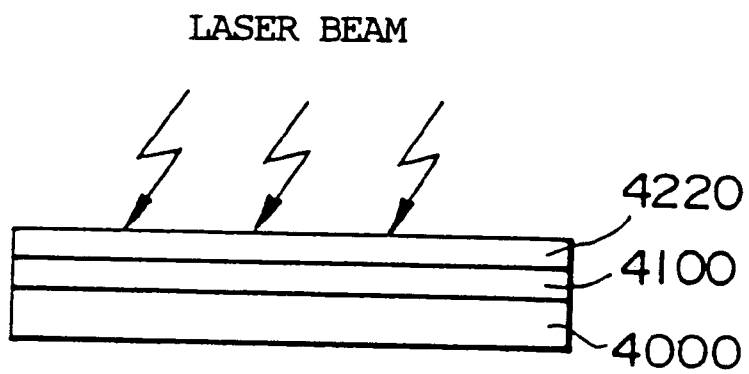
FIG. 20 is a cross-sectional view illustrating a second step in the production method of forming TFTs and MOS capacitors on the same substrate, according to the present invention.

Then, as shown in FIG. 20, the entire surface of the amorphous silicon layer 4200 is irradiated by a laser beam thereby annealing it so that the amorphous silicon is converted into a polycrystalline form and thus a polysilicon layer 4220 is formed.

Figure 21:
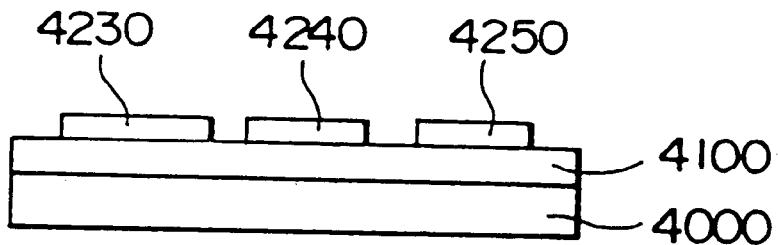
FIG. 21 is a cross-sectional view illustrating a third step in the production method of forming TFTs and MOS capacitors on the same substrate, according to the present invention.

In the following step shown in FIG. 21, the polysilicon layer 4220 is patterned into island regions 4230, 4240, and 4250. Active regions (source and drain) will be formed later in the island regions 4230 and 4240, respectively. The island region 4250 will serve as one electrode of a thin film capacitor.

Figure 22:
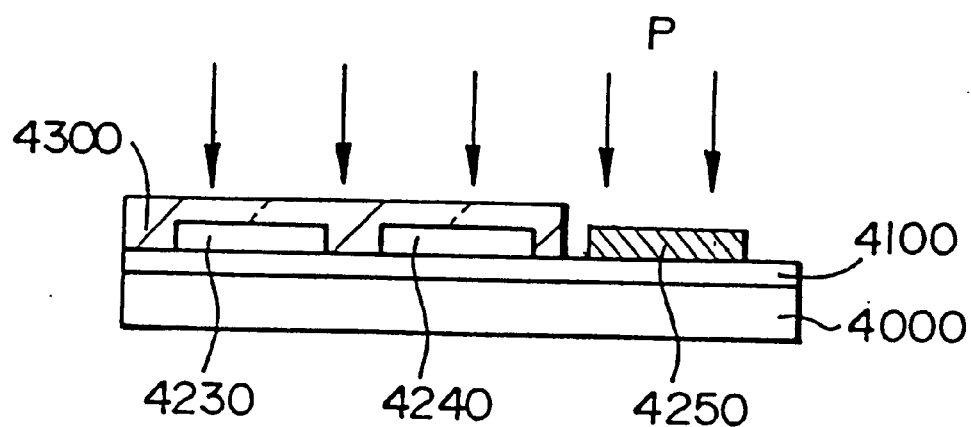
FIG. 22 is a cross-sectional view illustrating a fourth step in the production method of forming TFTs and MOS capacitors on the same substrate, according to the present invention.

Then, as shown in FIG. 22, a mask layer 4300 is formed and phosphorus (P) ions are selectively implanted into the island region 4250 thereby reducing the resistance thereof.

Figure 23:
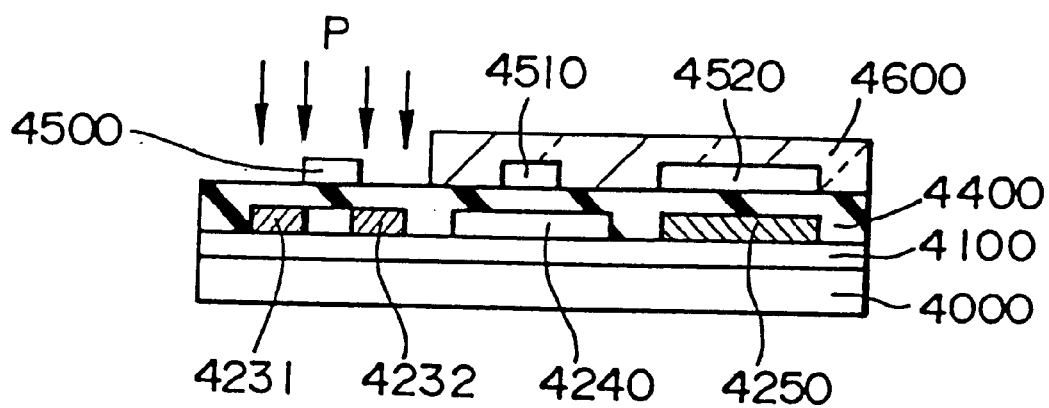
FIG. 23 is a cross-sectional view illustrating a fifth step in the production method of forming TFTs and MOS capacitors on the same substrate, according to the present invention.

Then in the following step shown in FIG. 23, a gate insulating film 4400 is formed, and furthermore TaN layers 4500, 4510, and 4520 are formed on the gate insulating film. The TaN layers 4500 and 4510 serve as the gate of MOS transistors, and TaN layer 4520 serves as the other electrode of the thin film capacitor. After that, a mask layer 4500 is formed, and phosphorus (P) ions are implanted in a self alignment fashion using the gate TaN layer 4500 as a self-alignment mask thereby forming an n-type source layer 4231 and drain layer 4232.

Figure 24:
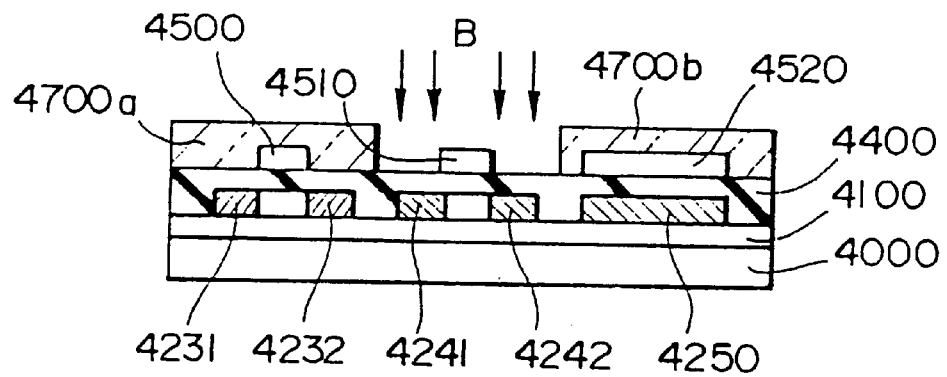
FIG. 24 is a cross-sectional view illustrating a sixth step in the production method of forming TFTs and MOS capacitors on the same substrate, according to the present invention.

Then, as shown in FIG. 24, mask layers 4700a and 4700b are formed, and boron (B) ions are implanted in a self-alignment fashion using the gate TaN layer 4510 as a self alignment mask thereby forming a p-type source layer 4241 and drain layer 4242.

Figure 25:
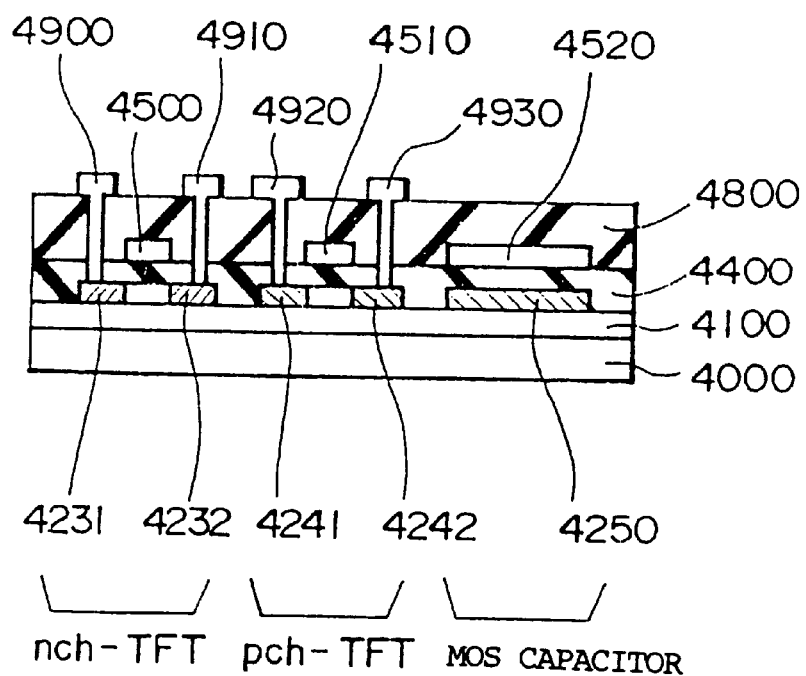
FIG. 25 is a cross-sectional view illustrating a seventh step in the production method of forming TFTs and MOS capacitors on the same substrate, according to the present invention.

Furthermore, as shown in FIG. 25, an interlayer insulating film 4800 is formed, and contact holes are formed in this interlayer insulating film. Electrode layers 4900, 4910, 4920, and 4930 are then formed of ITO or Al. Although not shown in FIG. 25, the TaN layers 4500, 4510, and 4520, and the polysilicon layer 4250 are also connected to corresponding electrodes via contact holes. Thus, the production of the n-channel TFT, p-channel TFT, and MOS capacitor is completed.

In this embodiment, as described above, the production is performed using the common process. This allows the production to be performed easily and at a low cost. That is, the analog switches E1–En and F1–Fn, and the conversion capacitors C1–C6, and the TFTs (M100, M200) of pixels can be produced using the same process. Furthermore, if the D/A converter is designed to have the unique features according to the present invention, the liquid crystal display device having high reliability (high display quality) can be produced with the simplified process according to the invention.

(Fourth Embodiment)

Figure 27:
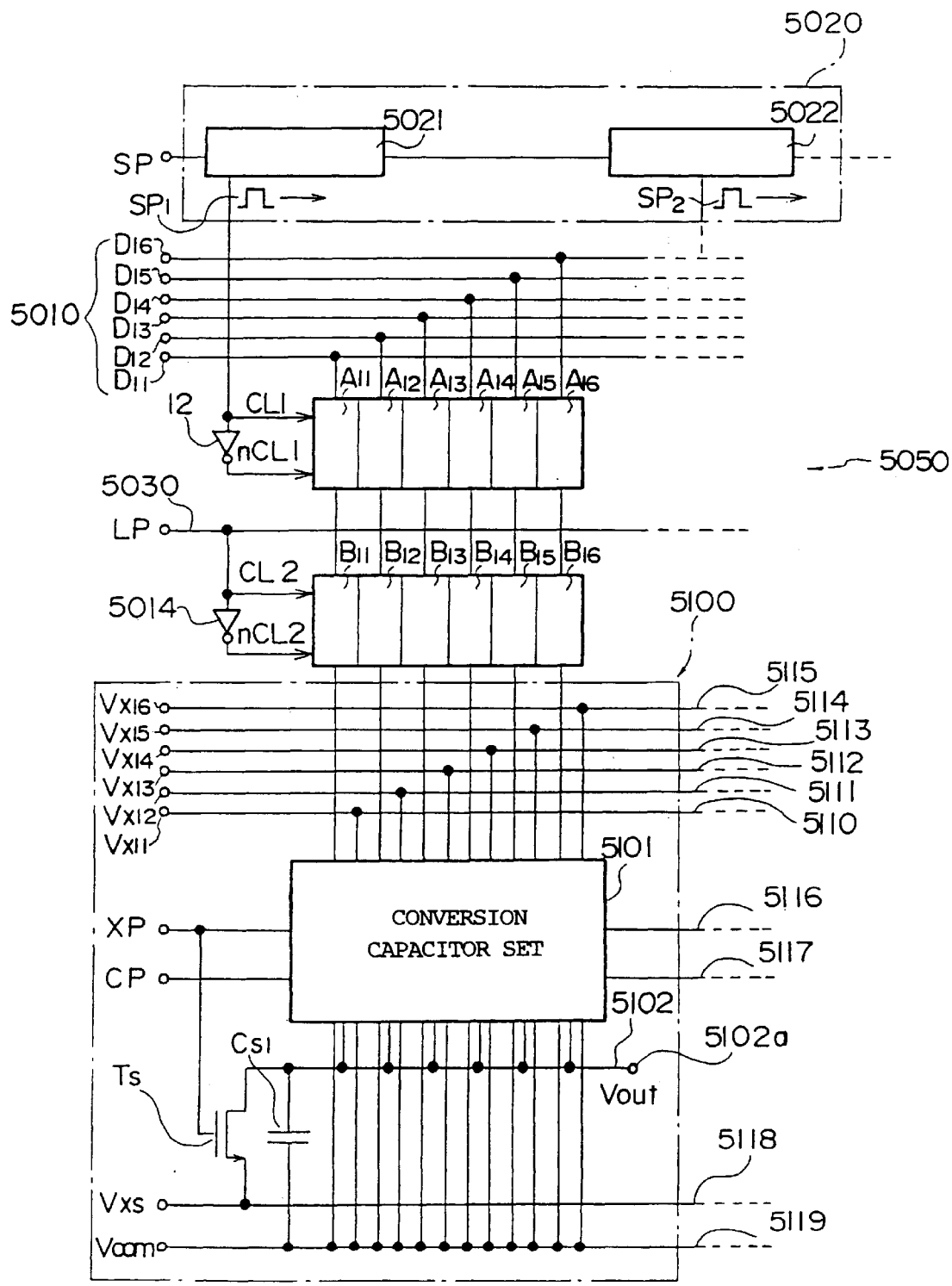
FIG. 27 is a circuit diagram illustrating the driving circuit used in the liquid crystal display device according to the fourth embodiment of the invention.
Figure 28:
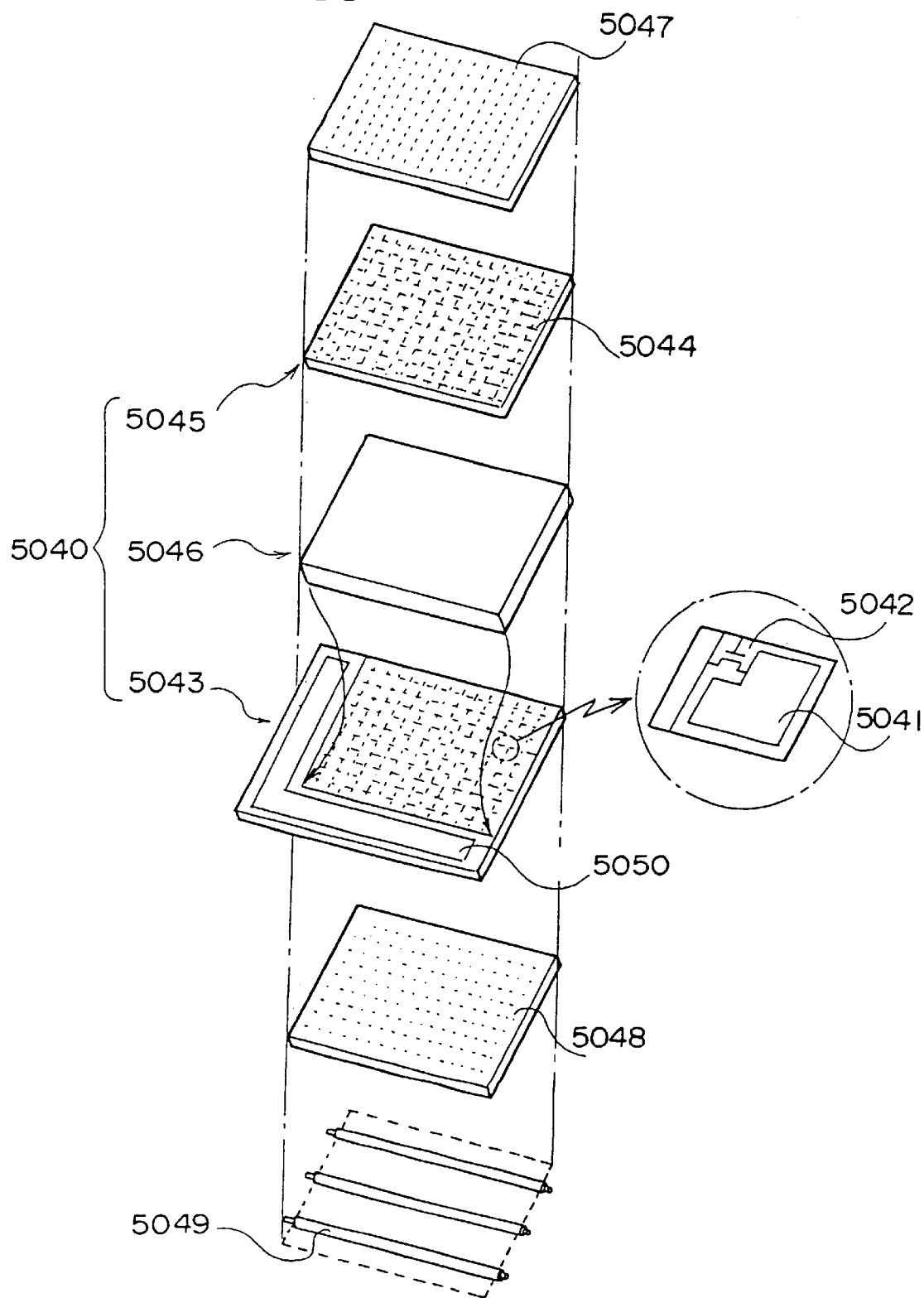
FIG. 28 is a schematic diagram illustrating the liquid crystal display device according to the fourth embodiment of the invention.

FIG. 27 illustrates a driving circuit for driving a liquid crystal display device, according to a fourth embodiment of the invention. FIG. 28 is an exploded perspective view of the liquid crystal display device. As shown in FIG. 28, the liquid crystal display device includes a liquid crystal panel of the active matrix type 5040. The liquid crystal panel 5040 is composed of a liquid crystal 5046 sealed between a TFT substrate 5043 and a color filter substrate 5045 wherein thin film transistors 5042 for controlling the supply of voltage to pixel electrodes 5041 are formed on the TFT substrate 5043 and an opposite electrode 5044 is formed on the color filter substrate 5045. Polarizing plates 5047 and 5048 are disposed on either side of the liquid crystal panel 5040, wherein the polarizing plate 5048 is provided with a back light disposed thereon. Furthermore, a driving circuit 5050 is formed on the TFT substrate 5043.

The driving circuit 5050, as shown in FIG. 27, includes a D/A converter 5100 according to the present invention. The D/A converter 5100 is designed to convert a 6-bit digital signal to an analog voltage.

The circuits on the TFT substrate 5043 are all formed of polysilicon using a low temperature process.

Figure 74:
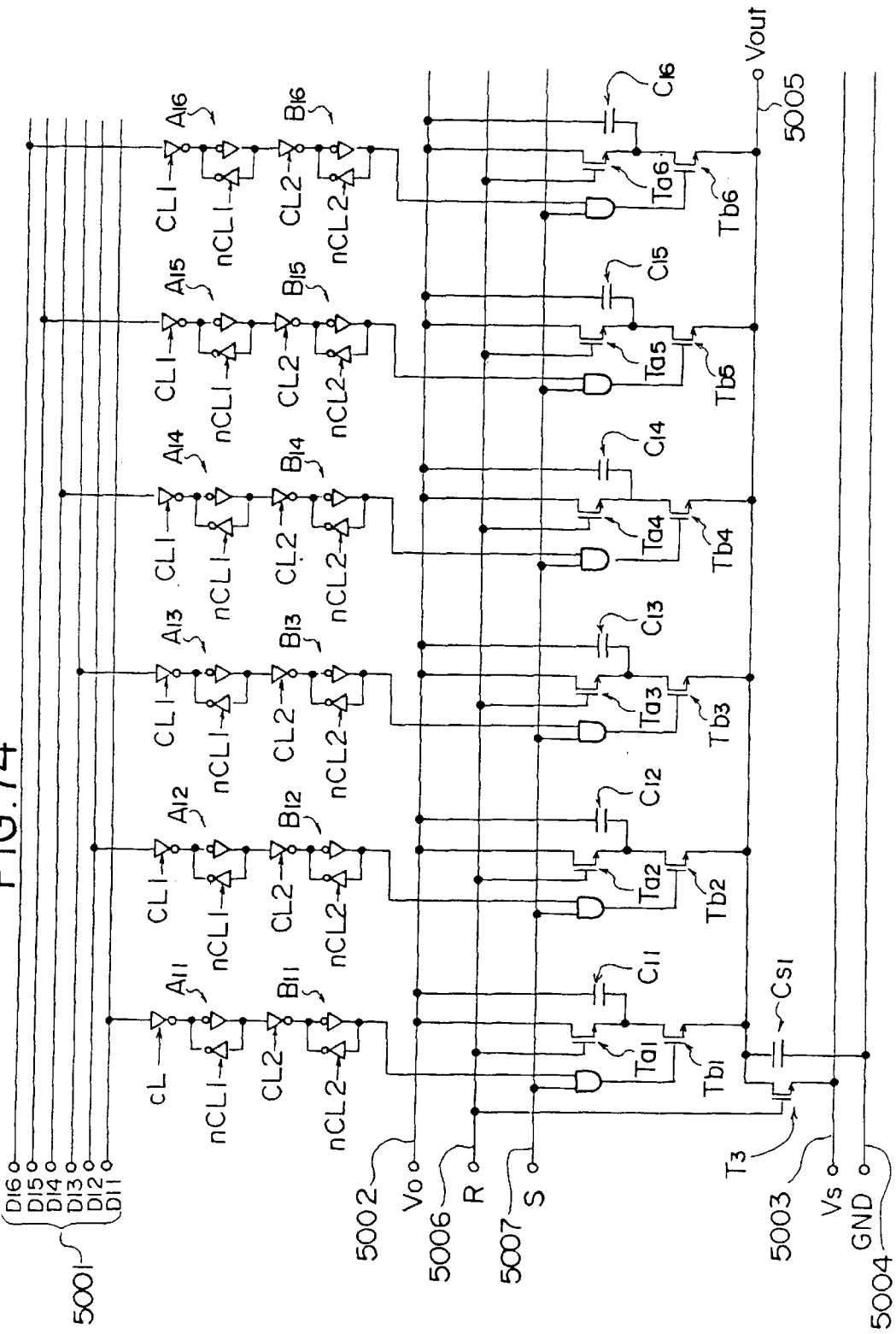
FIG. 74 is a circuit diagram illustrating a conventional D/A converter with binary-weighted capacitors.
Figure 75:
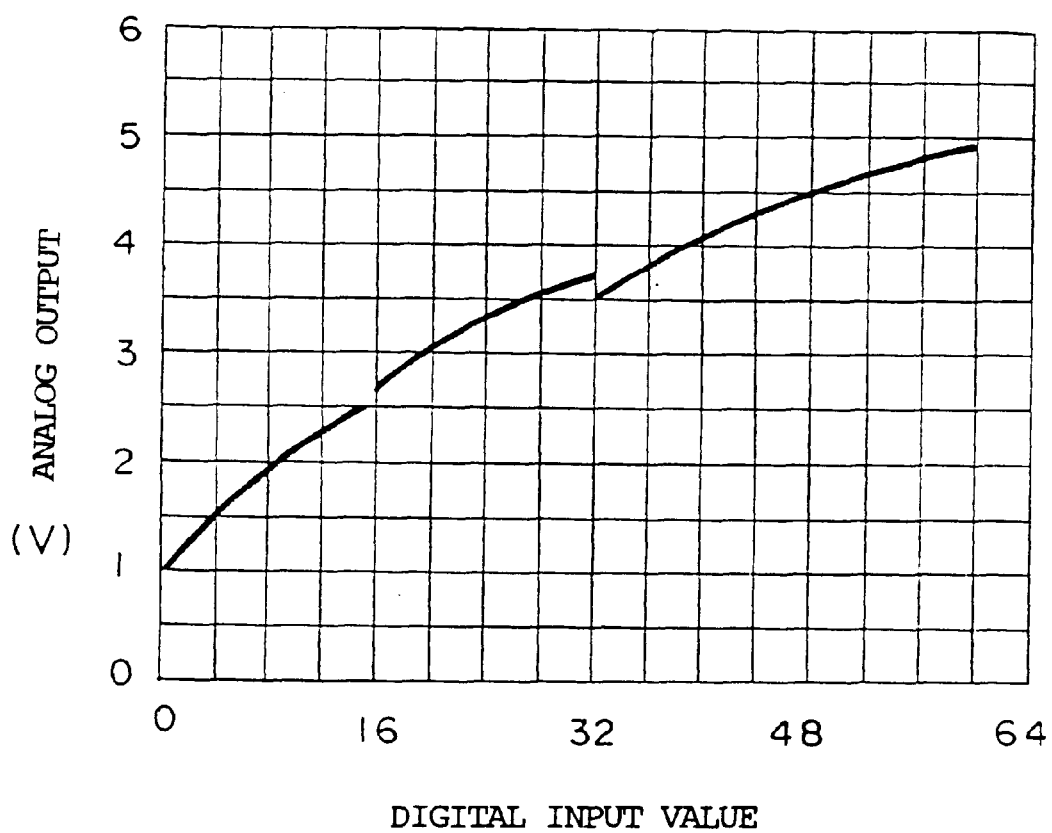
FIG. 75 is a graph illustrating a typical example of the conversion characteristic of the conventional D/A converter.
Figure 76A:
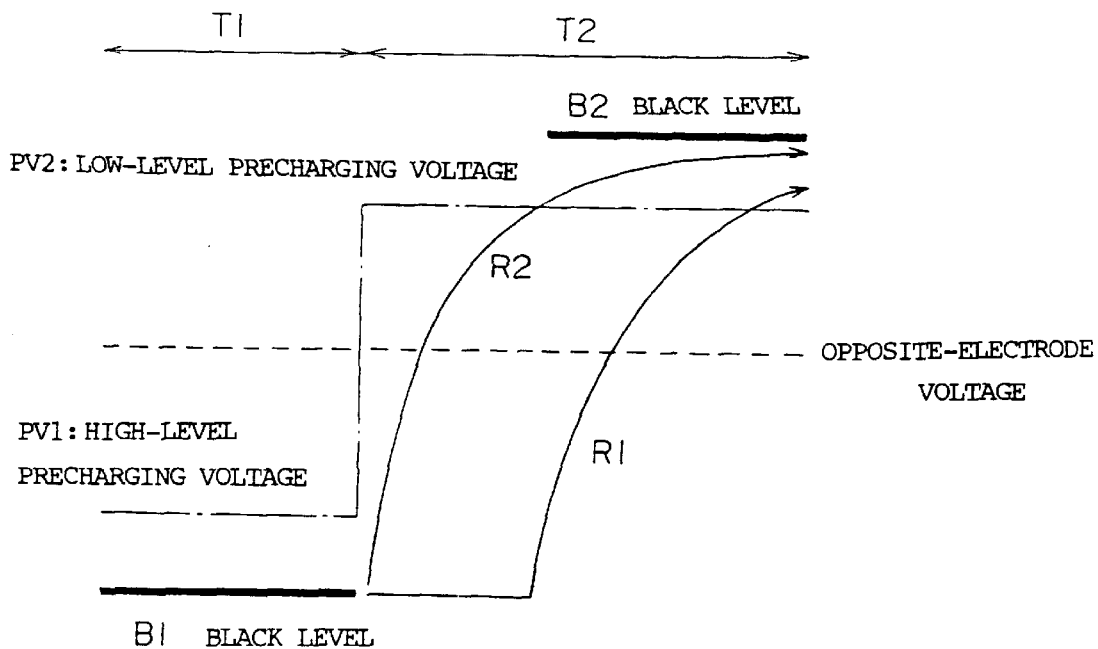
FIGS. 76A and 76B are diagrams illustrating the effects of operation of precharging signal lines.
Figure 76B:
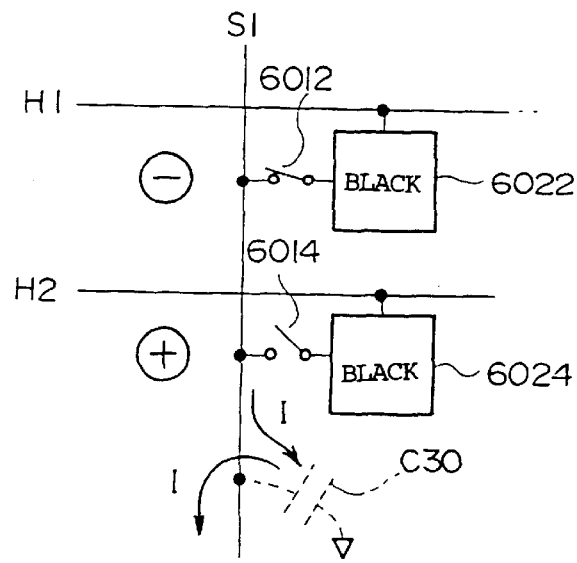

In FIG. 27, digital signals D11–D16 are input over six digital signal lines 5010. In response to a clock signal CL1 and an inverted clock signal nCL1, the digital signals D11–D16 are held by latches A11–A16. These latches A11–A16 are of the same type as those shown in FIG. 74.

The shift register 5020 includes as many stages of registers 5021, 5022, . . . as there are signal lines on the liquid crystal display device wherein each stage of register generates a sampling pulse SP serving as the clock signal CL1. The sampling pulse SP is inverted in signal level by an inverter 5012, and the inverted signal is used as the inverted clock signal nCL1.

There are provided latches A11–A16 corresponding to the respective registers 5021, 5022, etc. When the signals are held by the latches A11–A16, all these signals are simultaneously transferred to the latches B11–B16 at the following stage. The transfer of the signals is performed in response to the clock signal CL2 and the inverted clock signal nCL2 applied to the latches B11–B16.

The latch pulse LP serving as the clock signal CL2 is supplied via a latch pulse line 5030. The latch pulse LP is inverted in signal level by an inverter 5014, and the inverted signal is used as the inverted clock signal nCL2.

After the signals are transferred to the second-stage latches B11–B16, the D/A conversion is performed in accordance with the signals held by the second-stage latches B11–B16. During this D/A conversion process, the following signals can be input to the latches A11–A16 corresponding to the respective registers 5021, 5022, etc.

The latches B11–B16 are constructed in a similar manner to the latches A11–A16, and thus they are not described in further detail here.

The signals held by the latches B11–B16 are input to the D/A converter 5100. The D/A converter 5100 includes a conversion capacitor unit 5101. The charges stored in the conversion capacitor unit 5101 vary in accordance with the signals held by the latches B11–B16 thereby generating an analog voltage corresponding to the signals held by the latches B11–B16.

Figure 26:
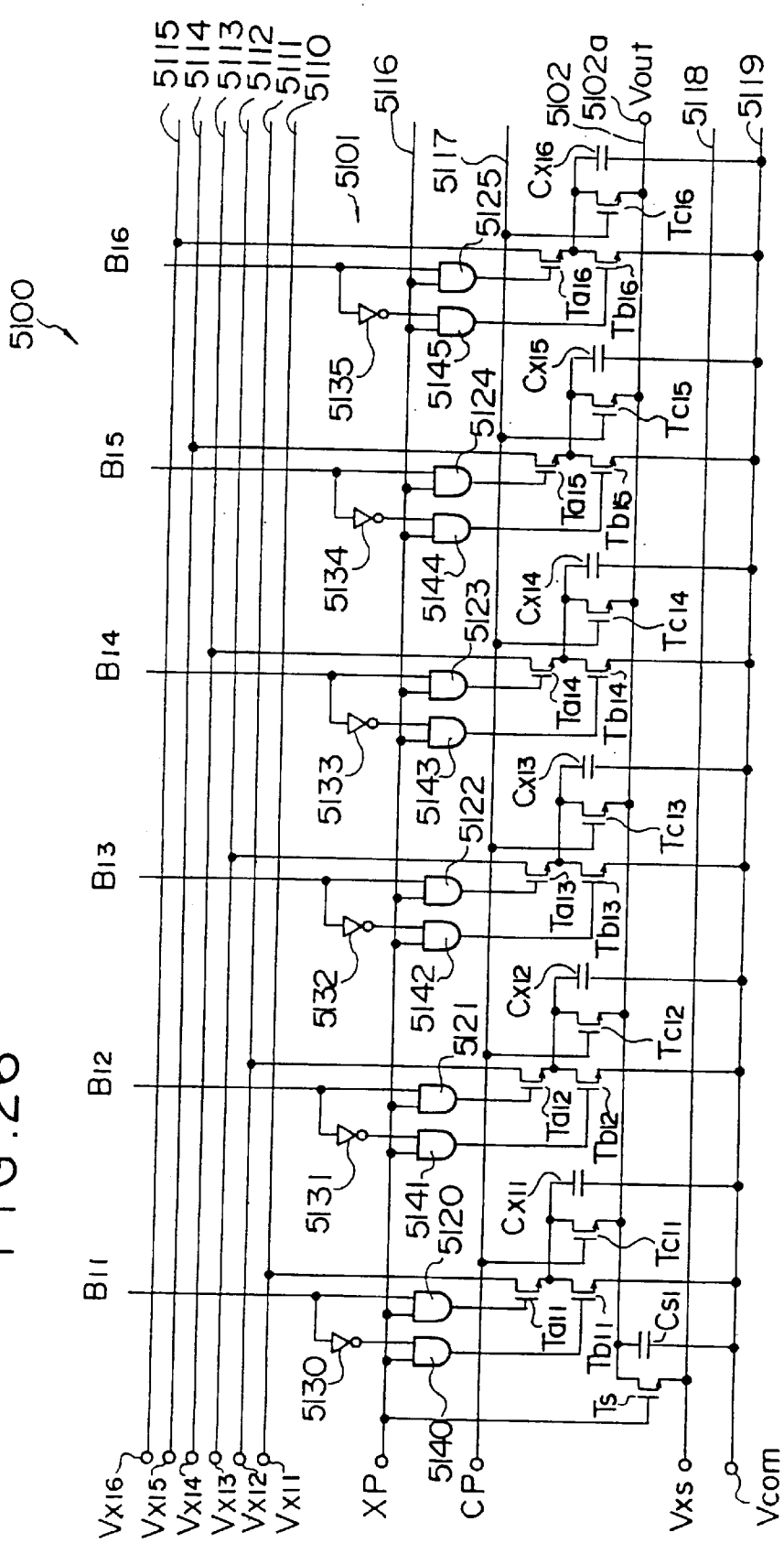
FIG. 26 is a circuit diagram illustrating a D/A converter according to a fourth embodiment of the invention.

FIG. 26 illustrates the details of the D/A converter 5100. The D/A converter 5100 includes conversion capacitors Cx11–Cx16. The charges stored in these capacitors vary in accordance with the digital signals D11–D16, and the corresponding analog voltage Vout is output via the output terminal 5102a of the output signal line 5102. The conversion capacitors Cx11–Cx16 comprise the main part of the conversion capacitor unit 5101 shown in FIG. 27.

More specifically, the conversion capacitors Cx11–Cx16 are connected between corresponding one of conversion selection lines 5110–5115 and a common voltage line 5119. Voltages Vx11–Vx16 are supplied via the conversion selection lines 5110–5115, and voltage Vcom is supplied via the common voltage line 5119. As a result, charges corresponding to the difference in voltage between Vx11–Vx16 and Vcom are stored in the respective conversion capacitors Cx11–Cx16.

The conversion capacitors Cx11–Cx16 may be electrically connected or disconnected to or from the corresponding conversion selection lines 5110–5115 via analog switches Ta11–Ta16. On the other hand, when analog switches Tb11–Tb16 are turned on, both electrodes of each conversion capacitor Cx11–Cx16 are connected to the common voltage line 5119, as shown in FIG. 26. In this case, there is no difference in voltage between the two electrodes of each conversion capacitor, and thus no charge is stored.

The capacitance values of the conversion capacitors Cx11–Cx16 are set in such a manner as to satisfy the following equation:

$$Cx11=Cx12=Cx13=Cx14=Cx15=Cx16$$

The voltages Vx11–Vx16 relative to the voltage Vcom are set such that

Vx11: Vx12: Vx13: Vx14: Vx15: Vx16=1:2:4:8:16: 32

In other words, the voltages Vx11–Vx16 are set so that the sequence of Vx11, Vx12, . . . , Vx16 is of geometric progression with a common ratio of 2.

The on/off state of each analog switch Ta11–Ta16 is determined by AND between the signal held by corresponding one of latches B11–B16 and the conversion pulse XP which is input via the conversion pulse line 5116. That is, the analog switches Ta11–Ta16 are controlled by the output of the respective AND gates 5120–5125.

The on/off state of each analog switch Tb11–Tb16 is determined by AND between the inverted value of the signal held by corresponding one of latches B11–B16 and the conversion pulse XP which is input via the conversion pulse line 5116. More specifically, the signals held by the latches B11–B16 are inverted by the inverters 5130–5135, and the analog switches Tb11–Tb16 are controlled by the output of the respective AND gates 5140–5145.

There is provided a reference capacitor Cs1 between the output signal line 5102 and the common voltage line 5119. Furthermore, an analog switch Ts is disposed between the output signal line 5102 and the conversion reference signal line 5118. A voltage Vxs is supplied via the conversion reference signal line 5118. When the analog switch Ts is turned on, the reference capacitor Cs1 is charged by the voltage difference between Vcom and Vxs. The charge stored in the reference capacitor Cs1 serves to increase the minimum value of the analog output. When this D/A converter 5100 is used in a liquid crystal display device, the above increased output voltage can serve as a bias voltage.

The reference capacitor Cs1 is connected in series to the respective conversion capacitors Cx11–Cx16 via the analog switches Tc11–Tc16. The analog switches Tc11–Tc16 are controlled by the coupling pulse CP input via the coupling pulse line 5117.

The D/A conversion process performed by the above D/A converter 5100 is now described below.

Herein, it is assumed that the digital signals D11–D16 have been already stored in the latches B11–B16.

First, a conversion pulse XP is input via the conversion pulse line 5116. In response to the conversion pulse XP, either the analog switch Ta11–Ta16 or the analog switches Tb11–Tb16 are turned on. More specifically, if some of digital signals D11–D16 are in an "H" state, then the corresponding analog switches of Ta11–Ta16 are turned on. Then, the conversion capacitors Cx11–Cx16 are charged by the voltage difference between voltages Vx11–Vx16 of the conversion selection lines 5110–5115 and the voltage Vcom of the common voltage line 5119. The charges Qi stored in the respective conversion capacitors are given by $$Qi=Cxi(Vxi-Vcom) \quad (2\text{-}1)$$

where i=11, 12, 13, 14, 15, and 16.

On the other hand, those bits of the digital signals D11–D16 being in an "L" state cause the corresponding analog switches of Tb11–Tb16 to be turned on, which in turn causes the voltage across the corresponding conversion capacitors of Cx11–Cx16 to become zero. As a result, no charge is stored in these conversion capacitors. Thus, $$Qi=0 \quad (2\text{-}2)$$

Combining equations (2-1) and (2-2) yields $$\Sigma Qi=\Sigma Cxi(Di(Vxi-Vcom)) \quad (2\text{-}3)$$

where Di takes a value of 1 when the corresponding bit D11–D16 of the digital signal is in the "H" level, while Di takes a value of 0 when the corresponding bit D11–D16 is in the "L" level.

At the same time as the above operation, the analog switch Ts is turned on. As a result, the reference capacitor Cs1 is charged by the difference between the voltage Vxs on the conversion reference voltage line 5118 and the voltage Vcom on the common voltage line 5119. The charge Qs stored in the reference capacitor Cs1 is given by $$Qs=Cs1(Vxs-Vcom) \quad (2\text{-}4)$$

Then the signal on the conversion pulse line 5116 is switched to "L". As a result, the analog switches Ta11–Ta16, Tb11–Tb16, and Ts are all turned off. After that, a coupling pulse CP is input via the coupling pulse line 5117 thereby turning on the analog switches Tc11–Tc16.

Thus, the respective conversion capacitors Cx11–Cx16 are connected in series to the reference capacitor Cs1. In this state, if the total charge stored in the conversion capacitors Cx11–Cx16 is denoted by $\Sigma Qi'$, and the charge stored in the reference capacitor Cs1 is denoted by Qs', then the following equations hold.

$$\Sigma Qi'=\Sigma Cxi(Vout-Vcom) \quad (2\text{-}5)$$

$$Qs'=Cs1(Vout-Vcom) \quad (2\text{-}6)$$

for each value of i=11, 12, 13, 14, 15, and 16. In the above equations, Vout denotes the voltage on the output voltage line 5102. Herein, the following equation holds:

$$\Sigma Qi+Qs=\Sigma Qi'+Qs'$$

Thus, from equations (2-3) to (2-6) together with the above equation, the following equation is obtained.

$$\Sigma Cxi(Di(Vxi-Vcom))+Cs1(Vxs-Vcom)$$

$$=\Sigma Cxi(Vout-Vcom)+Cs1(Vout-Vcom)$$

Thus, $$Vout=(\Sigma Cxi(DiVxi+(1-Di)Vcom)+Cs1Vxs)/(\Sigma Cxi+Cs1) \quad (2\text{-}7)$$

where i=11, 12, 13, 14, 15, and 16, and Di has a value of 1 when the corresponding bits of D11–D16 of the digital signal is at an "H" level while Di has a value of 0 when the corresponding bits of D11–D16 of the digital signal is at an "L" level.

The analog voltage obtained as a result of the above operation is output via the output terminal 5102a.

Figure 29:
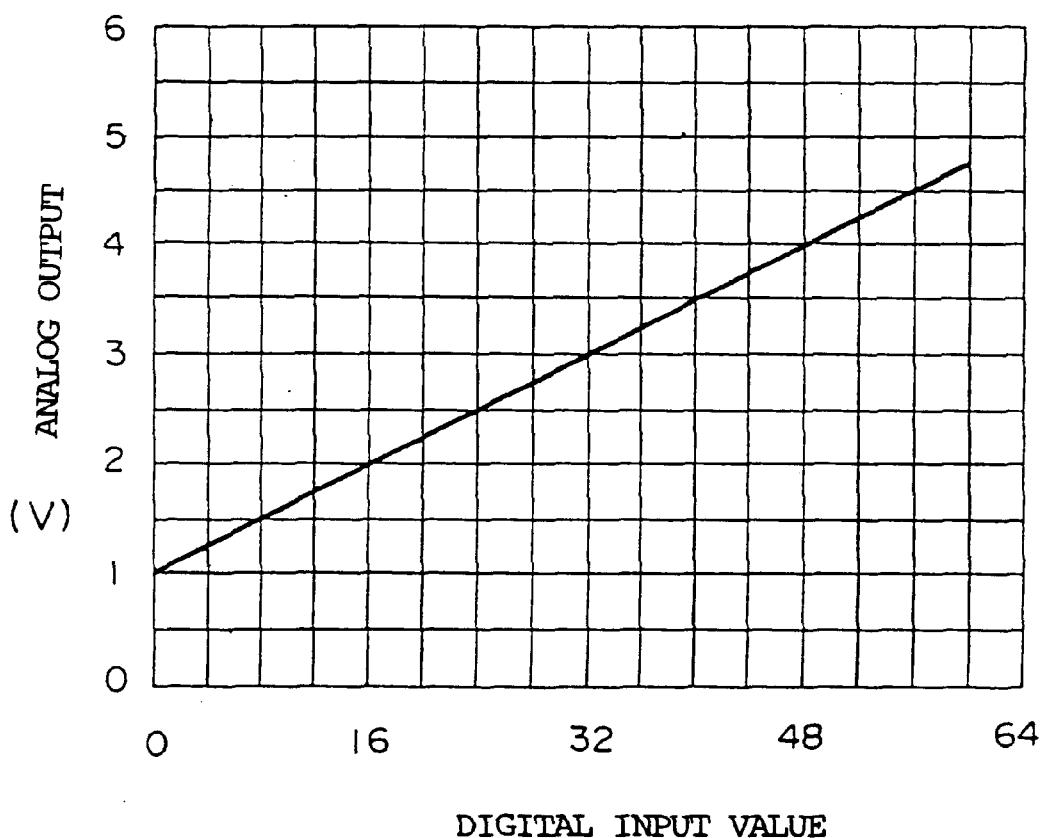
FIG. 29 is a graph illustrating the D/A conversion characteristic of the D/A converter according to the fourth embodiment of the invention.

FIG. 29 illustrates the D/A conversion characteristic of the D/A converter 5100. In this specific example of the D/A converter 5100, the conversion capacitances Cxi are all 1.0 pF and the reference capacitor Cs1 is 2.0 pF. Furthermore, the voltages Vx11–Vx16 on the conversion selection lines 5110–5115 are set to 0.5, 1.0, 2.0, 4.0, 8.0, and 16.0 V, respectively, so that the sequence of Vx11, Vx12, Vx13, Vx14, Vx15, Vx16 is of geometric progression with a common ratio of 2. The voltage Vxs on the conversion reference voltage line 5118 is set to 4.0 V, and the common voltage line 5119 is set to GND voltage.

As shown in FIG. 29, the analog output is an exactly linear function of the 6-bit digital input signal. This exact linearity results from the fact that the denominator ($\Sigma Cxi + Cs1$) of equation (2-7) which determines the analog output Vout is kept constant regardless of the value of the digital input signal, and thus the analog output of the D/A converter 5100 is proportional to the digital input signal. In FIG. 29, when the digital input signal is 0, the analog output voltage becomes 1 V. This is due to the fact that even when the digital input signal is 0, there is a charge stored in the reference capacitor Cs1.

Figure 30:
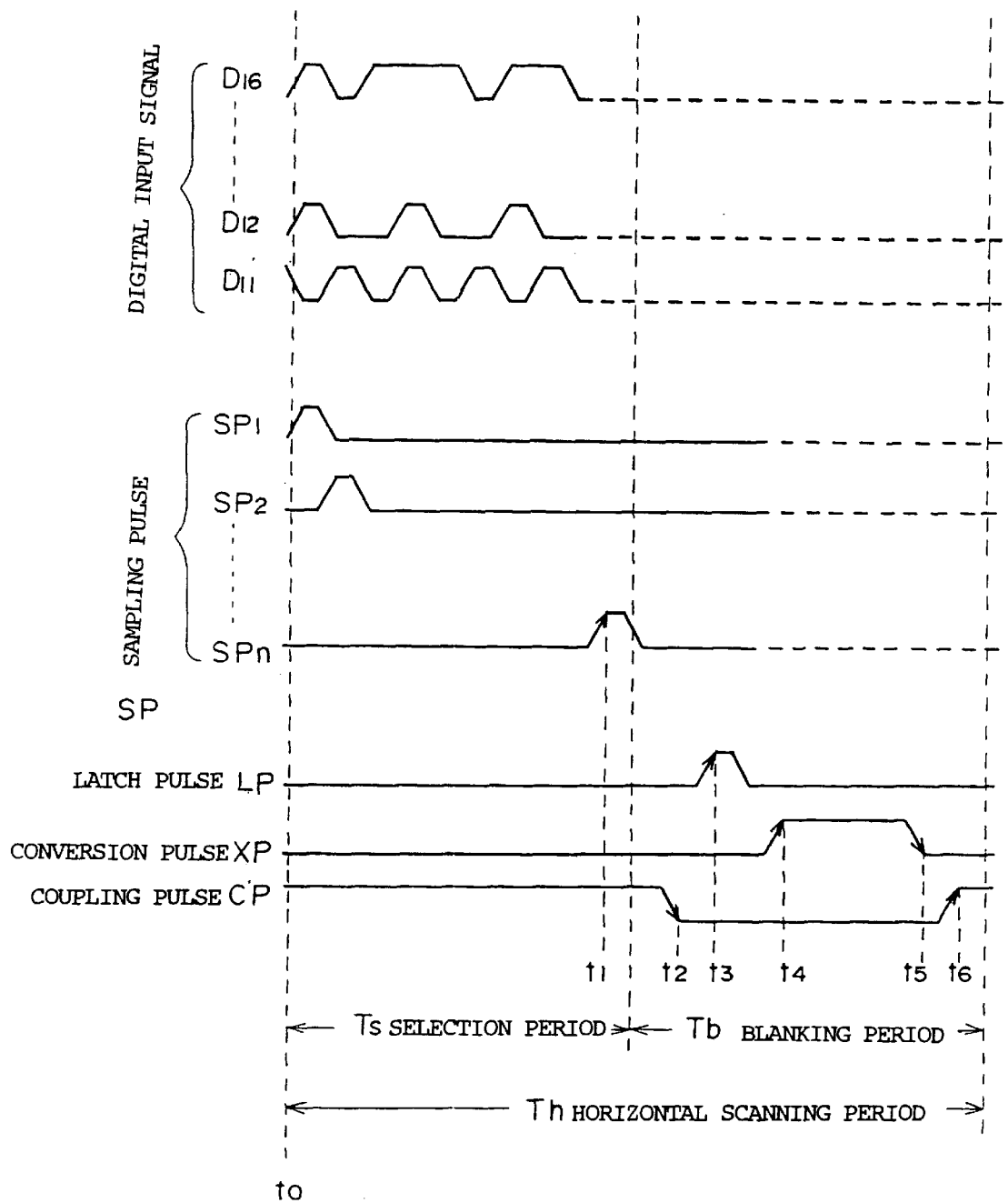
FIG. 30 is a diagram illustrating the method of driving the liquid crystal display device, according to the fourth embodiment of the invention.

FIG. 30 illustrates the operation of a liquid crystal display device including the above D/A converter 5100. In other words, FIG. 30 illustrates the operation of the driving circuit for driving the liquid crystal display device, shown in FIG. 27.

In the operation of driving the liquid crystal display device, as shown in FIG. 30, one horizontal scanning period Th consists of a scanning signal selection period Ts and a blanking period Tb between two adjacent selection periods Ts.

Sampling pulses SP1–SPn are generated during a time period from t0 to t1, and digital signals D11–D16 are captured by the latches A11–A16 in response to these sampling pulses.

During a blanking period Tb prior to the following selection period Ts, D/A conversion and other operations are performed.

At time t2 in the blanking period Tb, the coupling pulse CP is changed to "L" thereby turning off the analog switches Tc11–Tc16 and thus disconnecting the electronic connections between the respective conversion capacitors Cx11–Cx16 and the reference capacitor Cs1. After that, in response to a latch pulse LP generated at time t3, the signals stored in the latches A11–A16 are transferred to the latches B11–B16.

At time t4, the analog switches Ta11–Ta16 and Tb11–Tb16 are controlled by the conversion pulse XP and the signals stored in the latches B11–B16. As a result, those of the conversion capacitors Cx11–Cx16 corresponding to the digital signals being in the "H" state are charged while no charge is stored in those of the conversion capacitors corresponding to the digital signals being in the "L" state. At the same time, the reference capacitor Cs1 is charged. The conversion pulse XP is maintained at the "H" level for a longer period of time than other pulses so that the above charging operation is performed correctly.

At time t5, the conversion pulse XP is changed to "L", and the charging operation is completed.

Then, in response to a coupling pulse CP generated at time t6, the respective conversion capacitors Cx11–Cx16 are connected to the reference capacitor Cs1. Thus, an output voltage set to a particular value is output via the output terminal 5102a.

Now referring to FIGS. 31A and 31B, the operation of driving the liquid crystal display device in an alternately inverting fashion will be described below.

To avoid the degradation in the quality of the liquid crystal, the liquid crystal display device is driven in an alternately inverting fashion. To this end, the driving circuit 5050 (shown in FIGS. 27 and 28) including the above D/A converter 5100 performs its driving operation in an alternately inverting fashion as shown in FIGS. 31A and 31B. More specifically, the driving operation is inverted not but every signal but every horizontal scanning line and also every frame.

Figures 31A, 31B:
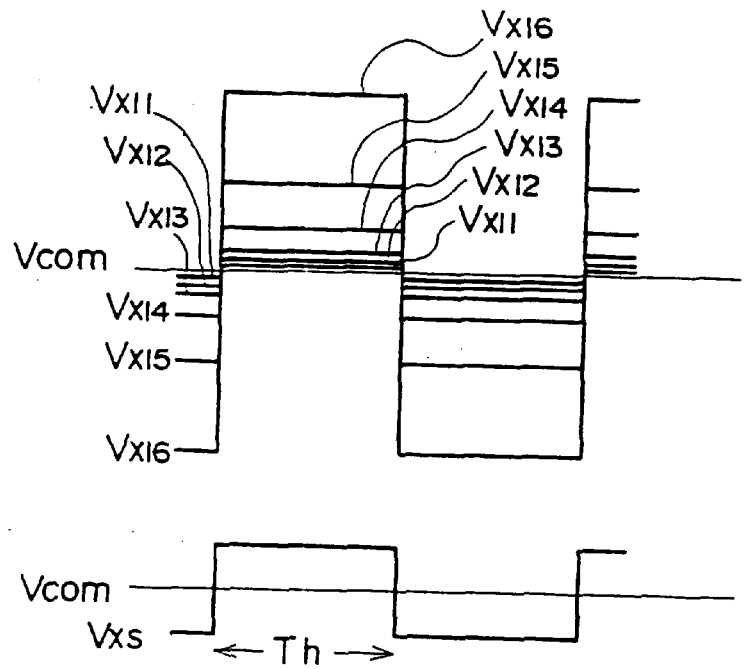
FIGS. 31A and 31B are diagrams illustrating the operation of driving the liquid crystal display device in a periodically inverting fashion.

FIG. 31A illustrates voltages Vx11, Vx12, Vx13, Vx14, Vx15, and Vx16 supplied, in the driving operation, via the conversion selection lines 5110–5115 and also illustrates voltage Vxs supplied via the conversion reference voltage line 5118. FIG. 31B illustrates specific values of these voltages.

In this specific example of the D/A converter 5100, the conversion capacitances Cxi are all set to 1.0 pF and the reference capacitance Cs1 is set to 2.0 pF. The common voltage line 5119 is set to GND voltage.

Under these conditions, the driving operation is performed in the alternately inverting fashion as shown in FIG. 31A. The technique of the alternately inverting driving is known in the art, and thus it is not described in further detail here.

(Adjustment Technique in the Fourth Embodiment)

In the D/A converter 5100 described above, the conversion capacitances Cx11–Cx16 are set to an equal value, and binary-weighted voltages are applied across these conversion capacitances thereby accomplishing the D/A conversion operation. Although it is difficult to change the capacitance values of the capacitors after completion of production process, it is easy to change the voltage. If the above conversion capacitors Cx11–Cx16 have capacitances different from the designed values, these deviations of capacitances can be compensated for as follows.

FIG. 32A illustrates an example in which although the actual values Cxi' of the conversion capacitances are different from the designed value Cxi (1.0 pF), the mean value of the actual capacitances is equal to the designed value. In this case, the voltages on the conversion selection lines 5110–5115 are modified from the original designed values Vxi0 to Vxi' for each value of i=11, 12, 13, 14, 15, and 16. More specifically, the voltages are modified to Vxi' given by $$Vxi' = (Cxi/Cxi') \times Vxi0$$

For example, the parameters associated with the least significant bit are given by $$Cx11 = 1.0 \text{ pF}, Cx11' = 0.9 \text{ pF, and } Vx11 = 0.5\text{V},$$

and thus $$Vx11' = (1.0/0.9) \times 0.5 = 0.5556\text{V}$$

FIG. 32B illustrates an example in which the actual values Cxi" of the conversion capacitances are different from the designed value, and the mean value of the actual capacitances is different from the designed value. In this case, the voltages Vxi" are set to the values given by $$Vxi'' = (Cxi0/Cxi'') \times (\Sigma Cxi'' + Cs1)/(\Sigma Cxi0 + Cs1) \times Vxi$$

For example, the parameters associated with the least significant bit are given by $$Cxi = 1.0 \text{ pF and } Cxi'' = 0.9 \text{ pF thus}$$

$$\Sigma Cxi'' + Cs1 = 7.4 \text{ pF and } \Sigma Cxi + Cs1 = 8.0 \text{ pF}.$$

Furthermore, $$Vx11=0.5\ V,$$

thus $$Vxi''=(1.0/0.9)\times(7.4/8.0)\times0.5n=0.5139\ V$$

In either example shown in FIG. 32A or 32B, the voltages on the conversion selection lines 5110–5115 are set to the compensated values Vxi' or Vxi" so that the D/A converter has the same D/A conversion characteristic as that shown in FIG. 29. This technique makes it possible to obtain an analog output voltage equal to the designed value even when there are deviations of the conversion capacitances Cx11–Cx16 from the designed values.

Thus the liquid crystal display device can be driven by the driving circuit 5050 using the above D/A converter 5100 without encountering degradation in the picture quality such as inversion in brightness due to the unwanted reverse change in the output voltage.

In the present embodiment, although the technique of compensating for the deviations of the conversion capacitances Cx11–Cx16 from the designed values is described, compensation for the deviation of the reference capacitance Cs1 from its designed value may also be made by properly modifying the voltages Vx11–Vx16 and Vxs thereby ensuring that a voltage having a desired value is applied to the liquid crystal. Although in the present embodiment the compensated voltages are determined by calculation, the amount of compensation may also be determined in a trial-and-error manner in accordance with the basic idea of the invention disclosed herein.

In the specific examples described above, it is assumed that the actual values of the conversion capacitances Cx11–Cx16 are known. However, in many practical situations, these values are not known. Even in such a case, an ideal D/A conversion characteristic can be obtained by adjusting the voltages Vx11–Vx16.

The D/A converter 5100 described above may also be applied to a passive matrix display device. The D/A converter 5100 may also be formed on a printed circuit board made up of a material other than glass. Furthermore, the D/A converter 5100 may also be made up of amorphous silicon, high-temperature polysilicon, crystalline silicon, gallium arsenide, or any other semiconductor materials.

The alternately-inverting driving technique employed in the above driving circuit 5050 is useful regardless of whether the inversion in polarity is performed every frame, every plural frames, every horizontal line, every plural horizontal lines, every signal line, or every plural signal lines.

Although in the embodiment described above, one electrode of each conversion capacitor Cx11–Cx16 is connected to the common voltage line 5119, the electrode may instead be connected to any other proper voltage line. Furthermore, although in the present embodiment, the voltage Vcom is applied to the both electrodes of those of conversion capacitors Cx11–Cx16 corresponding to the off-state (L) bits of the digital input signal D11–D16, another voltage may be applied to the electrodes instead of Vcom.

Figure 33:
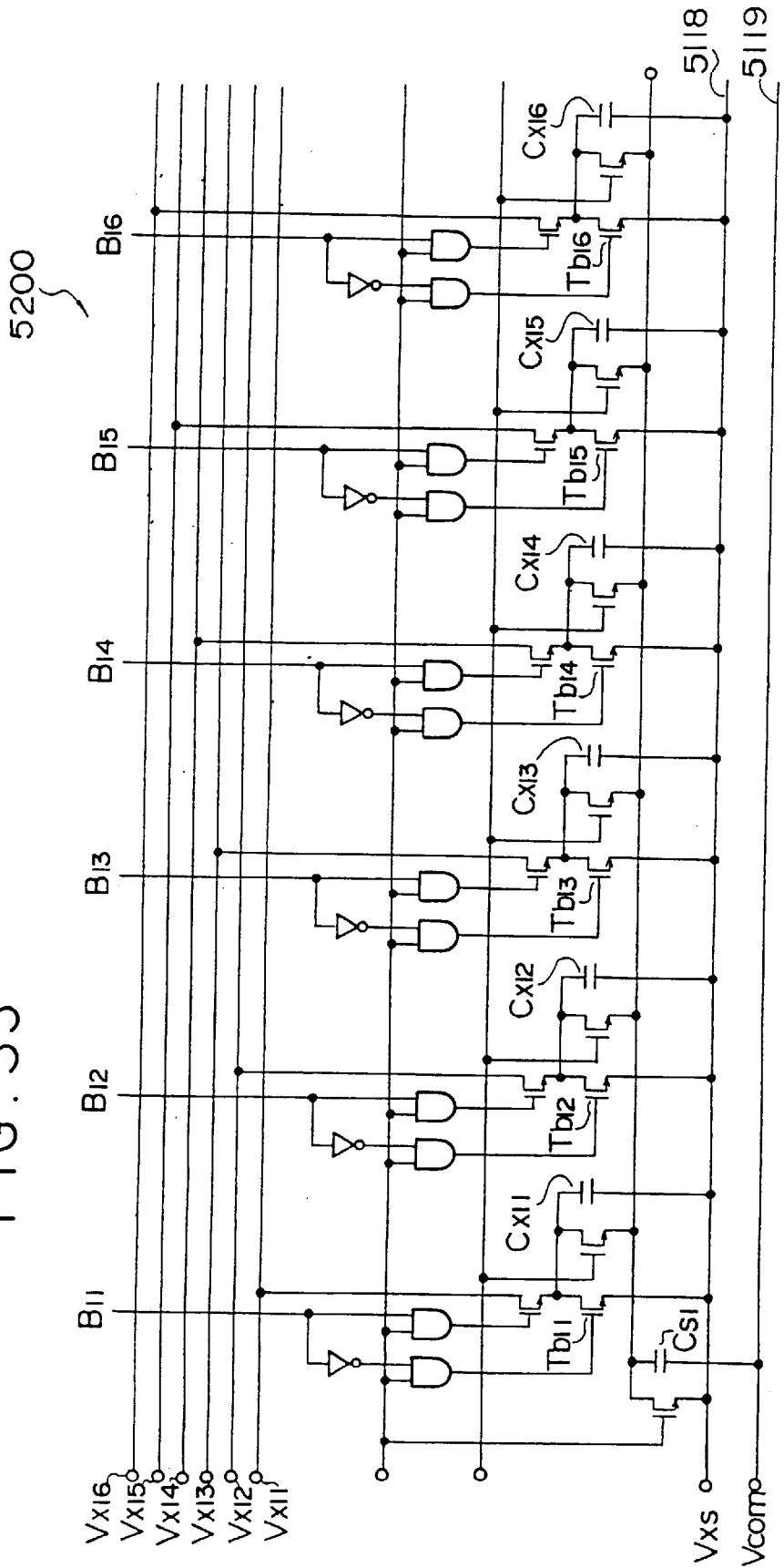
FIG. 33 is a circuit diagram illustrating a modification of the fourth embodiment of the invention.

FIG. 33 illustrates a D/A converter 5200 achieved by modifying the present embodiment taking the above points into account. In this D/A converter 5200, one electrode of each conversion capacitor Cx11–Cx16 is connected to the conversion reference voltage line 5118 instead of the common voltage line 5119. The other electrode of each conversion capacitor Cx11–Cx16 is connected to the conversion reference voltage line 5118 via the respective analog switches Tb11–Tb16. The other parts are similar to those of the D/A converter 5100 shown in FIG. 26.

In this D/A converter 5200, if some of digital signals D11–D16 are in an "L" (off) state, a voltage Vxs is supplied to one electrode of each of corresponding conversion capacitors Cx11–Cx16. However, since the same voltage is supplied to the other electrode, there is no difference in voltage between the two electrodes of these capacitors. Therefore no charge is stored in these capacitors. On the other hand, those of conversion capacitors Cx11–Cx16 corresponding to "H"-level (on) bits of the digital signals D11–D16 are charged by amounts corresponding to the differences between the voltages Vx11–Vx16 and the voltage Vxs. Except for the above operation, the D/A converter 5200 operates in a similar manner to the D/A converter 5100, and thus no further description is given here.

(Fifth Embodiment)

Figure 34:
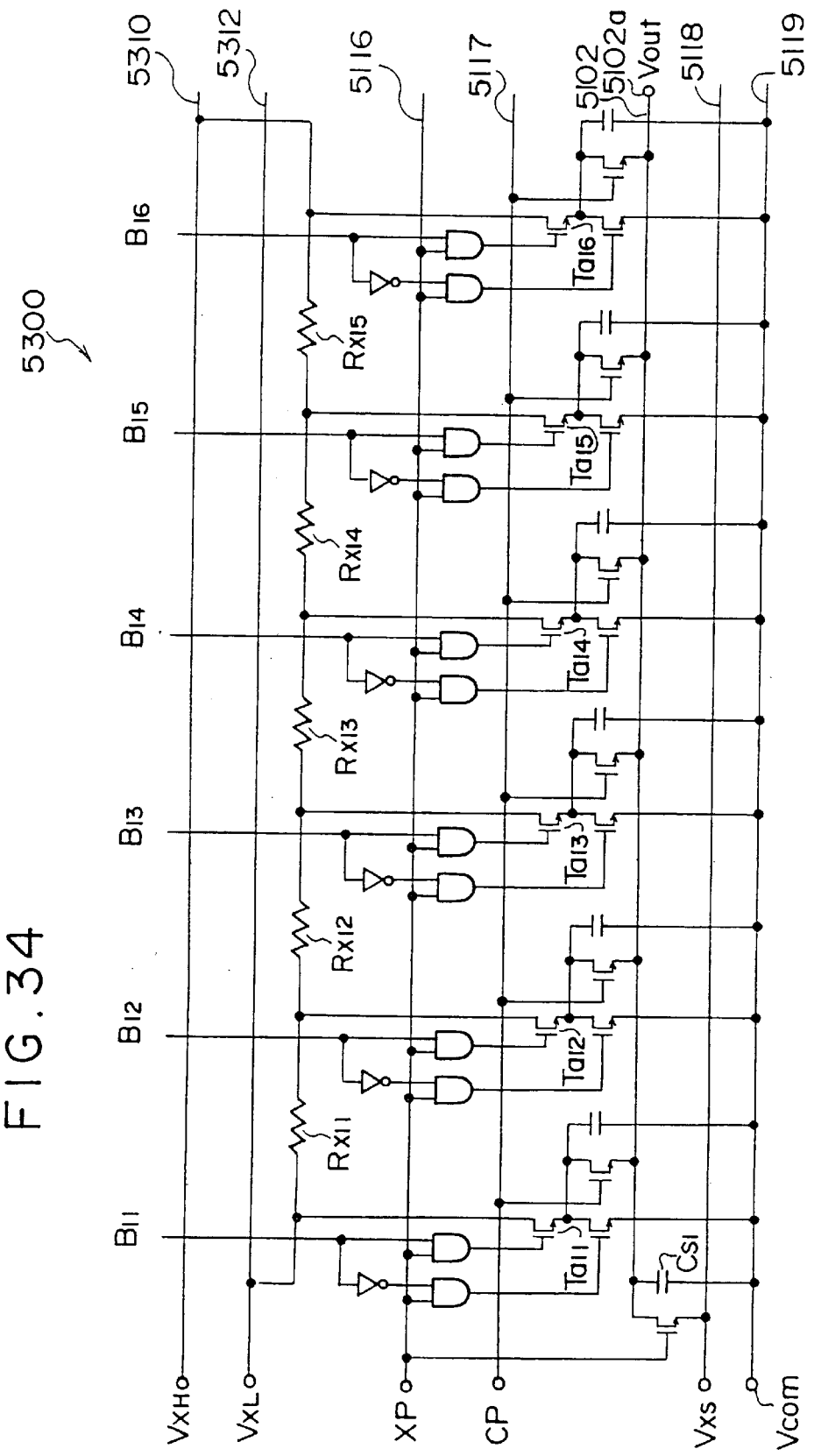
FIG. 34 is a circuit diagram illustrating a D/A converter according to a fifth embodiment of the invention.

FIG. 34 illustrates a D/A converter 5300 according to a fifth embodiment of the invention. This D/A converter 5300 may be employed, instead of the D/A converter 5100, in the driving circuit 5050 shown in FIG. 27 used to drive a liquid crystal display device. Using this driving circuit 5050 with the D/A converter 5400, the liquid crystal display device may be driven in a similar manner to the fourth embodiment described above. Similar parts to those of the fourth embodiment are denoted by similar reference numerals, and they are not described in further detail here.

In the case of the D/A converter 5100 shown in FIG. 26, there are provided conversion selection lines 5110–5115 for supplying voltages Vx11–Vx16 having values joy forming geometric progression with a common ratio of 2. In contrast, in the D/A converter 5300 shown in FIG. 34, there are resistors Rx11–Rx16 connected in series between a high voltage line 5310 and a low voltage line 5312.

A high voltage VxH is applied along the high voltage line 5310 and a low voltage VxL is applied along the low voltage line 5312. The resistance values of these resistors Rx11–Rx16 are selected so that the resistance values form a sequence of geometric progression with a common ratio of 2, wherein the high voltage VxH is set to a value equal to the highest voltage Vx16 of the voltages Vx11–Vx16 employed in the fourth embodiment and the low voltage VxL is set to a value equal to the lowest voltage Vx11 employed in the fourth embodiment. This allows the D/A converter of the fourth embodiment to have voltages divided by the resistors Rx11–Rx16, equal to the voltages Vx11–Vx16 employed in the fourth embodiment.

Thus, as in the fourth embodiment, excellent linearity between the digital input and the analog output can be obtained in this fifth embodiment.

Although in this fifth embodiment only one set of high voltage line 5310 and low voltage line 5312 is employed, two or more sets of high and low voltage lines may be employed so that different voltages are applied along these lines thereby obtaining various voltages via resistors connected in series between each set of voltage lines. This technique is a combination of the fourth and fifth embodiments.

(Sixth Embodiment)

Figure 35:
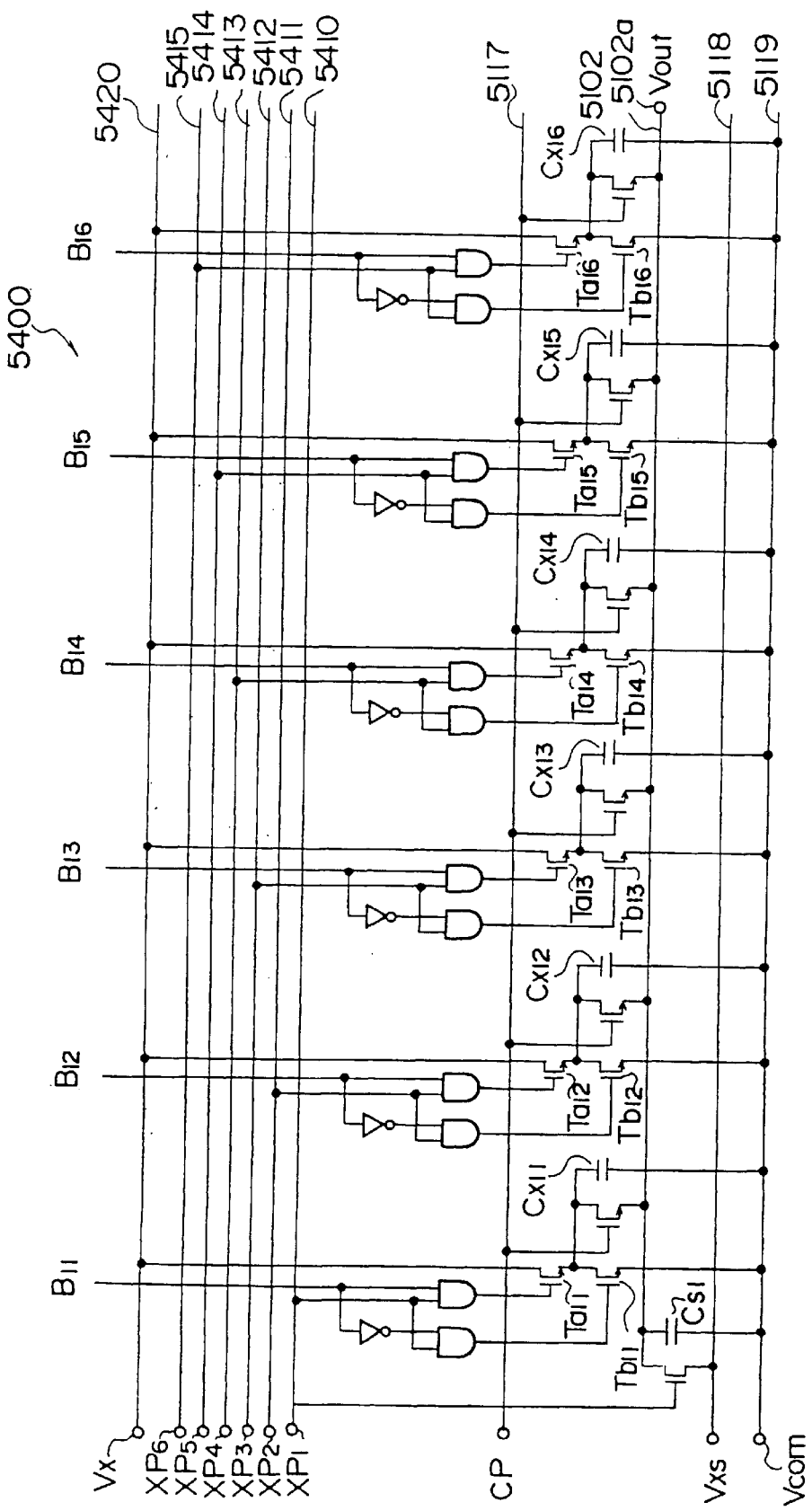
FIG. 35 is a circuit diagram illustrating a D/A converter according to a sixth embodiment of the invention.

FIG. 35 illustrates a D/A converter 5400 according to a sixth embodiment of the invention. This D/A converter 5400 may also be employed, instead of the D/A converter 5100, in the driving circuit 5050 shown in FIG. 27 used to drive a liquid crystal display device. Using this driving circuit 5050 with the D/A converter 5400, the liquid crystal display device may be driven in a similar manner to the fourth embodiment described above. Similar parts to those of the fourth embodiment are denoted by similar reference numerals, and they are not described in further detail here.

In the case of the D/A converter 5100 shown in FIG. 26, there are provided one conversion pulse line 5116 and a plurality of conversion selection lines 5110–5115 for supplying a plurality of voltages Vx11–Vx16. In contrast, in the D/A converter 5400 shown in FIG. 35, a plurality of conversion pulse lines 5410–5415 and one conversion selection line 5420 are used to supply a plurality of voltages.

The circuit shown in FIG. 35 is described in brief below. AND operations with respect to the signals from the second-stage latches B11–B16 with the corresponding conversion pulses XP1–XP6 supplied via the conversion pulse lines 5410–5415 are performed. The resultant signals are applied to analog switches Ta11–Ta16. In accordance with these signals, the analog switches Ta11–Ta16 control the connections between the conversion selection line 5420 and the corresponding conversion capacitors Cx11–Cx16.

AND operation is performed between the inverted values of the signals from the latches B11–B16 and the corresponding conversion pulses XP1–XP6. Analog switches Tb11–Tb16 are turned on or off depending on the corresponding results of the above AND operation.

Figure 36:
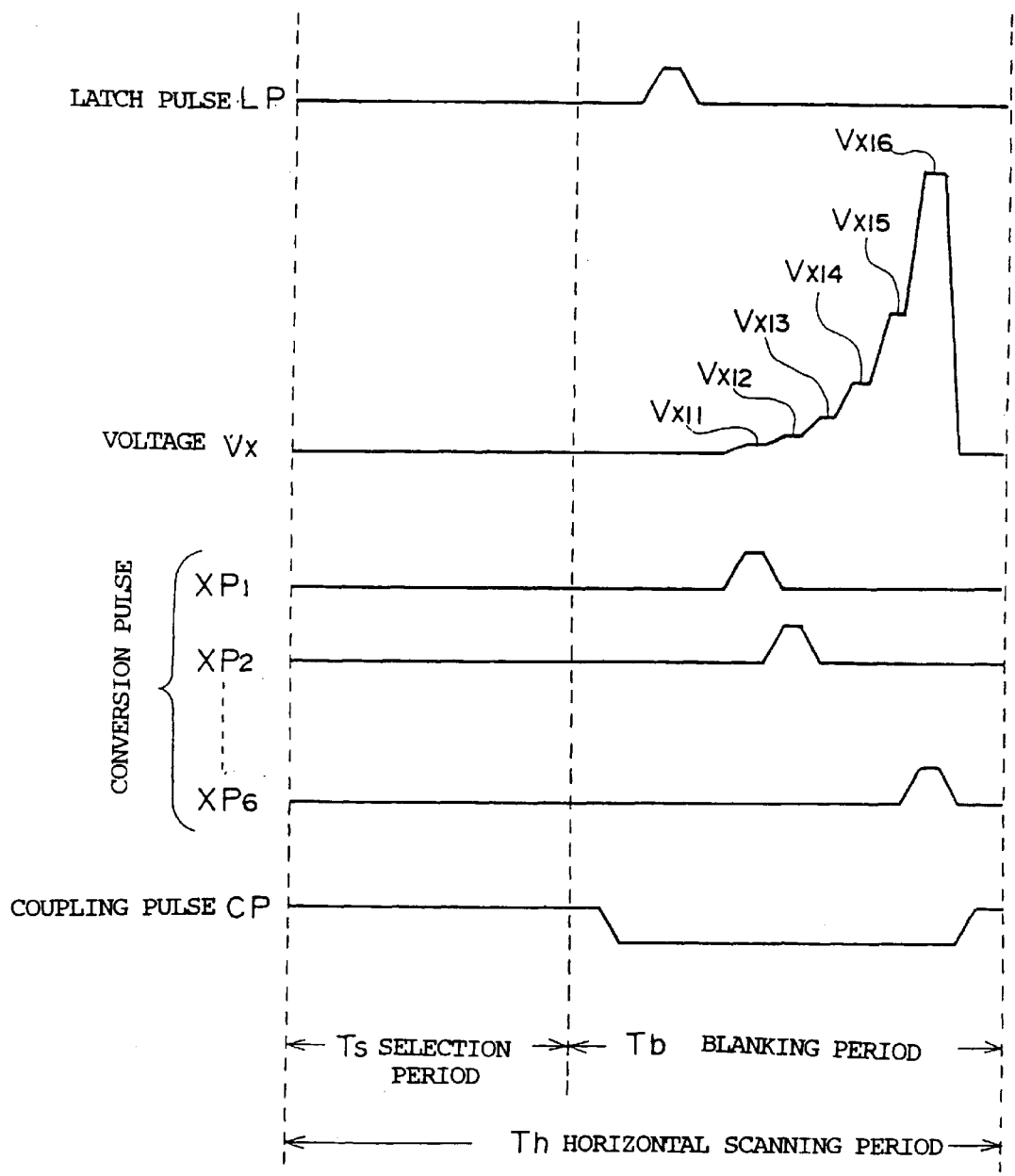
FIG. 36 is a diagram illustrating a method of driving a liquid crystal display device using the D/A converter shown in FIG. 35.

FIG. 36 illustrates the operation of driving a liquid crystal display device using the above D/A converter 5400. Digital signals D11–D16 and a sampling pulse SR similar to those employed in the fourth embodiment are input. A voltage Vx is applied along the conversion selection line 5420 wherein the voltage Vx varies with time during each blanking period. Conversion pulses XP1–XP6 are applied along the corresponding conversion pulse lines 5410–5415.

Referring to FIGS. 35 and 36, the operation of driving the liquid crystal display device according to the present embodiment will be described in further detail below. As shown in these figures, the conversion pulses XP1–XP6 are input in synchronization with the change in the voltage Vx so that desired voltages Vx11–Vx16 are selected. The analog switches Ta11–Ta16 are turned on in accordance with the digital input signals D11–D16 so that the selected voltages of Vx11–Vx16 are supplied to the corresponding conversion capacitors Cx11–Cx16 thereby charging these capacitors. On the other hand, the voltage Vcom is supplied to those of the conversion capacitors Cx11–Cx16 corresponding to those of the analog switches Tb11–Tb16 which are in an on-state. No charge is stored in these conversion capacitors. Thus, an output voltage set to a particular value is output.

Thus, the present embodiment has similar features and advantages to those of the fourth embodiment.

The present embodiment may be modified such that the conversion selection voltages applied along the respective conversion selection lines vary with time.

(Seventh Embodiment)

Figure 37:
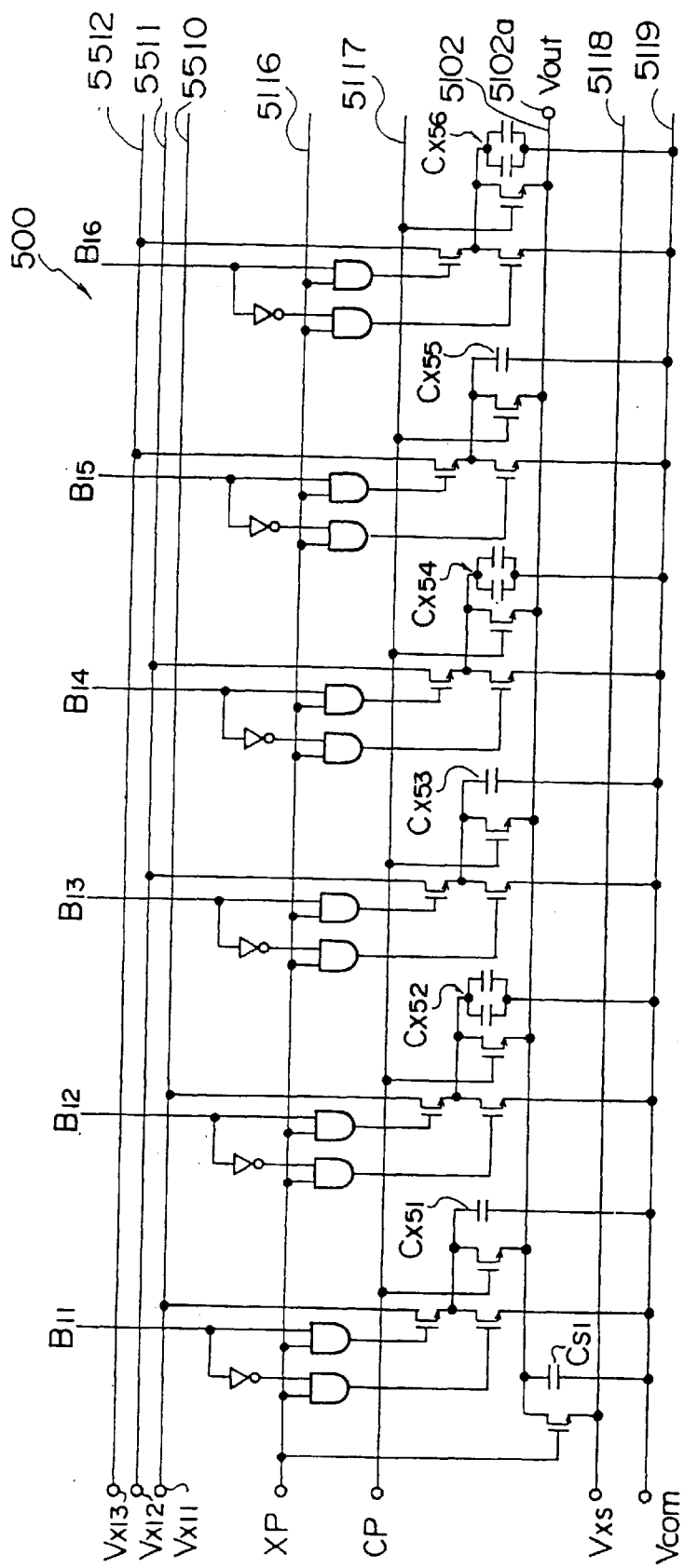
FIG. 37 is a circuit diagram illustrating a D/A converter according to a seventh embodiment of the invention.

FIG. 37 illustrates a D/A converter 5500 according to the seventh embodiment of the invention. This D/A converter 5500 may also be employed, instead of the D/A converter 5100, in the driving circuit 5050 shown in FIG. 27 used to drive a liquid crystal display device. Using this driving circuit 5050 with the D/A converter 5500, the liquid crystal display device may be driven in a similar manner to the fourth embodiment described above. Similar parts to those of the fourth embodiment are denoted by similar reference numerals, and they are not described in further detail here.

In this seventh embodiment, an analog output voltage having a desired value is obtained by properly selecting a plurality of voltages applied across a plurality of capacitors having different capacitance values. As shown in FIG. 37, there are provided three conversion selection lines 5510–5512. The conversion capacitances Cx51–Cx56 are set such that their ratios are given by Cx51: Cx52: Cx53: Cx54: Cx55: Cx56=1:2:1:2:1:2

FIG. 38 illustrates specific values employed in this seventh embodiment for the conversion capacitances Cx51–Cx56, the reference capacitance Cs1, the voltages Vx11–Vx13, and the voltage Vxs wherein the voltage Vx11 is applied across the conversion capacitors Cx51 and Cx52, the voltage Vx12 across the conversion capacitors Cx53 and Cx54, and the voltage Vx13 across the conversion capacitors Cx55 and Cx56.

Thus, the present embodiment has similar features and advantages to those of the fourth embodiment.

(Eighth Embodiment)

Figure 39:
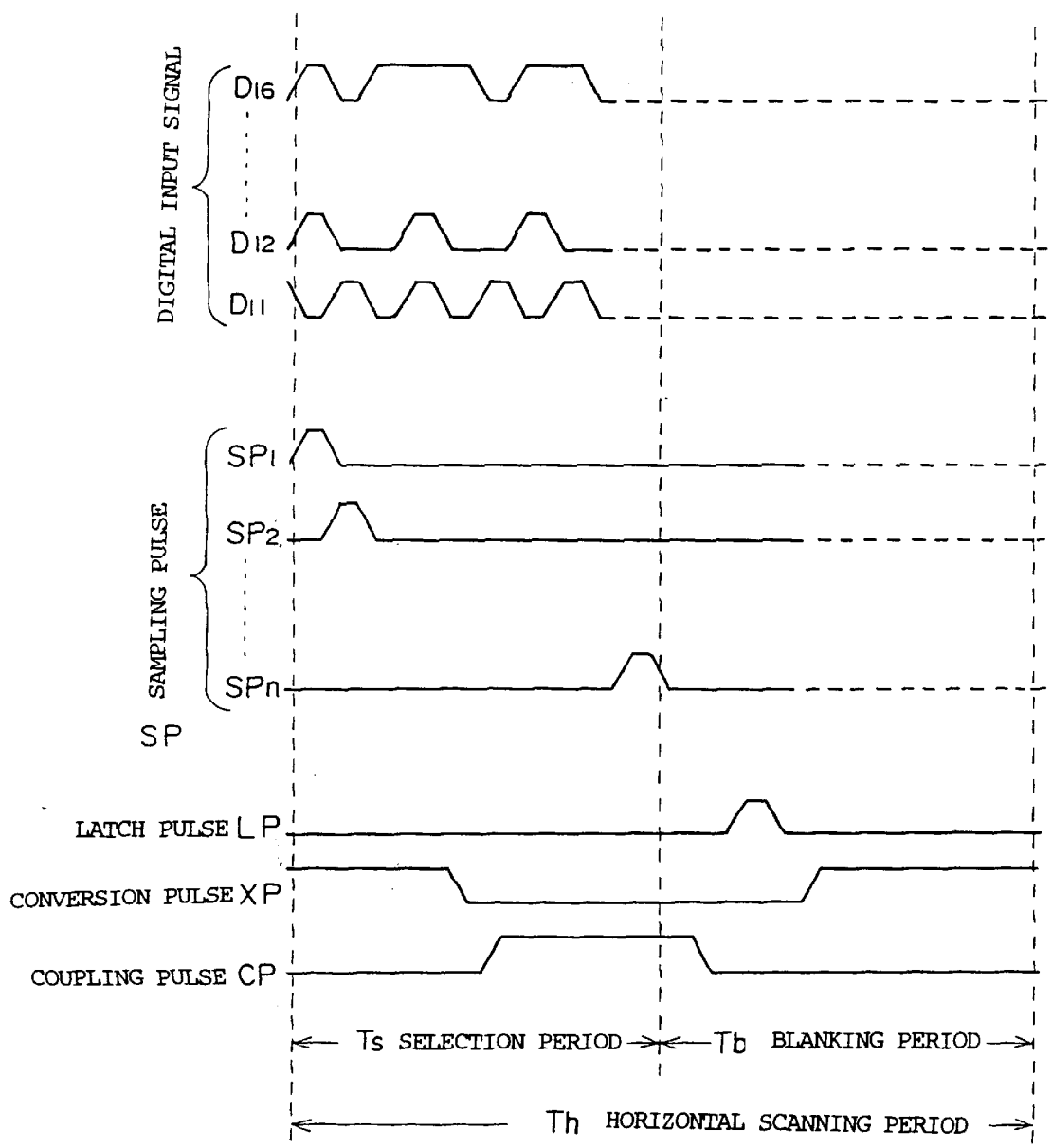
FIG. 39 is a diagram illustrating a method of driving a liquid crystal display device, according to an eighth embodiment of the invention.

FIG. 39 illustrates the operation of driving a liquid crystal display device according to an eighth embodiment. In this eighth embodiment, a driving circuit including a D/A converter similar to that employed in the fourth or fifth embodiment is used to drive a liquid crystal display device.

In the driving method shown in FIG. 30, digital signals D11–D16 and a sampling pulse SP are input during a selection period Ts. After completion of inputting these signals, the operation enters a blanking period. During the blanking period, the latch pulse LP changes from an off-level to an on-level, and then returns to the off-level. Then the conversion pulse XP changes from an off-level to an on-level, and then returns to the off-level. Furthermore, the coupling pulse CP changes from an off-level to an on-level, and then returns to the off-level.

In this method, the following conditions should be met. The latch pulse LP should be input after the completion of the input of the digital signals D11–D16 and the sampling pulse SP. The conversion pulse XP should be input after the completion of the input of the latch pulse LP. The coupling pulse CP should be input after the completion of the conversion pulse XP.

As long as the above conditions are met, the on/off transitions of the conversion pulse XP and of the coupling pulse CP may be performed either during the selection period Ts or during the blanking period Tb. Furthermore, the period of time in which the latch pulse LP is input may have an overlap with the period of time in which the coupling pulse CP is input.

In view of the above, it is desirable that the length of the on-period of the conversion pulse XP and the length of the on-period of the coupling pulse CP should be optimized so that the conversion capacitors Cx11–Cx16 and the reference capacitor Cs1 are sufficiently charged and the charges stored in the conversion capacitors Cx11–Cx16 are transferred to the reference capacitor Cs1 to a sufficient degree.

In particular, when the blanking period Tb is short compared to the selection period Ts, if the on-period of the conversion pulse XP ends during the blanking period Tb, there is a possibility that the charging of the conversion capacitors Cx11–Cx16 and the reference capacitor Cx1 is insufficient.

In the present embodiment, to avoid the above problem, the on-period of the conversion pulse XP is completed during the selection period Ts so that the charging is performed to a sufficient degree.

Thus, the present embodiment has particular advantages while achieving similar functions to those of the fourth embodiment.

The technique of the present embodiment may be employed not only in the case where the voltages Vx11–Vx16 are given via a plurality of conversion selection lines or dividing resistors but also in the case where a time-varying voltage is given along one conversion selection line.

(Ninth Embodiment)

Figure 40:
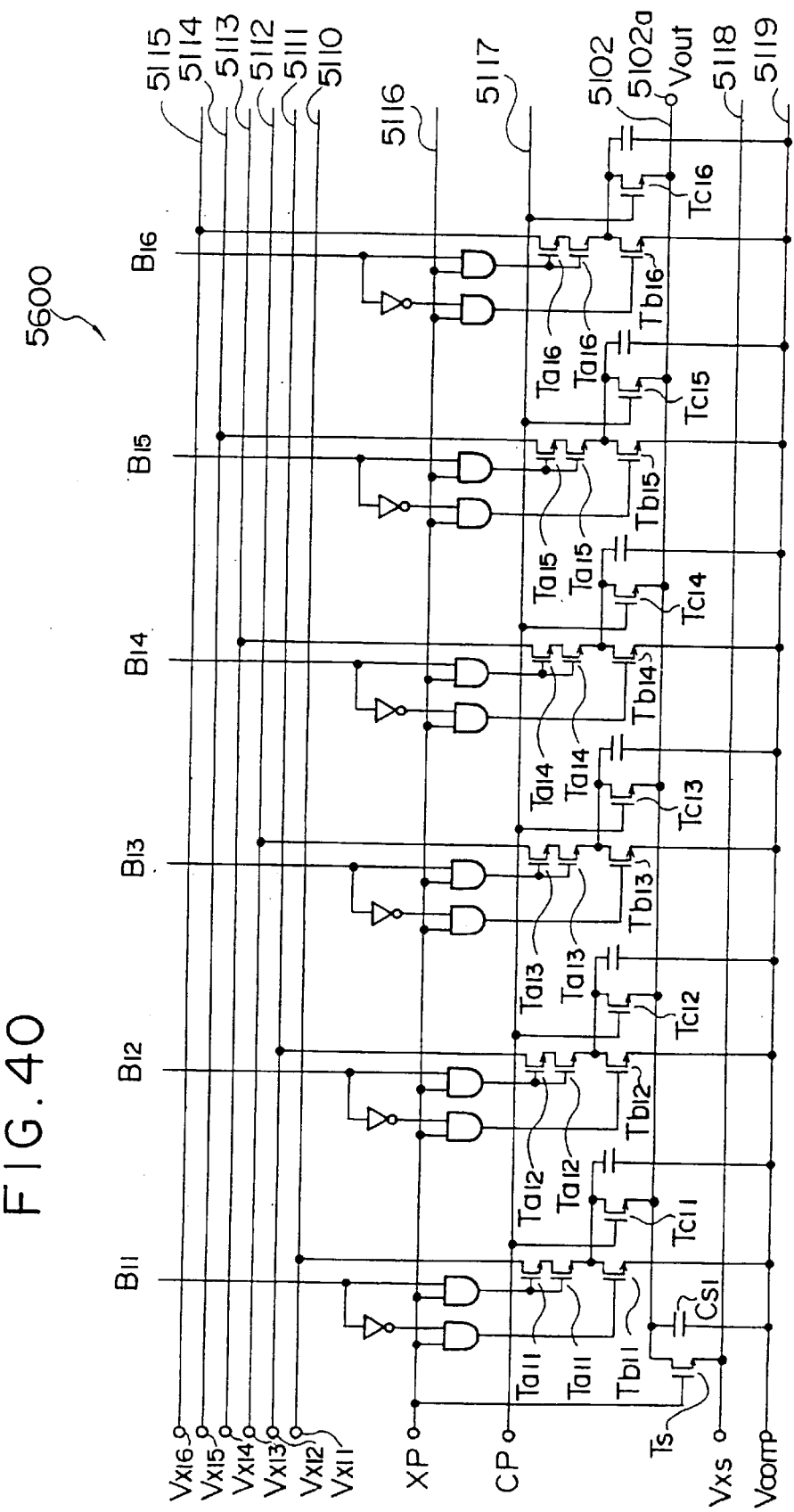
FIG. 40 is a circuit diagram illustrating a D/A converter according to a ninth embodiment of the invention.

FIG. 40 illustrates a D/A converter 5600 according to a ninth embodiment of the invention. This D/A converter 5600 may also be employed, instead of the D/A converter 5100, in the driving circuit 5050 shown in FIG. 27 used to drive a liquid crystal display device. Using this driving circuit 5050 with the D/A converter 5600, the liquid crystal display device may be driven in a similar manner to the fourth embodiment described above. Similar parts to those of the fourth embodiment are denoted by similar reference numerals, and they are not described in further detail here.

Thin film transistors generally have a rather large leakage current in an off-state. This is particularly true for polysilicon thin-film transistors produced by low-temperature processes. In the present embodiment, to avoid the above problem, each analog switches Ta11–Ta16 is replaced by a pair of thin film transistors connected in series. This circuit configuration results in a reduction in the leakage current in the off-state. Furthermore, even if sudden degradation of the off-characteristic occurs in one of two thin film transistors in some pair, fatal failure is avoided by the other thin film transistor of the pair.

Thus, the present embodiment has particular advantages while achieving similar functions to those of the fourth embodiment.

The present embodiment may be modified such that each transistor of the analog switches Tb11–Tb16, Tc11–Tc16, Ts /or each transistor used in the shift register 5020, the latches A11–A16 and B11–B16 shown in FIG. 27 is replaced by two thin film transistors connected in series. Alternatively, each transistor may be replaced by three thin film transistors connected in series.

(Tenth Embodiment)

Figure 41:
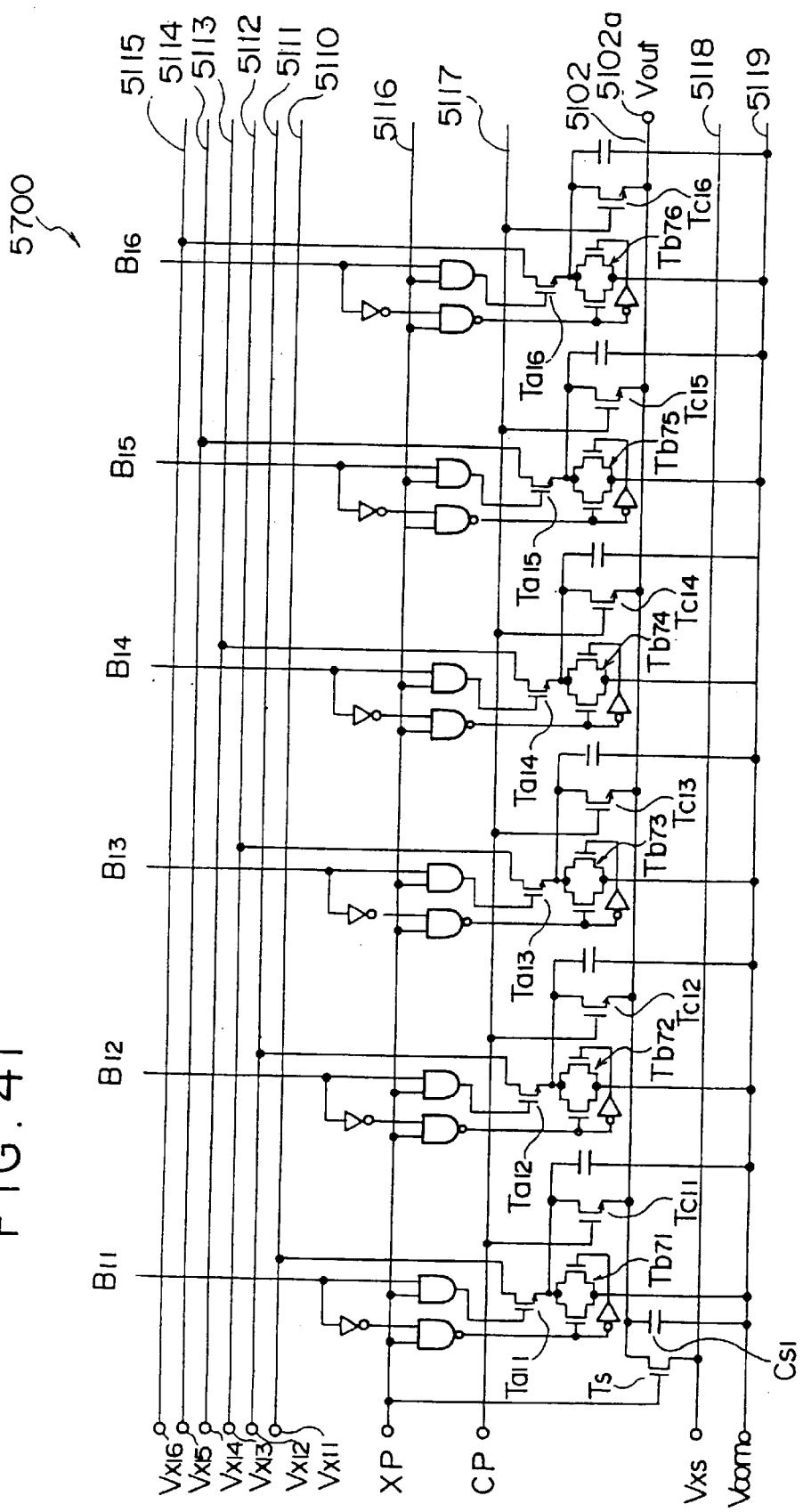
FIG. 41 is a circuit diagram illustrating a D/A converter according to a tenth embodiment of the invention.

FIG. 41 illustrates a D/A converter 5700 according to a tenth embodiment of the invention. This D/A converter 5700 may also be employed, instead of the D/A converter 5100, in the driving circuit 5050 shown in FIG. 27 used to drive a liquid crystal display device. Using this driving circuit 5050 with the D/A converter 5400, the liquid crystal display device may be driven in a similar manner to the fourth embodiment described above. Similar parts to those of the fourth embodiment are denoted by similar reference numerals, and they are not described in further detail here.

Thin film transistors generally have problems of a high threshold voltage and a low capacity of supplying a charging current in an on-state. This is particularly true for polysilicon thin-film MOS transistors produced by low-temperature processes. In the case of n-channel transistors, the transistors are turned on by applying a positive voltage to their gate electrode. If the source or drain electrode is at a high voltage, the voltage difference between the gate and the source or drain electrode becomes small, which results in a reduction in the operating speed. In the case of p-channel transistors, on the other hand, the transistors are turned on by applying a negative voltage to their gate electrode. If the source or drain electrode is at a low voltage, the voltage difference between the gate and the source or drain electrode becomes small, which results in a reduction in the operating speed.

In this tenth embodiment, to avoid the above problem, the analog switches Tb71–76 are each realized using a CMOS configuration consisting of an n-channel transistor and a p-channel transistor connected in parallel. This makes it possible to achieve a good charging characteristic regardless of the voltage of the source or drain electrode.

Thus, the present embodiment has particular advantages while achieving similar functions to those of the fourth embodiment.

The CMOS configuration may also be employed in any of the analog switches Ta11–Ta16, Tc11–Tc16, and Ts, or the shift register 5020, the latches A11–A16 and B11–B16.

(Eleventh Embodiment)

Figures 42A, 42B:
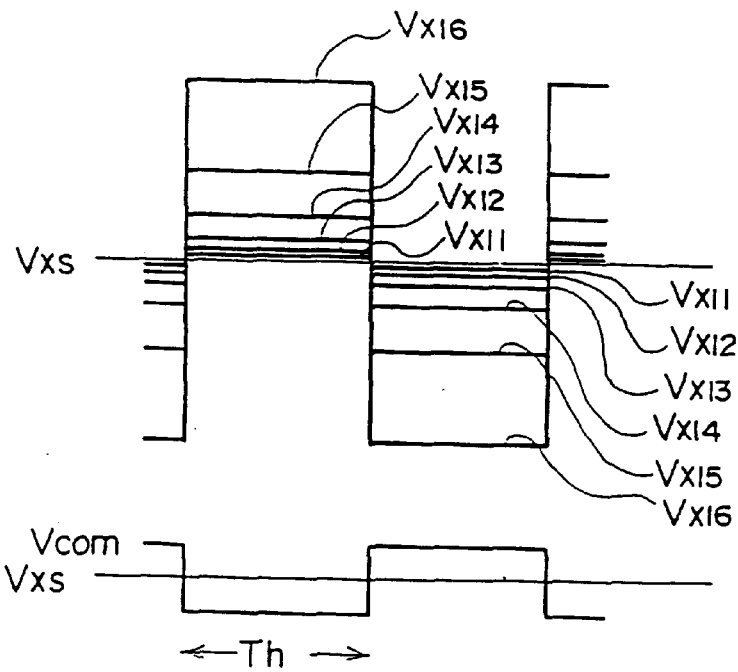
FIGS. 42A and 42B are diagrams illustrating a method of driving a liquid crystal display device, according to an eleventh embodiment of the invention.

FIGS. 42A and 42B illustrate the method of driving a liquid crystal display device according to an eleventh embodiment. In this eleventh embodiment, a driving circuit including a D/A converter similar to that employed in the fourth embodiment is used to drive a liquid crystal display device.

FIG. 42A illustrates the method of applying voltages Vx11–Vx16, Vxs, and Vcom, wherein the specific values of these voltages are shown in FIG. 42B. The conversion capacitors Cx11–Cx16 are all set to 1.0 pF while the reference capacitor Cs1 is set to 2.0 pF.

In this embodiment, the voltages Vx11–Vx16 and also the voltage Vxs are periodically inverted in polarity every frame and also every horizontal scanning line. However, inversion is not performed every signal line. The voltage Vcom is also inverted in synchronization with the voltages Vx11–Vx16 and Vxs wherein the inversion is performed so that the voltage Vcom always has a polarity opposite to the polarity of the voltages Vx11–Vx16 and Vxs.

The feature of the present embodiment is that the voltage Vcom, which is applied to one of electrodes between which a liquid crystal is disposed, is periodically inverted in polarity. An analog output voltage Vout from the output terminal 5102a (FIG. 26) is applied to the other electrode. The inversion in the polarity of the voltage Vcom creates a voltage difference between the two electrodes. This voltage difference serves as a part of the voltage used to drive the liquid crystal. Thus, when a bias voltage is needed in the operation, the analog output voltage Vout is allowed to be small when the digital input signal is equal to 0. That is, it is possible to reduce the voltage applied to the reference capacitor Cs1.

In this embodiment, the amplitude of the voltage Vcom is 1 V for each polarity, and the voltage Vxs is fixed to 0 V.

Although the amplitude of the voltage Vcom can be set to a greater value while maintaining the same D/A conversion characteristic, it is required to periodically invert the voltage Vxs in polarity. In this case, the voltage Vxs should be inverted into a polarity opposite to the polarity of the voltages Vx11–Vx16. Furthermore, the power supply voltage and other voltage levels may be reduced by properly adjusting the amplitudes of the voltage Vcom and Vxs.

Thus, the present embodiment has particular advantages while achieving similar functions to those of the fourth embodiment.

(Twelfth Embodiment)

FIG. 43 illustrates the method of driving a liquid crystal display device according to a twelfth embodiment. In this twelfth embodiment, a driving circuit including a D/A converter similar to that employed in the fourth embodiment is used to drive a liquid crystal display device.

Figures 43A, 43B:
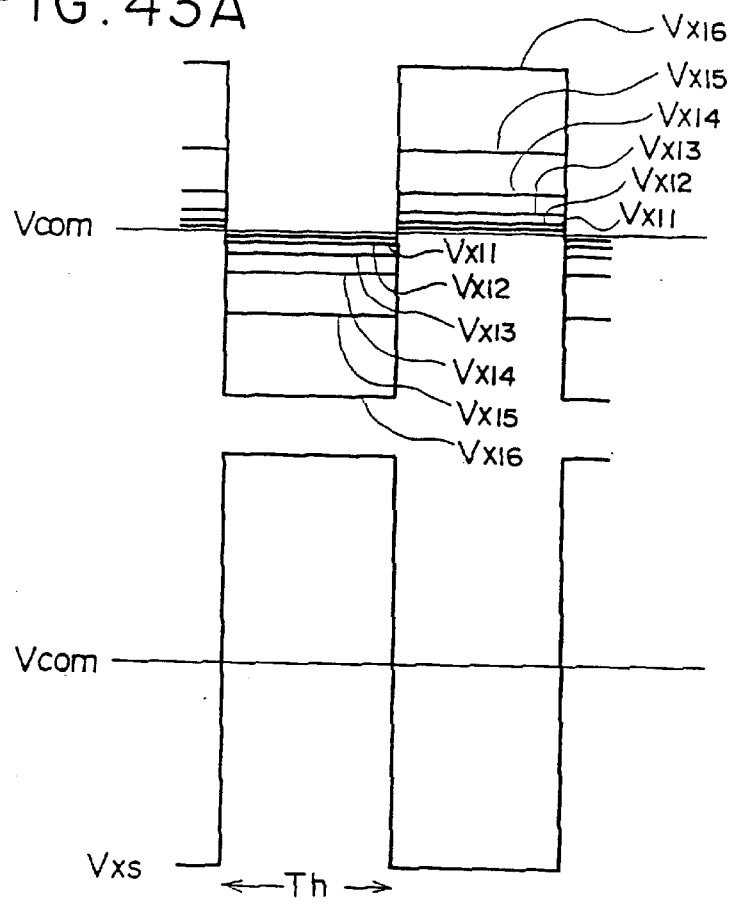
FIGS. 43A and 43B are diagrams illustrating a method of driving a liquid crystal display device, according to a twelfth embodiment of the invention.

FIG. 43A illustrates the method of applying voltages Vx11–Vx16, Vxs, and Vcom, wherein the specific values of these voltages are shown in FIG. 43B. In this embodiment, the voltages Vx11–Vx16 and also the voltage Vxs are periodically inverted in polarity every frame and also every horizontal scanning line. However, inversion is not performed every signal line. The voltage Vcom is set to a fixed voltage.

The feature of the present embodiment is that the voltages Vx11–Vx16 and Vxs are periodically inverted in polarity in such a manner that the voltages Vx11–Vx16 have a polarity opposite to that of the voltage Vxs. Therefore, in the D/A converter 5100 shown in FIG. 26, the reference capacitor Cs1 is charged into a polarity opposite to that into which the conversion capacitors Cx11–Cx16 are charged. When the charge stored in the reference capacitor Cs1 is mixed with the charges stored in the conversion capacitors Cx11–Cx16, a cancellation occurs among the charges and the net charge is reduced. Therefore, in this embodiment, unlike the previous embodiments in which addition type D/A converters are realized, a subtraction type D/A converter is realized.

Figure 44:
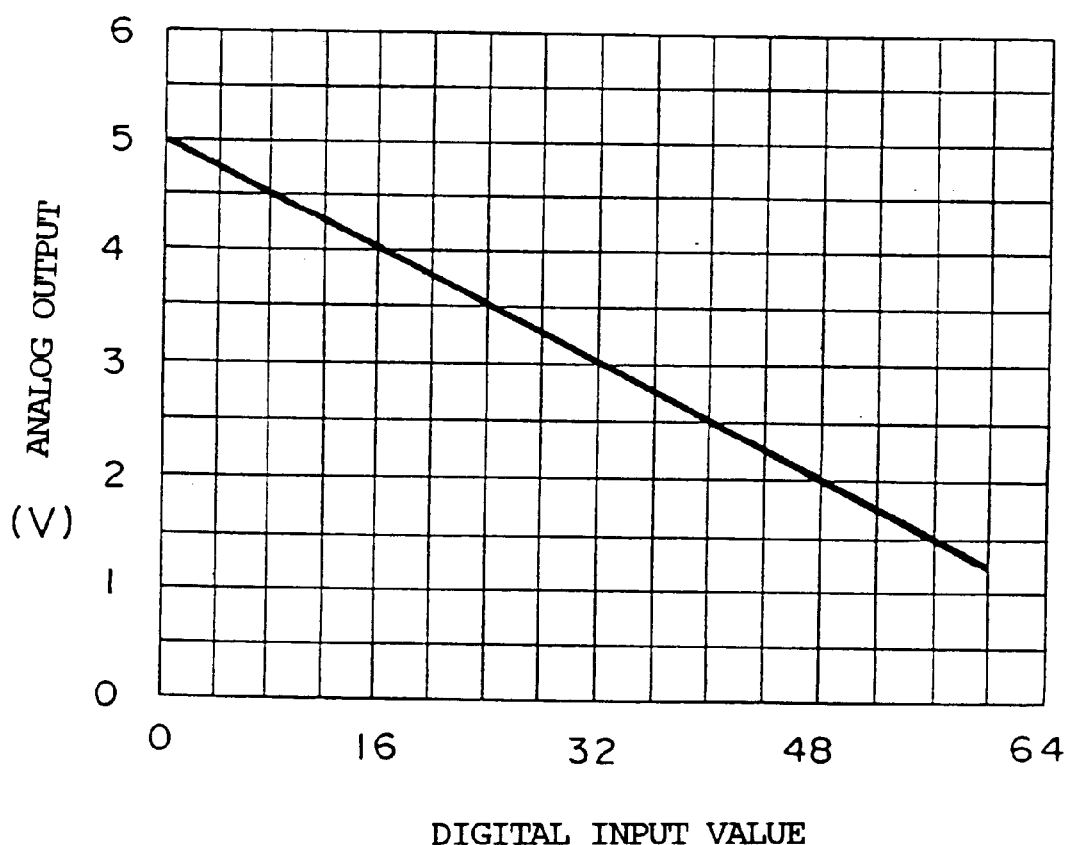
FIG. 44 is a graph illustrating the D/A conversion characteristic of the D/A converter according to the twelfth embodiment of the invention.

FIG. 44 illustrates the D/A conversion characteristic obtained in the present embodiment. Since the D/A converter of the present embodiment is of the subtraction type, the D/A conversion characteristic has an opposite slope to that of the characteristic shown in FIG. 29. As can be seen from FIG. 44, excellent linearity is achieved over the whole range of the output voltage from 1 V to 5 V corresponding to the full range of the digital input values (0 to 63).

Thus, the present embodiment has similar features and advantages to those of the fourth embodiment.

Furthermore, in this embodiment, the power supply voltage and the number of voltage levels may be reduced by properly adjusting the amplitudes of the voltage Vcom and Vxs, as will be described below with reference to a particular example in conjunction with FIGS. 45A and 45B.

Figures 45A, 45B:
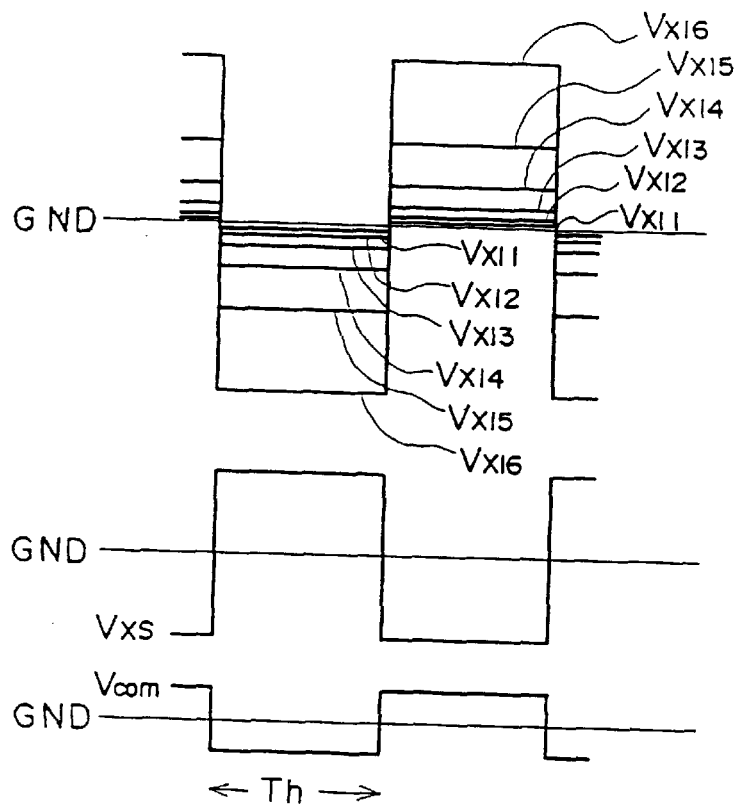
FIGS. 45A and 45B are diagrams illustrating a modification of the driving method according to the twelfth embodiment of the invention.

FIG. 45A illustrates the voltages Vx11–Vx16, Vxs, and Vcom applied according to a modified method of the twelfth embodiment, wherein the specific values of these voltages are shown in FIG. 45B. As shown in these figures, the voltage Vcom is also inverted in synchronization with the voltages Vx11–Vx16 and Vxs wherein the inversion of the voltage Vcom is performed into a polarity opposite to that in which the voltages Vx11–Vx16 and Vxs are inverted.

Thus in this modified embodiment, as in the eleventh embodiment described above, the voltage Vcom is applied to one of electrodes between which a liquid crystal is disposed. This voltage serves as a part of the voltage used to drive the liquid crystal. Therefore, in this modified embodiment, since the voltage Vcom applied to the one electrode is periodically inverted in polarity, the voltage Vxs applied to the other electrode is allowed to be small. For example, the voltage Vcom may be set to 3 V in amplitude and the voltage Vxs may be set to 8 V in amplitude with an opposite polarity. These values are extremely small compared with those shown in FIG. 43, and these small values can make a great contribution to the reduction in power consumption.

The present invention may be applied not only to display devices of the direct view type but also to those of the projection type.

Furthermore, the D/A converter according to the present invention may also be applied to other liquid crystal optical devices such as a light shutter.

(Thirteenth Embodiment)

Figure 46A:
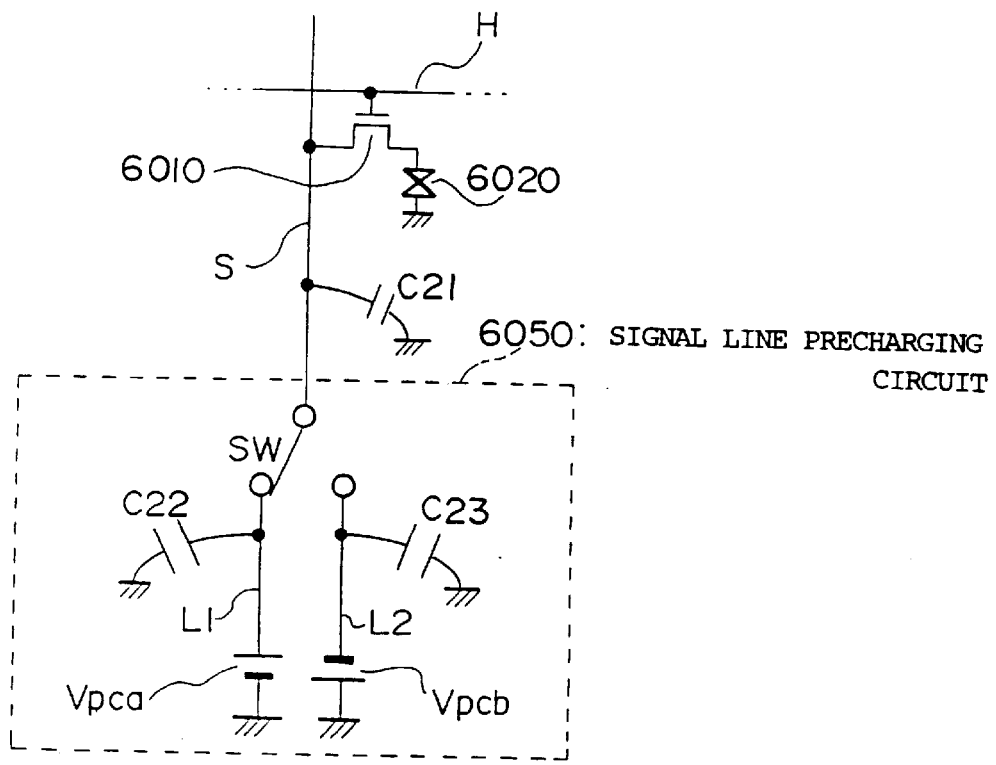
FIG. 46A is a diagram illustrating the principle of a method of precharging signal lines according to the present invention.
Figure 46B:
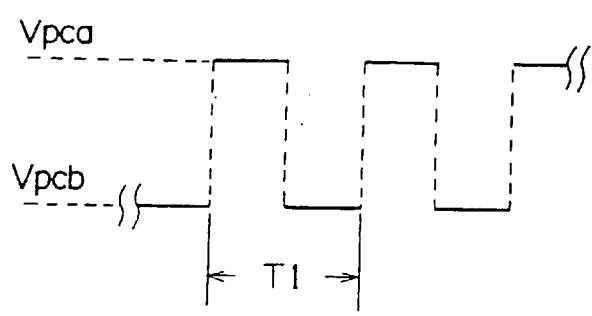
FIG. 46B is a diagram illustrating the variation in the voltage on a signal line caused by the precharging.
Figure 46C:
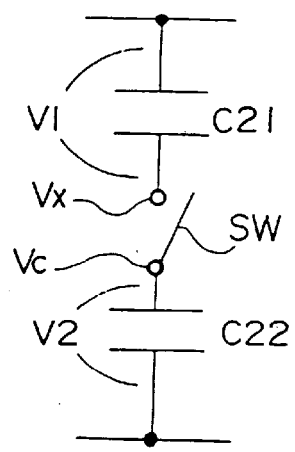
FIG. 46C is a diagram illustrating an advantage of the precharging method according to the present invention.

FIGS. 46A–46C illustrate the method of precharging signal lines according to a thirteenth embodiment of the invention.

In FIG. 46A, reference numeral 6010 denotes a TFT (switching element) connected to a signal line (S) and a scanning line (H), and reference numeral 6020 denotes a liquid crystal. An image signal is applied to the liquid crystal 6020 via the signal line (S) so that a corresponding image is displayed by the liquid crystal 6020. To prevent the liquid crystal from degradation, or to improve the display characteristics, the polarity of the image signal is periodically inverted.

In the case of liquid crystal display panels of the active matrix type, the "polarity of the image signal" refers to a polarity relative to the center of the amplitude of the image signal. Hereinafter, the term "polarity of the image signal" is used to describe such a polarity.

Figures 47A, 47B:
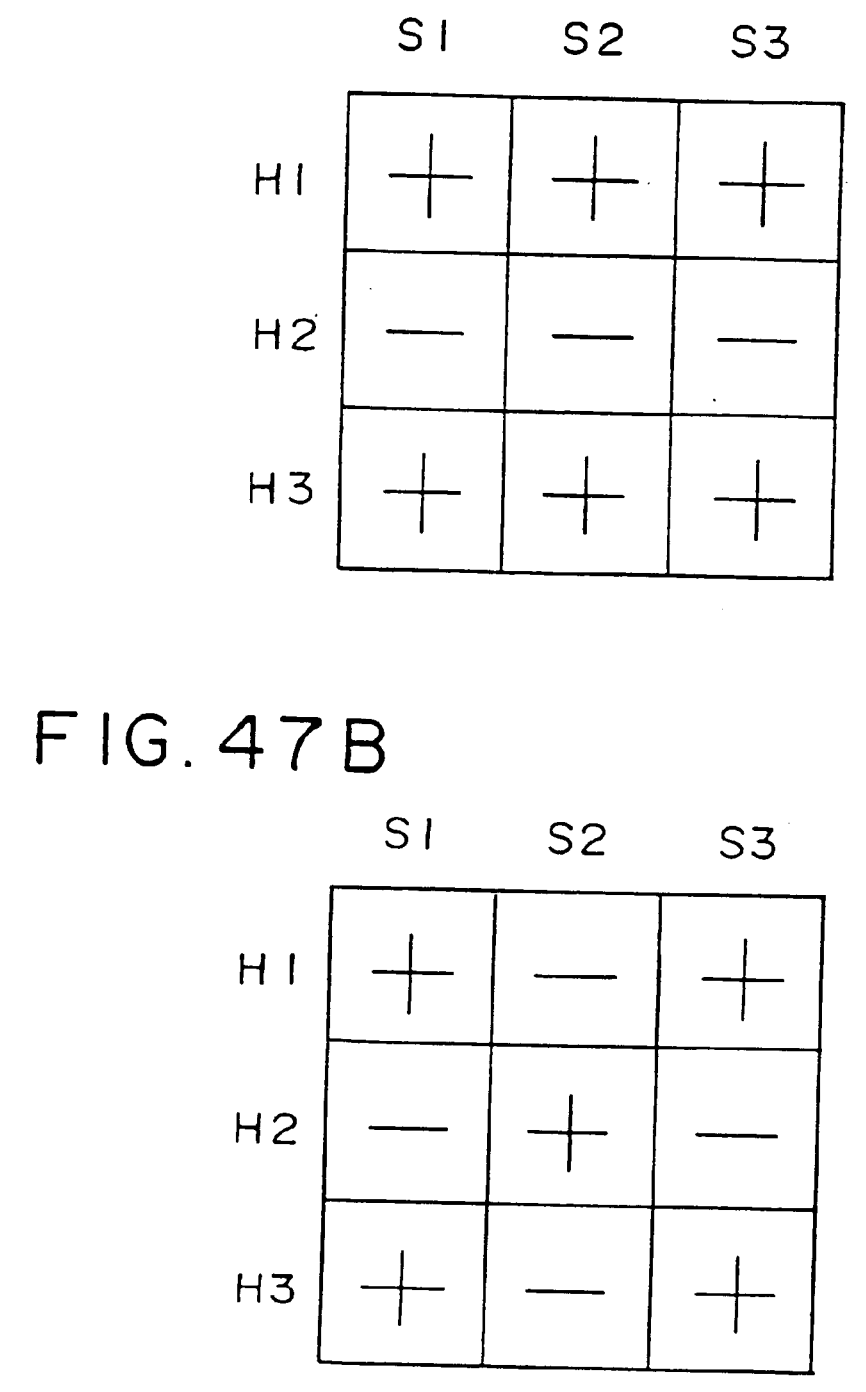

The inversion of the polarity of the image signal may be performed for example as shown in FIG. 47A or 47B. In FIGS. 47A and 47B, the driving polarity is shown for nine liquid crystals which can be specified by the signal lines (S1–S3) and the scanning lines (H1–H3) wherein "+" denotes a positive polarity and "–" denotes a negative polarity. In the example shown in FIG. 47A, the driving polarity is inverted from one scanning line to another. This driving method is herein referred to as the "inversion every scanning line". In the example shown in FIG. 47B, the polarity is also inverted from one signal line to another in addition to the inversion every scanning line. In this description, this driving method is referred to as the "driving with inversion every signal line".

The precharging of the signal lines are performed immediately before supplying an image signal. The polarity of the precharging should be periodically inverted in accordance with the polarity in which the liquid crystal is driven in an inverting fashion as shown in FIG. 47A or 47B.

In this embodiment, there are provided a twelfth precharging voltage (high level voltage) Vpca and a second precharging voltage (low level voltage) Vpcb and the connection is properly switched between these two voltage levels via a switch (SW) so that the signal line (S) is precharged in an inverting fashion in accordance with the polarity of the image signal. Thus, the voltage on the signal line (S) periodically varies as shown in FIG. 46B (with a period of T1).

It is desirable that the stray capacitances (equivalent capacitances) C22 and C23 associated with the precharging lines L1 and L2 be sufficiently greater than the stray capacitance (equivalent capacitance) C21 associated with the signal line (S). More preferably, C22 and C23 should be so great that C21 can be neglected.

Figure 48:
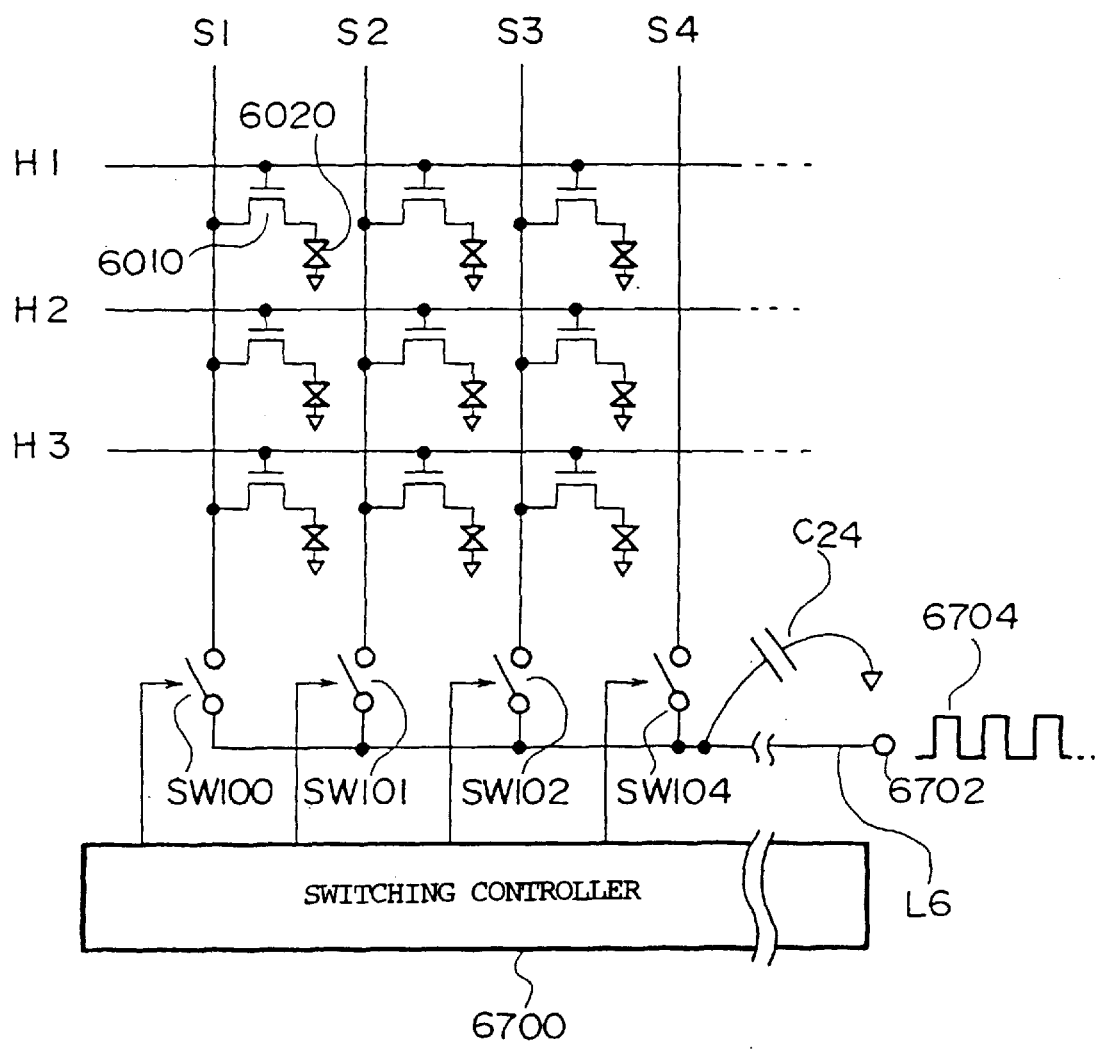
FIG. 48 is a circuit diagram illustrating a major portion of a comparative example of a liquid crystal display device wherein the diagram is provided to illustrate the advantage of the precharging method according to the present invention.

The advantages of the precharging technique according to the present embodiment will become more apparent when the present embodiment is compared with a comparative configuration shown in FIG. 48.

The liquid crystal display device shown as a comparative example in FIG. 48 is disclosed for example in Japanese Unexamined Patent Publication No. 7-295521. In this circuit configuration, as shown in the figure, a precharging signal (periodically varying pulse signal) 6704 is input via a terminal 6702 and is supplied to signal lines S1–S4 via a line L6 and switches (SW100–SW104) thereby precharging these signal lines S1–S4. In FIG. 48, reference numeral 6700 denotes a switch controller.

The comparative circuit configuration has the following disadvantages.

(1) It is required to charge and discharge the line L6 used to transmit the precharging signal 6704. This causes an increase in power dissipation in particular when the precharging is performed at a high speed.

(2) With the increase in the size of the liquid crystal panel, the length of the line L6 increases, which in turn results in an increase in the stray capacitance C24. As a result, the time constant associated with the line L6 increases and thus the waveform of the precharging pulse becomes dull. This causes degradation in the precharging accuracy (and thus a gradual change in brightness occurs). Furthermore, with the increase in the resolution of the image to be displayed, it is required to increase the frequency at which the line L6 is driven and thus the driving circuit should have a high driving capability.

(3) Since there is only one line L6, if the driving is performed sequentially line by line and the polarity is periodically inverted every signal line, the precharging is impossible.

In contrast, the precharging method according to the present embodiment of the invention is novel in that a plurality of DC voltages having different values are prepared and signal lines are connected via switches to desired one of DC voltages corresponding to the polarity into which the liquid crystal is driven during the periodically-inverting driving operation.

This precharging technique has the following advantages.

(1) The precharging can be performed by charging or discharging only the signal lines (or the capacitor C21 in the specific example shown in FIG. 46A). This makes it possible to perform the precharging operation at a higher speed without having to make a significant increase in the power consumption.

(2) No degradation occurs in the sharpness of the precharging signal unlike the comparative example described above in which the precharging signal loses its sharpness during its travel along a line toward a final signal line to be precharged. Therefore, a precise voltage can be applied to the signal line and thus a high precharging accuracy (stability) can be achieved. In the case where the stray capacitances (equivalent capacitances) C22 and C23 associated with the precharging lines L1 and L2 are sufficiently large compared with the stray capacitance (equivalent capacitance) C21 associated with the signal line (S), a very high accuracy can be obtained in the precharging operation. Furthermore, since no degradation occurs in the sharpness of the precharging signal due to the line capacitance, the precharging operation can be performed at a higher speed.

(3) The precharging technique of the present embodiment can be applied to a wide variety of inverting driving systems by properly controlling switches.

Referring to FIG. 46C, the advantage of the present embodiment mentioned in (2) will be described in further detail below. In the present embodiment, the signal line is precharged by the movement of the charges between the stray capacitance C21 of the signal line (S) and the stray capacitance (C22 or C23) of the precharging line L1 or L2.

If it is assumed here that the capacitance C21 has a charge QA corresponding to a voltage V1 and the capacitance C22 has a charge QB corresponding to a voltage V2 as shown in FIG. 46C, then the charge QA stored in the capacitor C21 is given by QA=C21·V1 and the charge QB stored in the capacitor C22 is given by QB=C22·V2. Herein, the capacitance values of the capacitors C21 and C22 are also denoted by "C21" and "C22", respectively. The voltage at the terminal on the switch side of the capacitor C21 is denoted by VX, and the voltage at the terminal on the switch side of the capacitor C22 is denoted by VC (equal to the precharging voltage).

If the switch SW is closed, a movement of charge occurs and the voltage V on the terminal of the capacitor C21 connected to the switch SW changes (the voltage V corresponds to the signal line voltage). As a result of the movement of charge, the charge stored in the capacitor C21 becomes QA' and the charge stored in the capacitor C22 becomes QB'.

The total charge remains unchanged even after the switch SW is closed, and thus QA+QB=QA'+QB'. From the above equations, the voltage V at the terminal on the switch side of the capacitor C21 can be given by $$V=(C21 VX+C22 VC)/(C21+C22) \quad (1)$$

Herein if the capacitance value "C22" of the capacitor C22 is sufficiently great compared to the capacitance value "C21" of the capacitor C21, and thus the capacitance C21 can be neglected, then equation (1) can be approximated by V=VC. This means that the signal line is precharged to a voltage (V) nearly equal to the precharging voltage Vc (=Vpca, Vpcb).

As can be seen from the above description, the precharging method according to the present embodiment of the invention makes it possible to precisely precharge the signal line to a desired voltage. Although the precharging line generally has a large capacitance, the capacitance can be further increased by adding a capacitance formed of the gate oxide film of the TFT 10 in parallel to the precharging line L1 or L2.

(Fourteenth Embodiment)

Figures 49A, 49B:
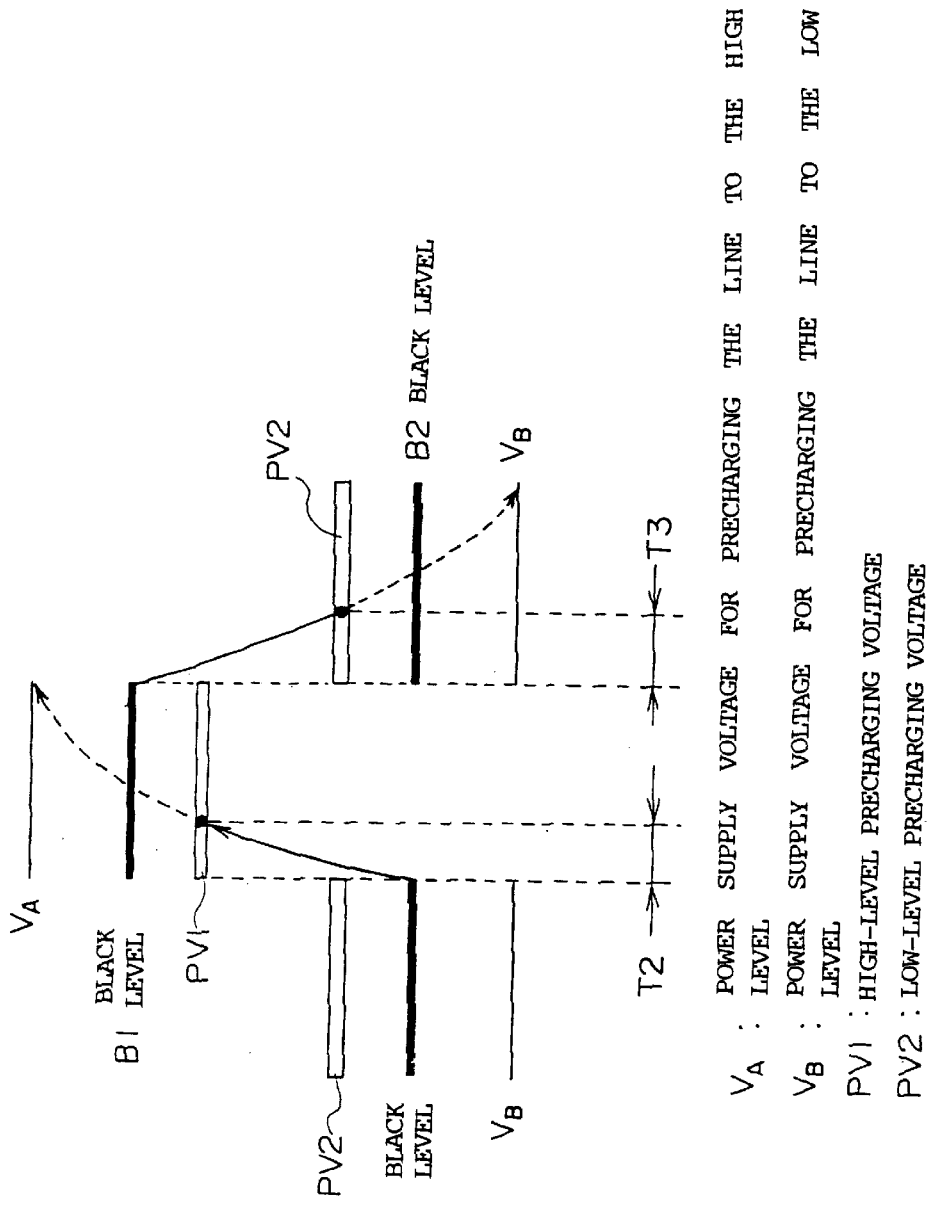
FIGS. 49A and 49B are diagrams illustrating the features of another example of the method of precharging signal lines according to the present invention.
Figure 50:
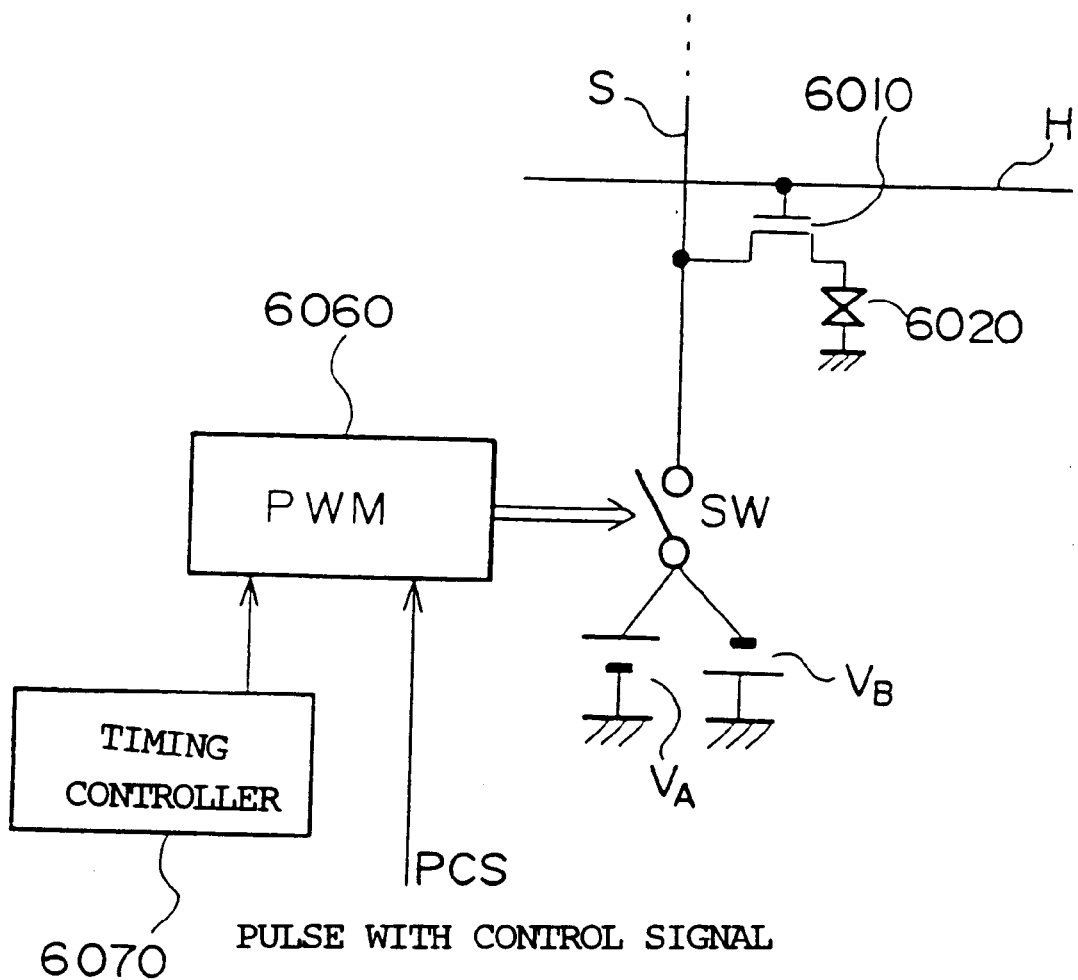
FIG. 50 is a diagram illustrating an example of a circuit implementing the precharging method shown in FIG. 49.

The method of precharging a signal line according to a fourteenth embodiment of the invention is shown in FIGS. 49B and 50.

The precharging operation of the present embodiment is basically the same as that shown in FIGS. 46A–46C except that voltages VA and VB used to precharge the signal line are prepared such that the voltages VA and VB have values higher than the precharging voltages PV1 and PV2 to which the signal line is to be actually precharged, and the signal line is precharged to a desired voltage by controlling the connection time in which the signal line is connected to the precharging line thereby controlling the amount of charge moved (wherein the integral of the charge=current).

In the present embodiment, as shown in FIG. 50, the connection time in which the signal line (S) is connected to the switch SW is controlled in accordance with the pulse width of a pulse generated by a PWM circuit 6060. A timing signal is generated by a timing controller 6070 and is applied to the PWM circuit 6060. A pulse width control signal PCS is also applied to the PWM circuit 6060.

Referring to FIGS. 49A and 49B, the precharging operation of the present embodiment will be described in further detail below. By way of example, as shown in FIG. 49A, it is assumed herein that a black signal is displayed on pixels 6022, 6024, and 6026, in a pixel-by-pixel fashion by means of driving with inversion every scanning line.

In FIG. 49B, the positive black level is denoted by "B1" and the negative black level is denoted by "B2". The voltage VA used to precharge the signal line to a positive precharging voltage and the voltage VB used to precharge the signal line to a negative precharging voltage are set to values so that their absolute values are greater than the absolute values of the black levels B1 and B2, respectively.

The great difference between the voltage used to precharge the signal line and the voltage to which the signal line is to be precharged makes it possible to precharge the signal line at a high speed. If the switch SW shown in FIG. 50 is opened when the voltage on the signal line reaches the black level B1 or B2, the precharging can be completed, as shown at the bottom of FIG. 49B, during a period of time T2 or T3, which is shorter than that required in the technique shown in FIG. 46.

In this embodiment, the term the "voltage used to precharge the signal line" is used to describe a voltage which is provided to precharge the signal line and which is different from the voltage to which the signal line is precharged.

(Fifteenth Embodiment)

(Circuit Configuration of Liquid Crystal Display Device)

Figure 51:
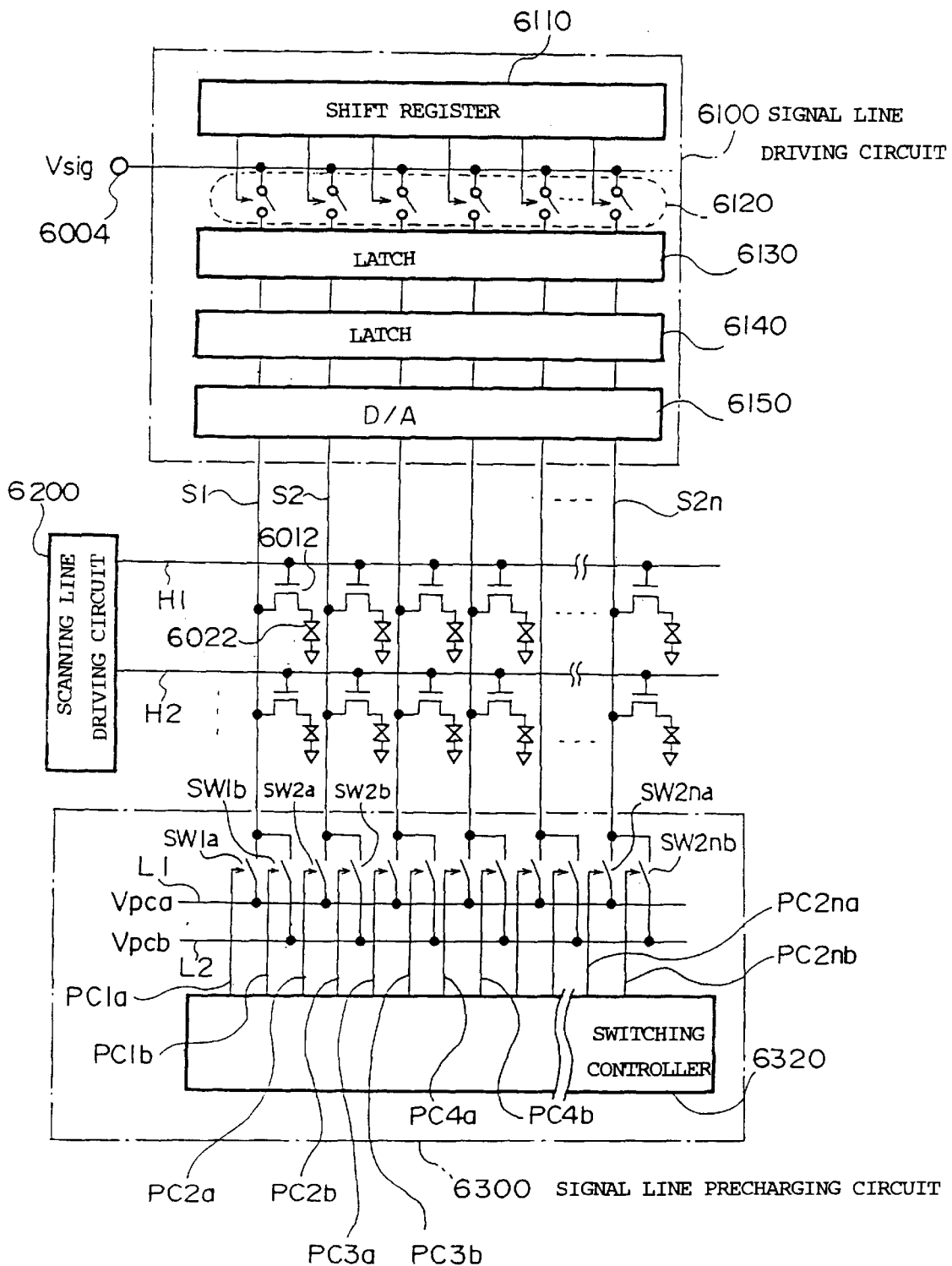
FIG. 51 is a diagram illustrating an example of the construction of a liquid crystal display device (driven in a line-by-line fashion) according to the present invention.

FIG. 51 illustrates an example of a liquid crystal display device of the active matrix type employing the precharging technique according to the thirteenth embodiment described above (referring to FIG. 46).

Figure 52:
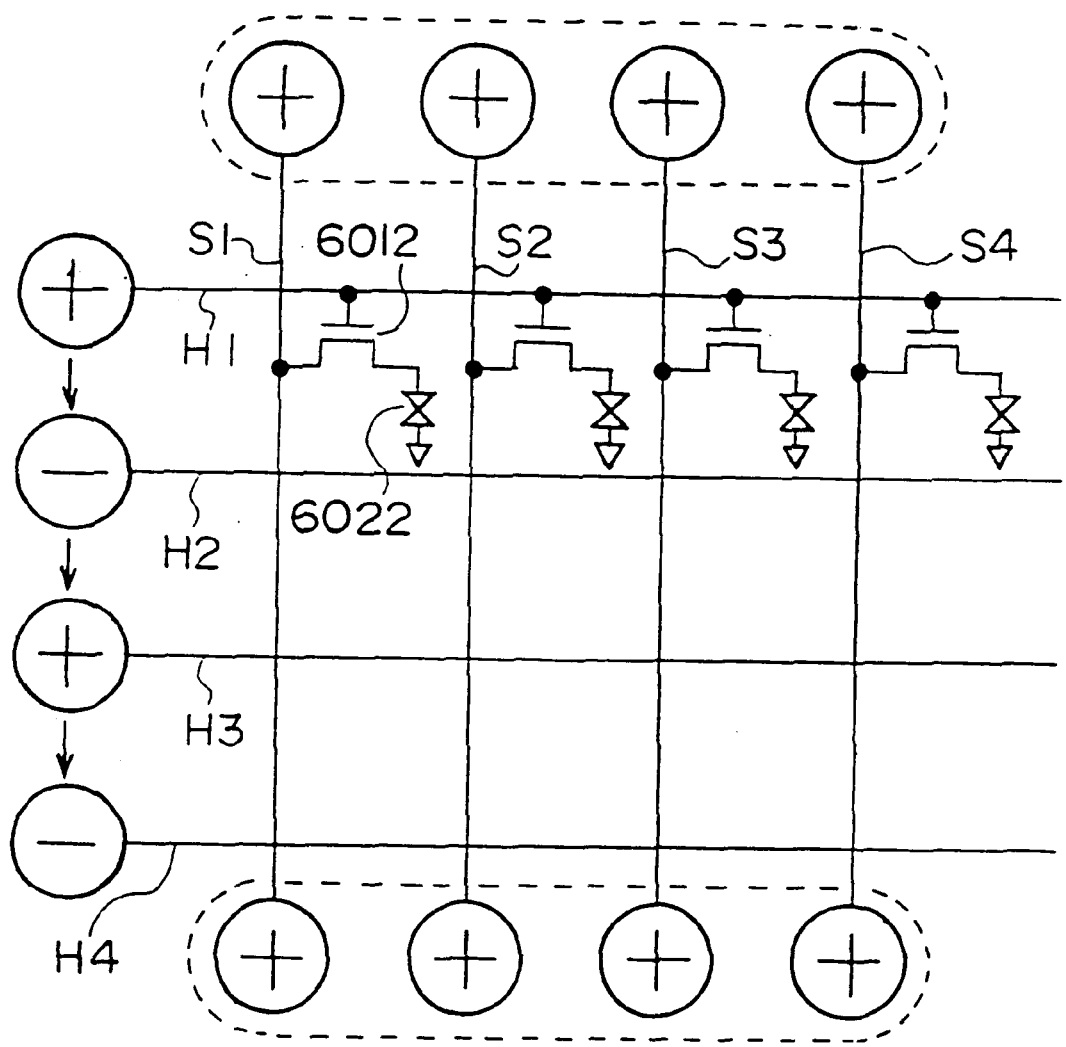
FIG. 52 is a diagram illustrating an example of the precharging and driving operation performed in an inverting fashion in the liquid crystal display device shown in FIG. 51 (wherein the driving is performed line by line while inverting the polarity every scanning line)
Figure 53:
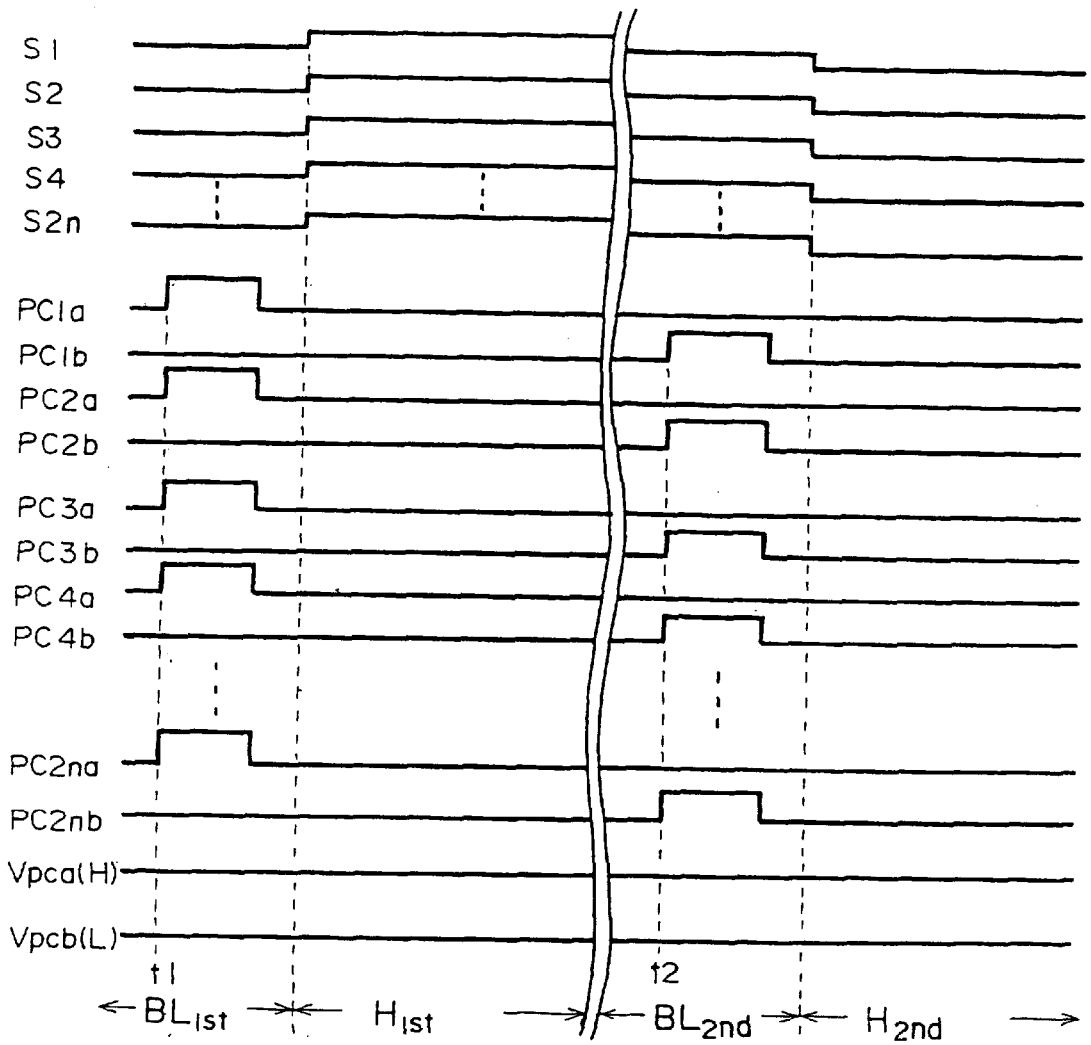
FIG. 53 is a diagram illustrating a specific example of the driving and precharging operation shown in FIG. 52, performed by the precharging circuit shown in FIG. 51.

In the liquid crystal display device shown in FIG. 51, the signal lines (liquid crystals) are driven "line by line with inversion every scanning line" as shown in FIG. 52, and the precharging is performed simultaneously for various signal lines during an immediately preceding blanking period as shown in FIG. 53.

In FIG. 52, symbols "+" at the top and bottom represent the driving and precharging polarity. The broken lines surrounding these symbols "+" indicate that the voltage is supplied not pixel by pixel but is simultaneously supplied to a plurality of pixels line by line. Similar notations are also employed in some other figures.

The signal line driving circuit 6100 includes a shift register 6110, sampling switches 6120 for sampling an image signal (Vsig), twelfth and second latches 6130 and 6140, and a D/A converter 6150. Signal lines S1–S2n are driven by the output signals of the D/A converter 6150.

Scanning lines H1, H2, . . . , are driven by a scanning line driving circuit 6200. If a scanning line is driven to an "H" level, corresponding TFTs 12 are turned on, and thus the image signal is supplied to liquid crystals 6022 via the corresponding signal lines S1–S2n.

The signal line precharging circuit 6300 includes a switch controller 6320 which outputs control signals PC1a, PC1b, PC2a, PC2b, . . . , PC2na and PC2nb thereby controlling the on/off operations of switches SW1a, SW1b, SW2a, SW2b, . . . , SW2na and SW2nb wherein each signal line has two switches. The signal line precharging circuit 6300 also includes precharging lines L1 and L2 held at precharging voltages Vpca and Vpcb, respectively (in a similar manner to that shown in FIG. 46).

Note that in the precharging circuit of the present embodiment, the function of the switch SW shown in FIG. 46A is implemented by two switches (for example, the signal line S1 has switches SW1a and SW1b), wherein a switch with a subscript "a" is connected to the high-level precharging voltage Vpca and a switch with a subscript "b" is connected to the low-level precharging voltage Vpcb. Each pair of switches is turned on or off in a complementary fashion in response to the control signals PC1a–PC2nb generated by the switching controller 6320.

(Timing of the Driving and Precharging Operation)

FIG. 53 is a timing chart associated with the precharging and driving operation performed in the liquid crystal display device shown in FIG. 51 in accordance with the method shown in FIG. 52.

In FIG. 53, "BL1st" denotes a first horizontal blanking period, "BL2nd" a second horizontal blanking period, "H1st" a first horizontal selection period, and "H2nd" a second horizontal selection period.

Signal lines S1–S2n become active (the active states are denoted by "H" levels in FIG. 53) in the horizontal selection period, and an image signal is supplied during this period.

Precharging on the signal lines is performed during the horizontal period immediately prior to the horizontal selection period.

More specifically, the control signals having subscript "a" of the switching control signals PC1a, PC1b, . . . , PC2na, PC2nb output by the switch controller 6320 rise simultaneously to an "H" level at time t1 in the first horizontal blanking period (BL1st). In response, the switches SW1a, SW2a, . . . , SW2na are turned on so that the signal lines S1–S2n are precharged to a voltage equal to the high-level precharging voltage Vpca.

On the other hand, the control signals having subscript "b" of the switching control signals PC1a, PC1b, . . . , PC2na, PC2nb output by the switch controller 6320 rise simultaneously to an "H" level at time t2 in the second horizontal blanking period (BL2nd). In response, the switches SW1b, SW2b, . . . , SW2nb are turned on so that the signal lines S1–S2n are precharged to a voltage equal to the low-level precharging voltage Vpcb.

In the present embodiment, as described above, the signal lines are precisely precharged at a high speed. Thus, the liquid crystal display device of the present embodiment has an improved ability of displaying a high-quality image.

(Specific Example of Precharging Circuit)

Figure 54:
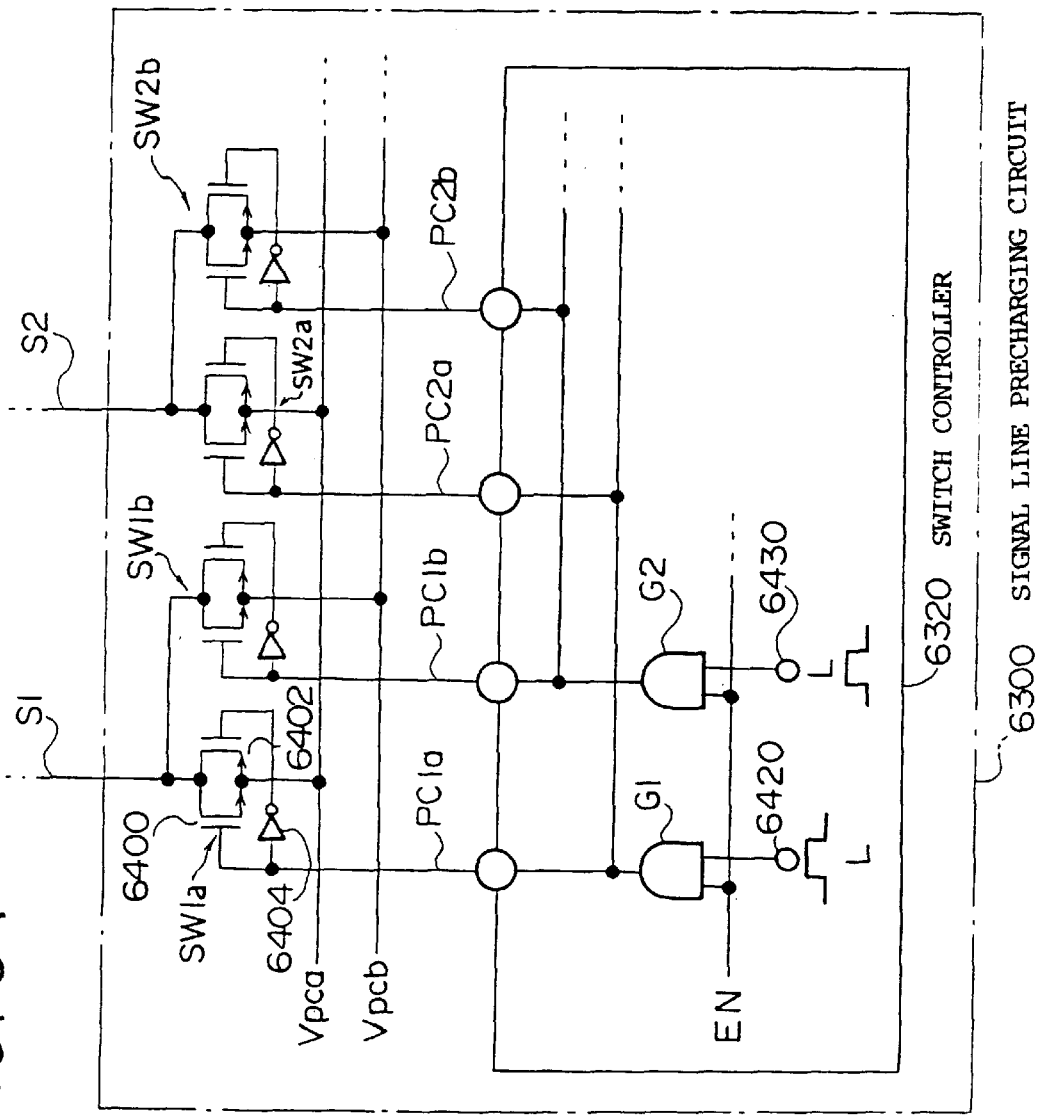
FIG. 54 is a circuit diagram illustrating a specific example of the precharging circuit which operates as shown in FIG. 53.

The switching control signals PC1a, PC1b, . . . , PC2na, PC2nb whose H/L level is changed as shown ion FIG. 53 can be easily generated using a circuit configured as shown in FIG. 54. The switch controller 6320, as shown in FIG. 54, includes a programmable logic device or the like which is programmed by means of wiring to control the polarity of the pulse signal to be generated.

That is, the output terminal of a gate G1 is connected to terminals via which the switching control signals PC1a, PC2a, PC3a, PC4a, . . . are output. Similarly, the output terminal of a gate G2 is connected to terminals via which the switching control signals PC1b, PC2b, PC3b, PC4b, . . . are output.

The gates G1 and G2 can generate a pulse when the enable signal EN is in an active state. During the first horizontal blanking period (BL1st), a positive pulse having a predetermined width is applied to the input terminal 6420 of the gate G1, while the input terminal 6430 of the gate G2 is maintained at a low level. During the second horizontal blanking period (BL2nd), the input terminal 6420 of the gate G1 is maintained at a low level, and a positive pulse having a predetermined width is applied to the input terminal 6430 of the gate G2. The above operation is performed repeatedly so that the switching control signals PC1a, PC1b, . . . , PC2na, PC2nb are generated as shown in FIG. 53.

The switches SW1a, SW1b, SW2a, SW2b, . . . shown in FIG. 51 are implemented in a more practical form in the upper part of the circuit shown in FIG. 54. Each switch is composed of an NMOS transistor (TFT) 6400, a PMOS transistor (TFT) 6402, and an inverter 6404. It is desirable that the TFTs 6400 and 6402 forming each switch be produced on the same substrate using the same process as that used to produce switching elements (denoted by reference numeral 12 in FIG. 51) disposed in a matrix array fashion in the liquid crystal display device. A specific example of substrate of the liquid crystal panel will be described later.

Although in the specific example shown in FIG. 51 the driving circuit for driving the liquid crystal panel is constructed into the form of a digital driving circuit, the invention is not limited to that. For example, the driving circuit may also be constructed in the form of an analog driving circuit.

(Sixteenth Embodiment)

Figure 55:
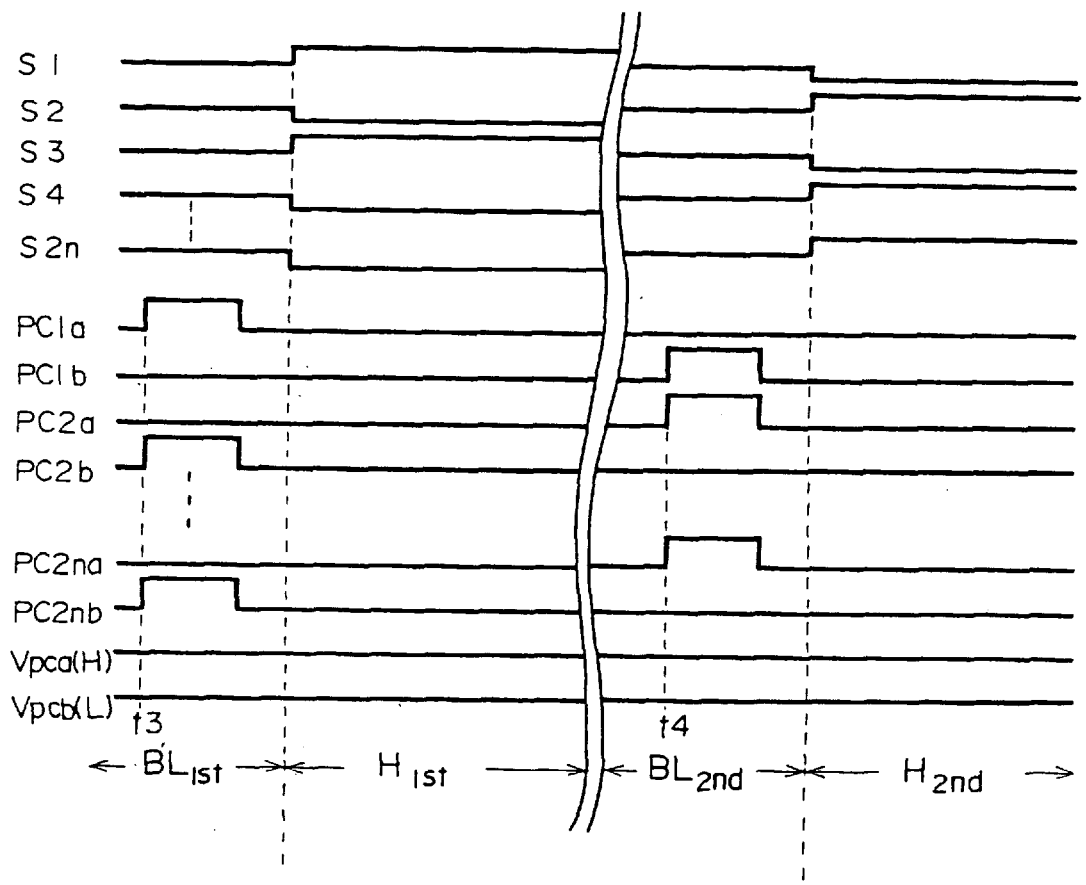
FIG. 55 is a diagram illustrating a specific example of the driving and precharging operation shown in FIG. 54.

In this sixteenth embodiment, the liquid crystal display device shown in FIG. 51 is subjected to the driving and precharging operation performed in the manner shown in FIG. 55. That is, in this embodiment, the scheme of "inversion every signal line" is also employed in addition to the scheme of "line by line with inversion every scanning line", wherein the precharging is performed simultaneously for various signal lines during an immediately preceding blanking period.

FIG. 55 is a timing chart associated with the precharging operation according to the present embodiment.

The switches SW1a, SW1b, SW2a, and SW2b shown in FIG. 51 are alternately operated so that precharging is performed in accordance with the polarity of the signals driving the signal lines and so that the polarity of the precharging voltage is inverted every scanning line. The precharging of the signal lines is performed during a horizontal blanking period immediately prior to a horizontal selection period.

During the first horizontal blanking period (BL1st), odd-numbered scanning lines are driven as follows. That is, the control signals having subscript "a" of the switching control signals PC1a, PC1b, . . . , PC2na, PC2nb output by the switch controller 6320 shown in FIG. 51 rise simultaneously to an "H" level at time t3. In response, the switches SW1a, SW3a, . . . , are turned on so that the odd-numbered signal lines S1, S3, S5, . . . , S2n–1 are precharged to a voltage equal to the high-level precharging voltage Vpca.

On the other hand, even-numbered scanning lines are driven as follows. That is, the control signals having subscript "b" of the switching control signals PC1a, PC1b, . . . , PC2na, PC2nb also rise simultaneously to an "H" level at time t3. In response, the switches SW2b, SW4b, . . . , are turned on so that the even-numbered signal lines S2, S4, . . . , S2n are precharged to a voltage equal to the low-level precharging voltage Vpcb.

During the second horizontal blanking period (BL2nd), switching operations are performed in such a manner that the operations for the even-numbered scanning lines and the operations for the odd-numbered scanning lines are replaced by each other so that the driving is performed in an inverted fashion with respect to the scanning lines.

Figure 56:
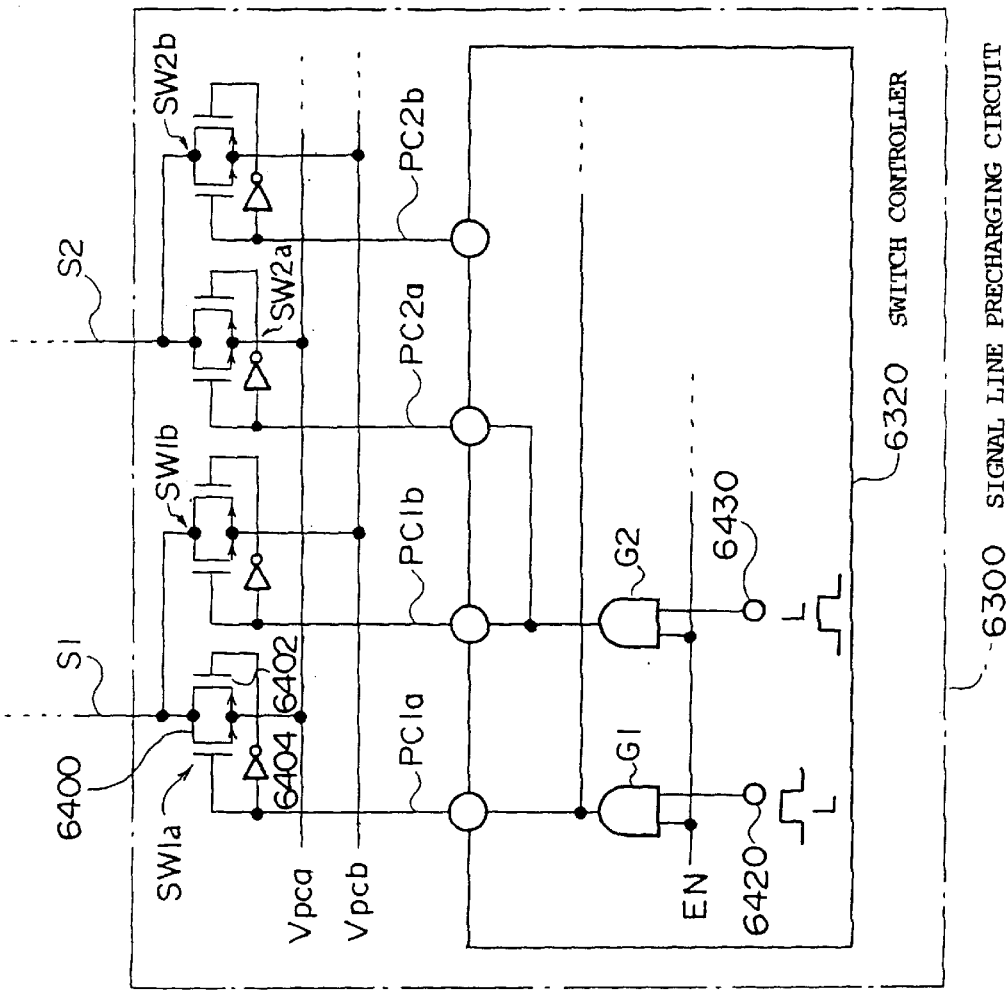
FIG. 56 is a circuit diagram illustrating an example of the precharging circuit implementing the precharging method shown in FIG. 54.

The switching control signals PC1a, PC1b, . . . , PC2na, PC2nb whose H/L level is changed every scanning line can be easily generated using a circuit configured as shown in FIG. 56. The switch controller 6320, as shown in FIG. 56, includes a programmable logic device or the like which is programmed by means wiring to control the polarity of the pulse signal to be generated.

That is, the output terminal of a gate G1 is connected to terminals via which the switching control signals PC1a, PC2b, PC3a, PC4b, . . . are output. Similarly, the output terminal of a gate G2 is connected to terminals via which the switching control signals PC1b, PC2a, PC3b, PC4a, . . . are output.

Figure 57:
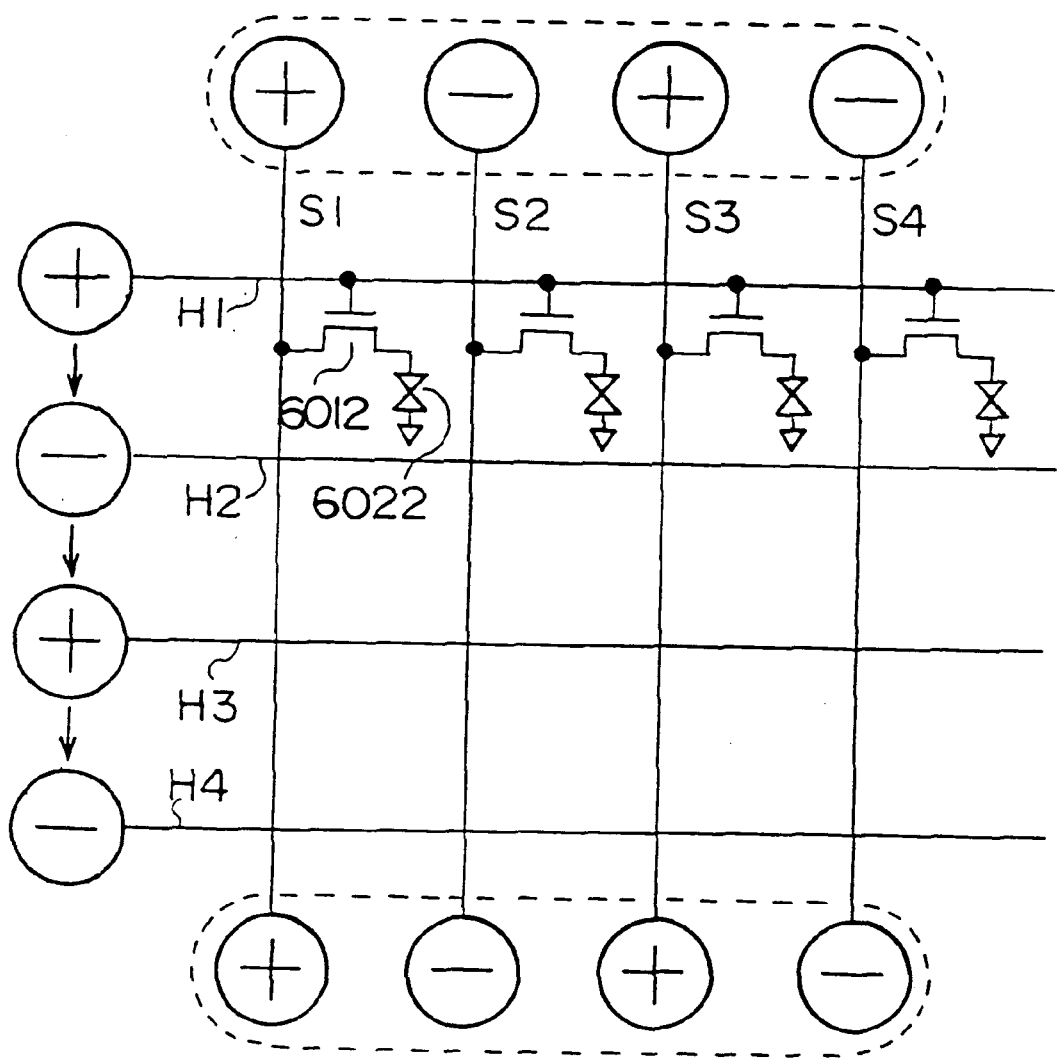
FIG. 57 is a diagram illustrating another example of the precharging and driving operation performed in an inverting fashion in the liquid crystal display device shown in FIG. 51 (wherein the driving is performed line by line while inverting the polarity every scanning line and also every signal line)

The gates G1 and G2 can generate a pulse when the enable signal EN is in an active state. During the first horizontal blanking period (BL1st), a positive pulse having a predetermined width is applied to the input terminal 6420 of the gate G1, while the input terminal 6430 of the gate G2 is maintained at a low level. During the second horizontal blanking period (BL2nd), the input terminal 6420 of the gate G1 is maintained at a low level, and a positive pulse having a predetermined width is applied to the input terminal 6430 of the gate G2. The above operation is performed repeatedly so that the switching control signals PC1a, PC1b, . . . , PC2na, PC2nb are generated as shown in FIG. 57.

In the present embodiment, as in the previous embodiments, the signal lines are precisely precharged at a high speed. Thus, the liquid crystal display device of the present embodiment has an improved ability of displaying a high-quality image. Furthermore, since the polarity of the driving signals is inverted every signal line, the horizontal cross-talk in the operation of displaying an image on the liquid crystal is reduced.

The difference between the circuits shown in FIGS. 54 and 56 is in the electrical connections to properly generate the switching control signals PC1a, PC1b, . . . , PC2na, PC2nb. Such the modification in the connections may also be made electrically using a circuit such as that shown in FIG. 58.

Figure 58:
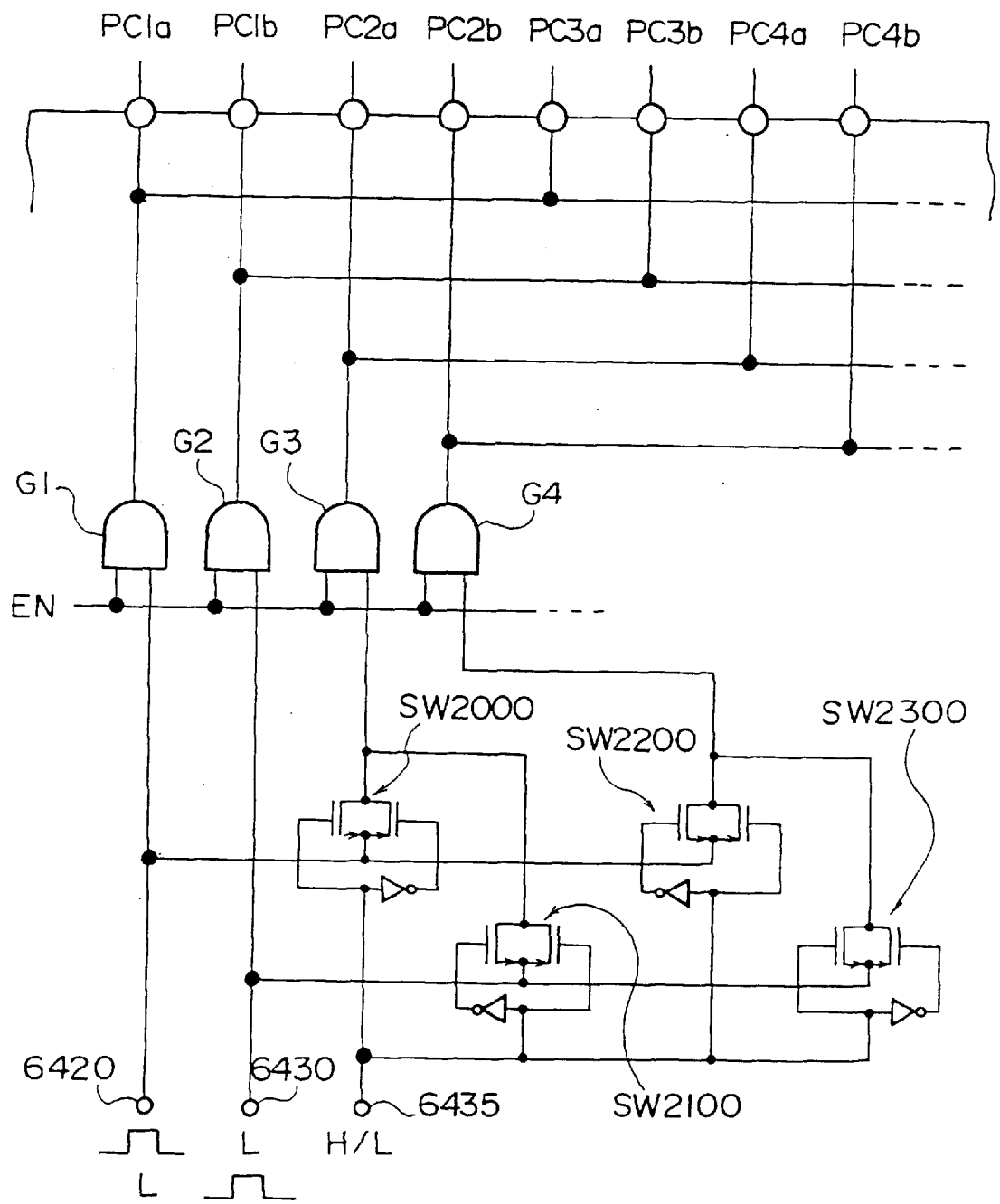
FIG. 58 is a circuit diagram illustrating an example of a circuit capable of generating switching control signals in any desired way, that is, either in the manner shown in FIG. 54 or in the manner shown in FIG. 56.

That is, the circuit shown in FIG. 58 is an expansion of the circuit shown in FIG. 54 or 56, and the circuit is composed of gates G1–G4, switches SW2000, SW2100, SW2200, and SW2300, and a select signal input terminal 6435.

When an "H"-level select signal is applied to the select signal input terminal 6435, the switching control signals PC1a, PC1b, . . . , PC2na, PC2nb are generated which can be used in the mode shown in FIG. 53 in which the polarity is not inverted every signal line.

On the other hand, when an "L"-level select signal is applied to the select signal input terminal 6435, the switching control signals PC1a, PC1b, . . . , PC2na, PC2nb are generated which can be used in the mode shown in FIG. 55 in which the polarity is inverted every signal line.

(Seventeenth Embodiment)

Figure 59:
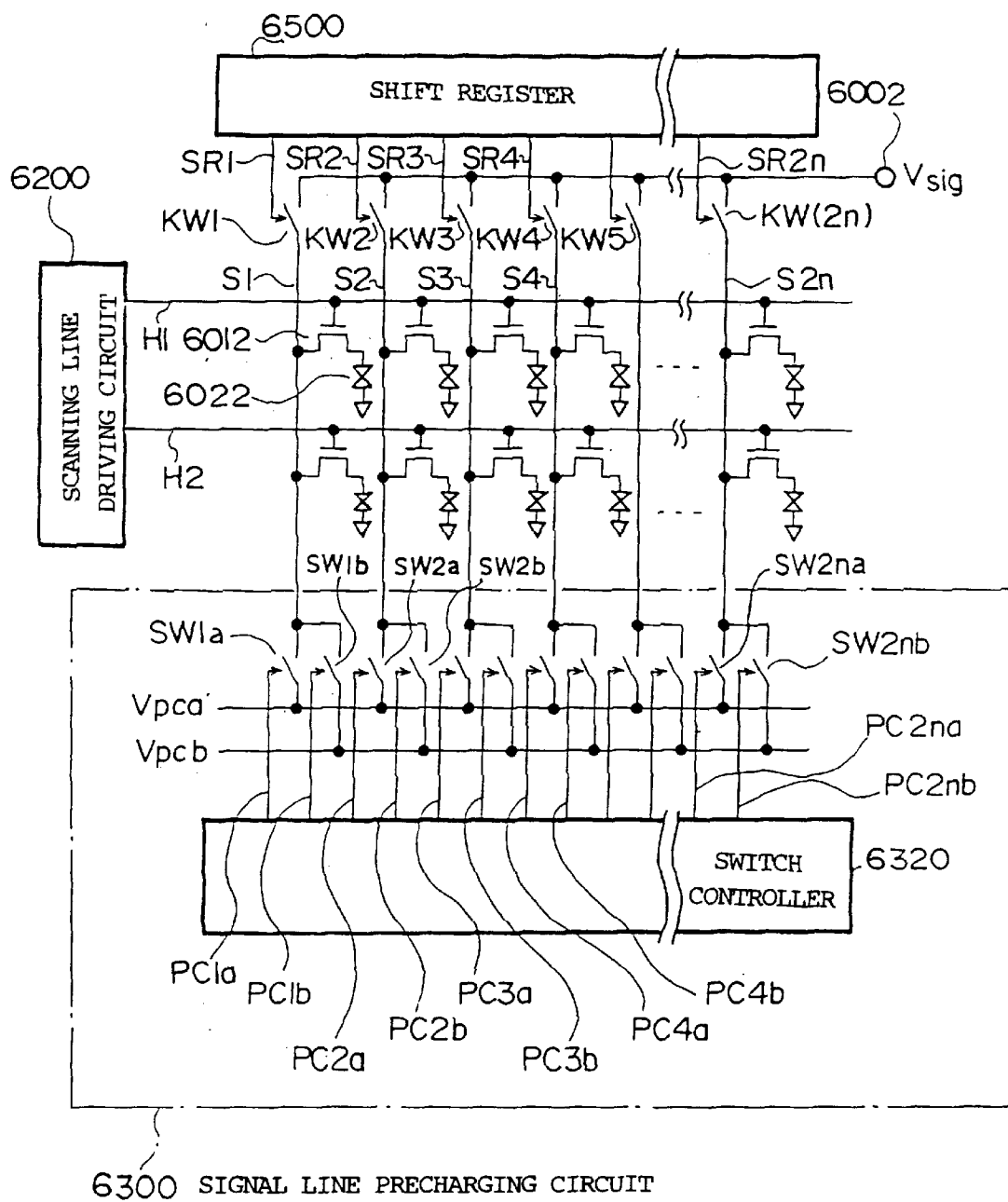
FIG. 59 is a circuit diagram illustrating an example of the construction of a liquid crystal display device according to the invention (in which driving is performed pixel by pixel while precharging is performed simultaneously for a plurality of pixels)
Figure 60:
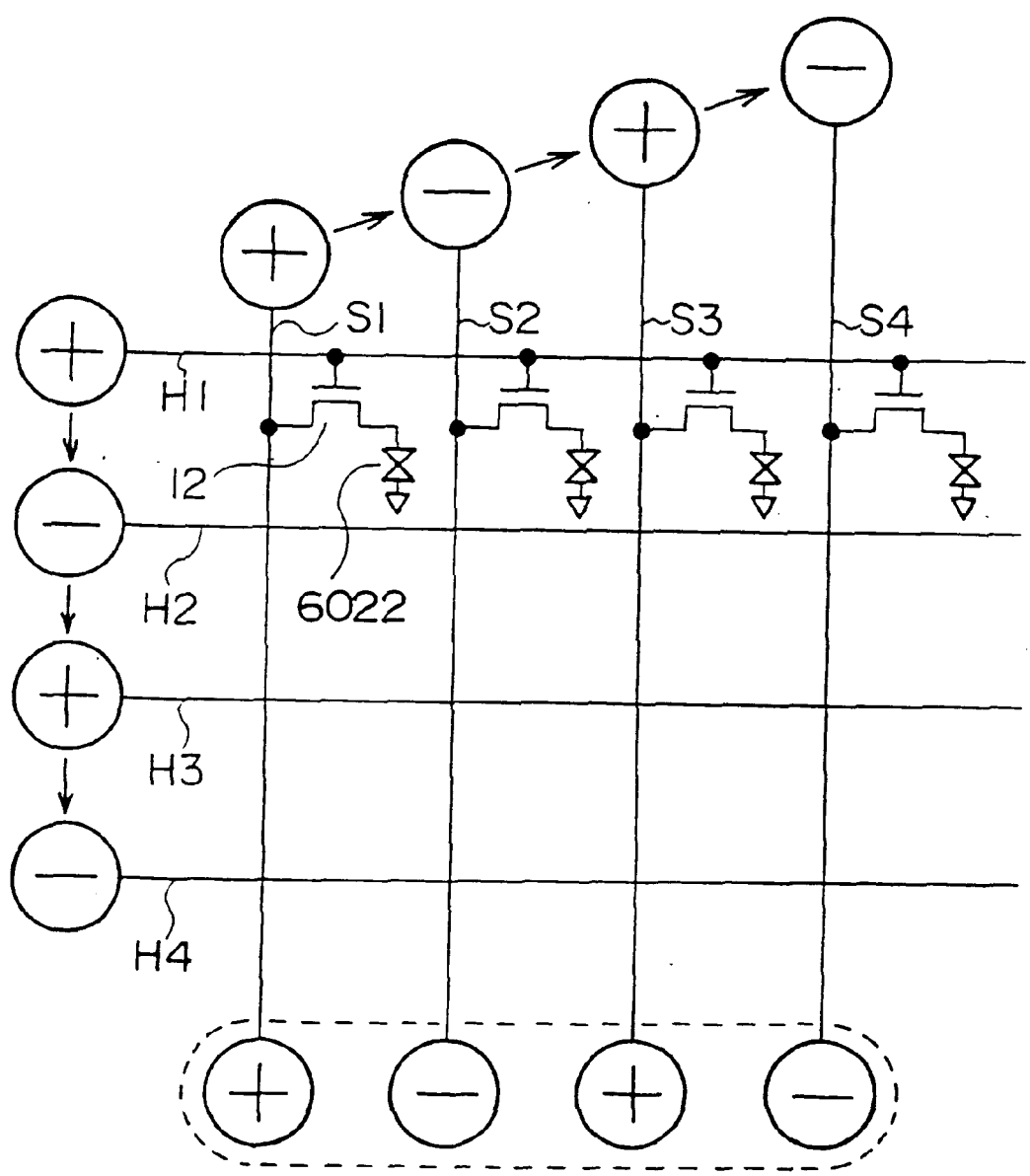
FIG. 60 is a diagram illustrating an example of the precharging and driving operation performed in an inverting fashion in the liquid crystal display device shown in FIG. 56 (wherein the driving is performed pixel by pixel while precharging is performed simultaneous for a plurality of pixels in an immediately preceding blanking period in such a manner that the precharging polarity is inverted every scanning line and also every signal line)
Figure 61:
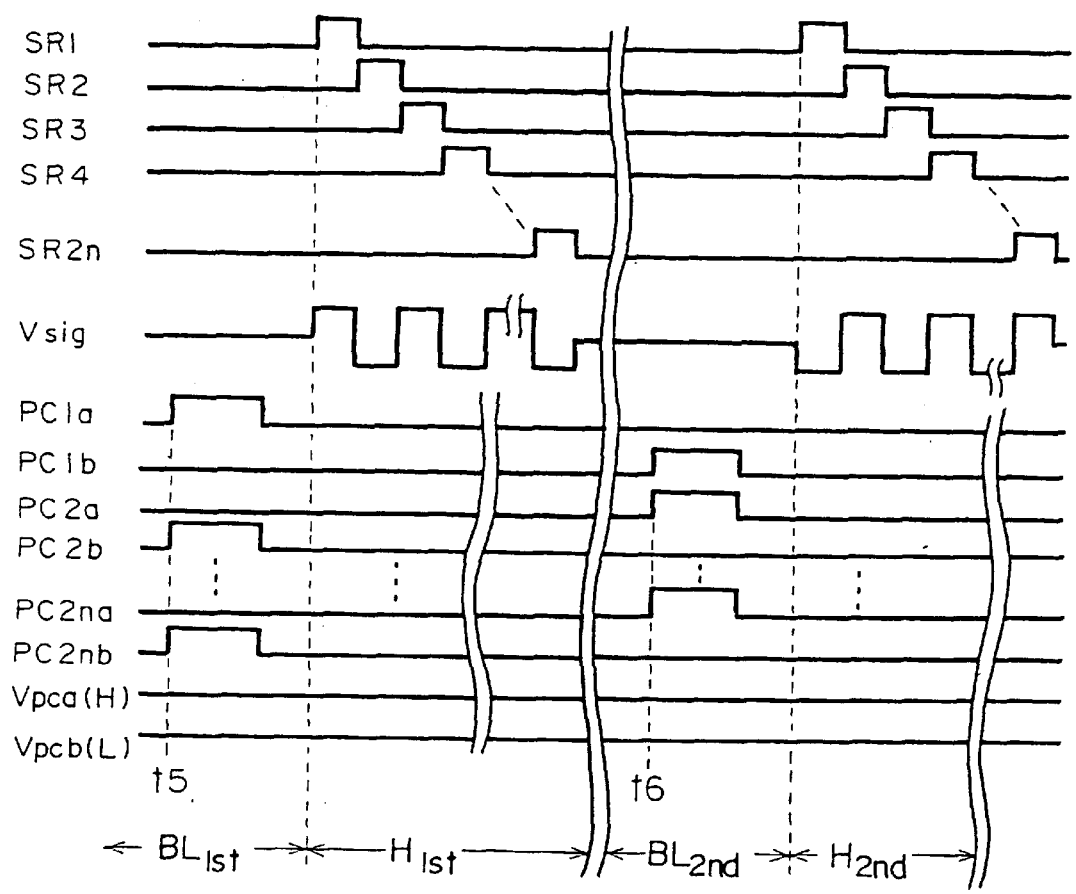
FIG. 61 is a timing chart illustrating the precharging and driving operation performed in the liquid crystal display device shown in FIG. 59.

Referring to FIGS. 59–61, a seventeenth embodiment of the invention will be described below.

(Construction of Liquid Crystal Display Device)

FIG. 59 illustrates, in a brief fashion, the construction of a liquid crystal display device according to the present embodiment. This liquid crystal display device is driven point by point. To this end, the liquid crystal display device includes a shift register 6500 and switches KW1–KW(2n), for driving signal lines. The on/off operation of the switches KW1–KW(2n) is controlled by the control signals SR1–SR2n which are sequentially generated by the shift register 6500. An image signal Vsig is supplied via a terminal 6002. The liquid crystal display device also includes a signal line precharging circuit similar to that shown in FIG. 51.

(Driving and Precharging Method)

In this embodiment, as shown in FIG. 60, driving is performed pixel by pixel while inverting the polarity every signal line and also every scanning line wherein the precharging is performed simultaneously for various signal lines during an immediately preceding blanking period.

On the top of FIG. 60, symbols "+" and "–" are shown along a slanted line. This indicates that the driving operation is performed point by point. Similar notation is also employed in some other figures.

(Timing of Driving and Precharging Operation)

As shown in FIG. 61, precharging during a first horizontal blanking period (BL1st) is performed simultaneously at time t5. Similarly, precharging during a second horizontal blanking period (BL2nd) is performed simultaneously at time t6. During a horizontal selection period after completion of precharging, the control signals SR1–SR2n are sequentially output by the shift register 6500 thereby sequentially turning on the switches KW1–KW(2n) so that the corresponding signal lines are driven.

(Eighteenth Embodiment)

Figure 62:
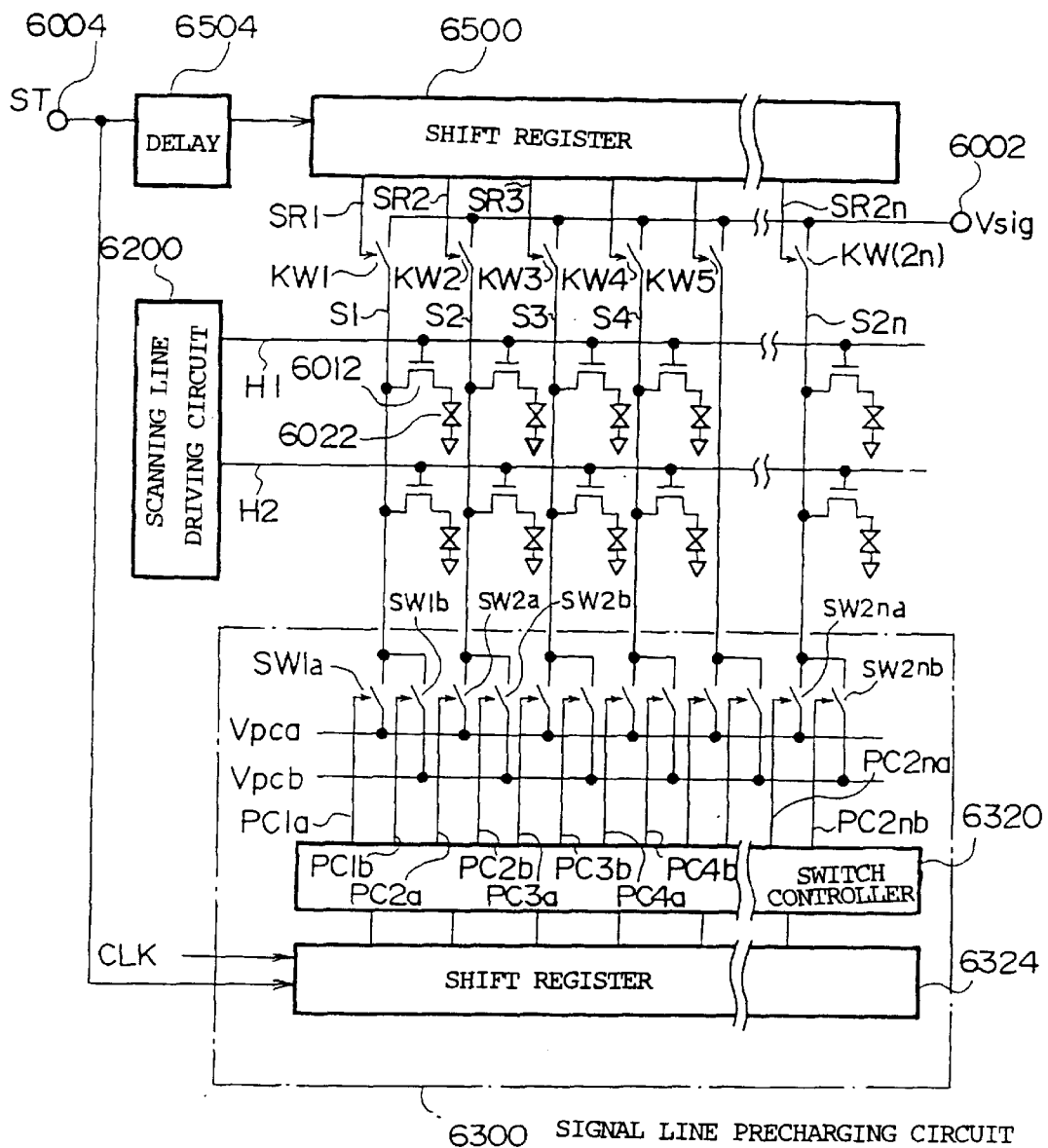
FIG. 62 is a circuit diagram illustrating an example of the construction of a liquid crystal display device according to the invention (in which driving and precharging are performed in a pixel-by-pixel fashion)
Figure 63:
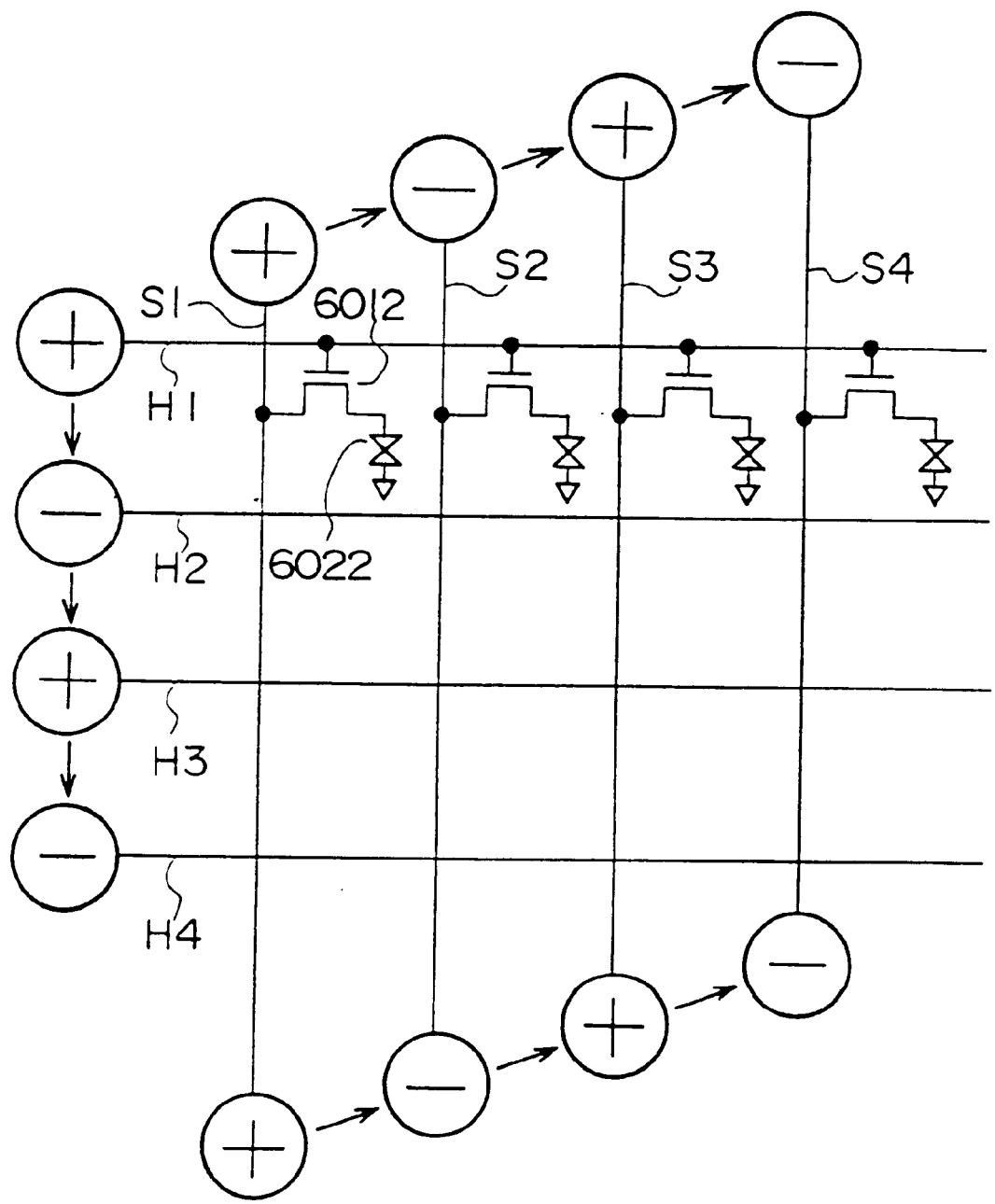
FIG. 63 is a diagram illustrating a precharging and driving method in which driving is performed pixel by pixel while inverting the driving polarity every scanning line and also every signal line, and precharging is also performed in a similar manner.
Figure 64:
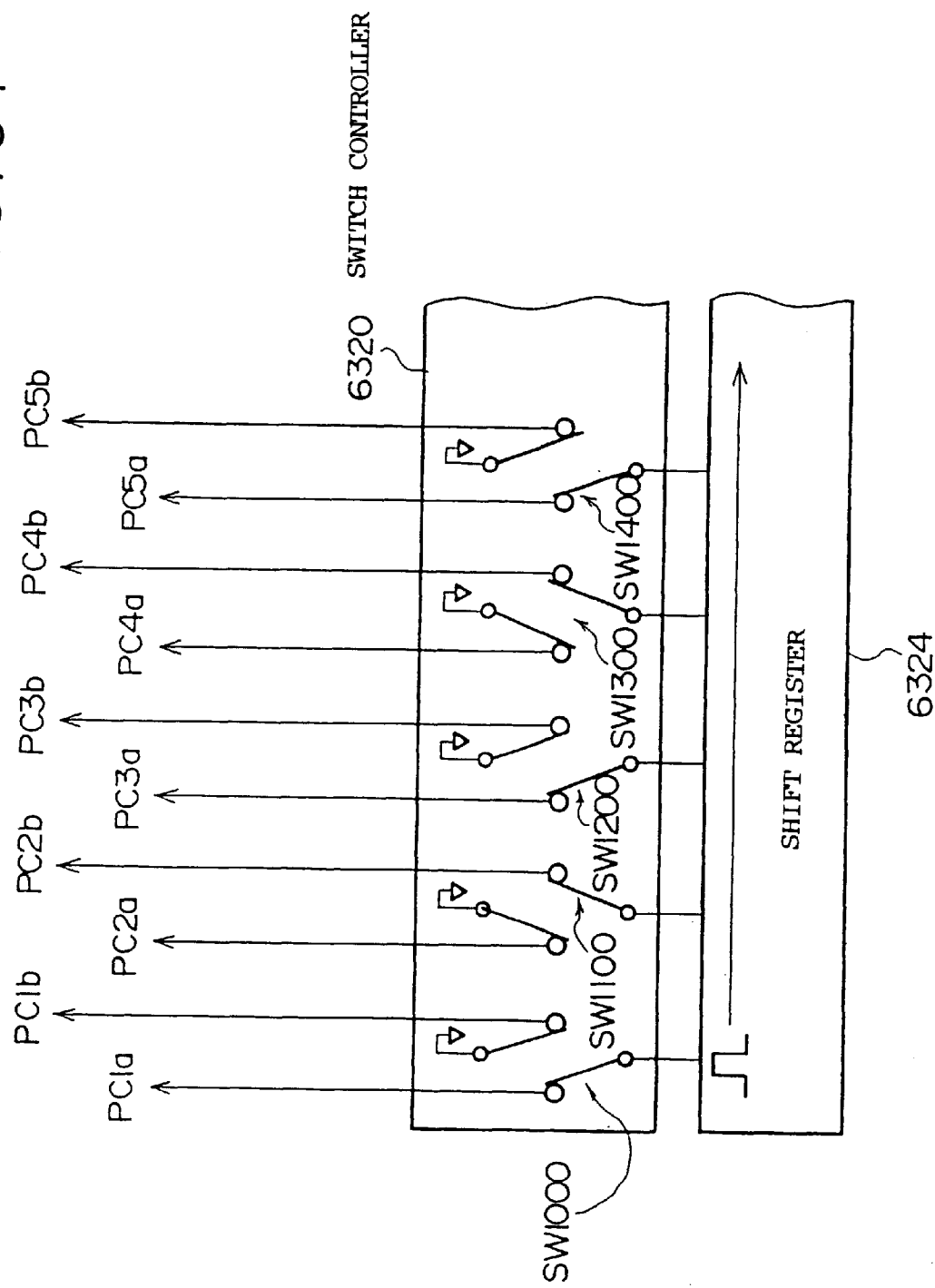
FIG. 64 is a circuit diagram illustrating the major part of a precharging circuit implementing the above precharging method.

Referring to FIGS. 62–64, an eighteenth embodiment of the invention will be described below.

(Driving and Precharging Method)

In this embodiment, as shown in FIG. 63, signal driving is performed pixel by pixel while inverting the driving polarity every signal line and also every scanning line, wherein precharging is also performed in a pixel-by-pixel fashion corresponding to the signal driving operation. In this embodiment, since the signal lines are precharged immediately before driving each scanning line, the period of time from the precharging operation to the signal line driving operation becomes equal for all signal lines. This allows the precharging operation to be performed in a more precise fashion.

(Construction of Liquid Crystal Display Device)

FIG. 62 illustrates, in a simplified fashion, the construction of the liquid crystal display device according to the present embodiment. In this liquid crystal display device, as in that shown in FIG. 59, the signal driving is performed pixel by pixel, wherein the same signal line driving circuit as that shown in FIG. 59 is also employed here.

To perform the precharging operation pixel by pixel, the signal line precharging circuit 6300 is provided with a shift register 6324. This shift register 6324 corresponds to the shift register 6500 in the signal line driving circuit. A signal (start signal) ST used to start the operation of each shift register is input directly to the shift register 6324 while it is input to the shift register 6500 after being delayed by a little amount via a delay circuit 6504.

The switching controller 6320 in the signal line precharging circuit 6300 generates switching control signals PC1a–PC2nb from the pulses sequentially generated by the shift register 6324 thereby precharging the signal lines.

The switching controller 6320 has for example selections switches SW1000, SW1100, SW1200, SW1300, SW1400, etc., as shown in FIG. 64. By properly operating these switches, the pulses generated by the shift register 6324 are output as the high-level switching control signals.

(Timing of Driving and Precharging Operation)

Figure 65:
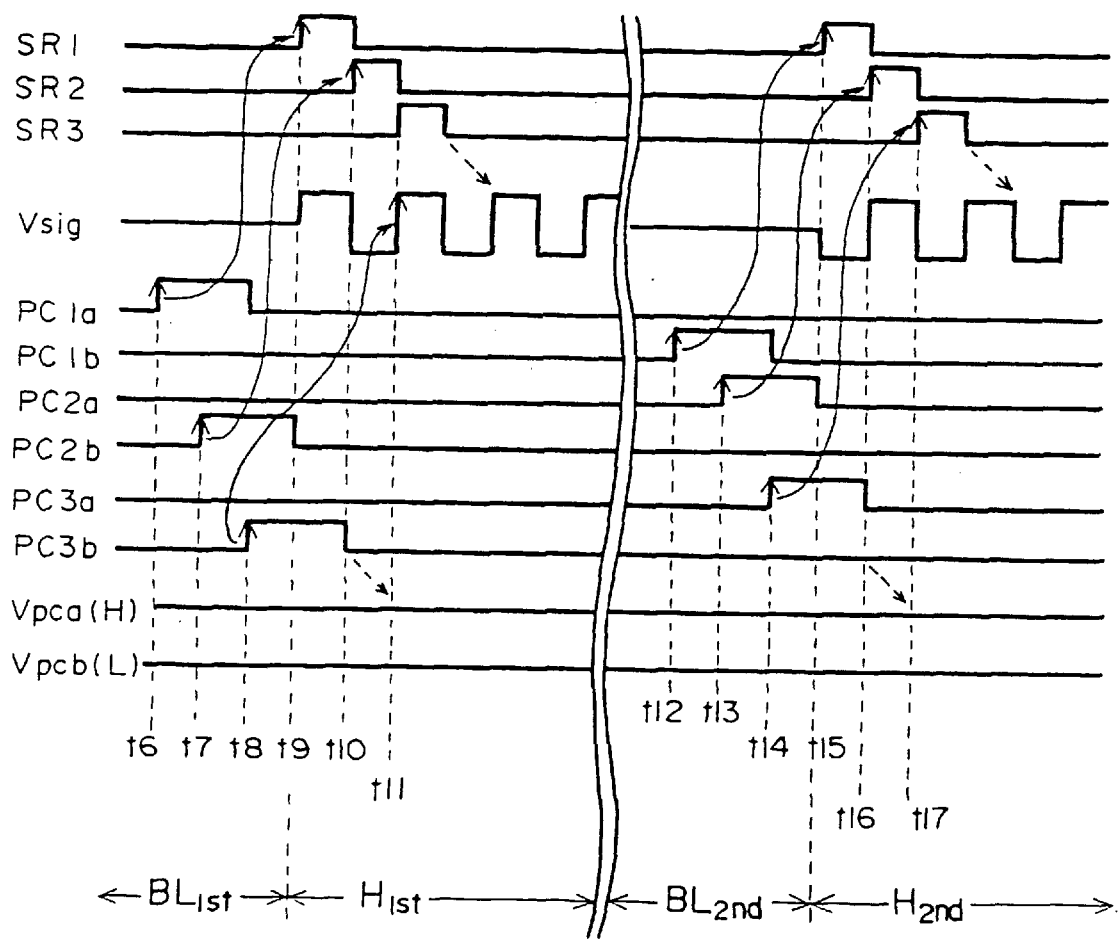
FIG. 65 is a timing chart illustrating the precharging and driving operation in accordance with the method shown in FIG. 63.

As shown in FIG. 65, the precharging is performed for each signal line before the control signals SR1–SR2n for controlling the on/off operations of the switches KW1–KW (2n) used to drive the signal lines become active (H).

For example, in the first horizontal blanking period (BL1st), the signal line S1 is precharged as follows. The switching control signal PC1a in the signal precharging circuit becomes "H" at time t6 before t9 at which "SR1" rises to an "H" level, thereby precharging the signal line S1. The signal line S2 is precharged in a similar manner at time t7. Similarly, the signal line S3 is precharged at time t8. In the second horizontal blanking period (BL2nd), precharging is performed at times t12, t13, and t14, in a similar manner. Thus, the precharging is performed pixel by pixel during the horizontal blanking period and the horizontal selection period.

(Nineteenth Embodiment)

Figure 66:
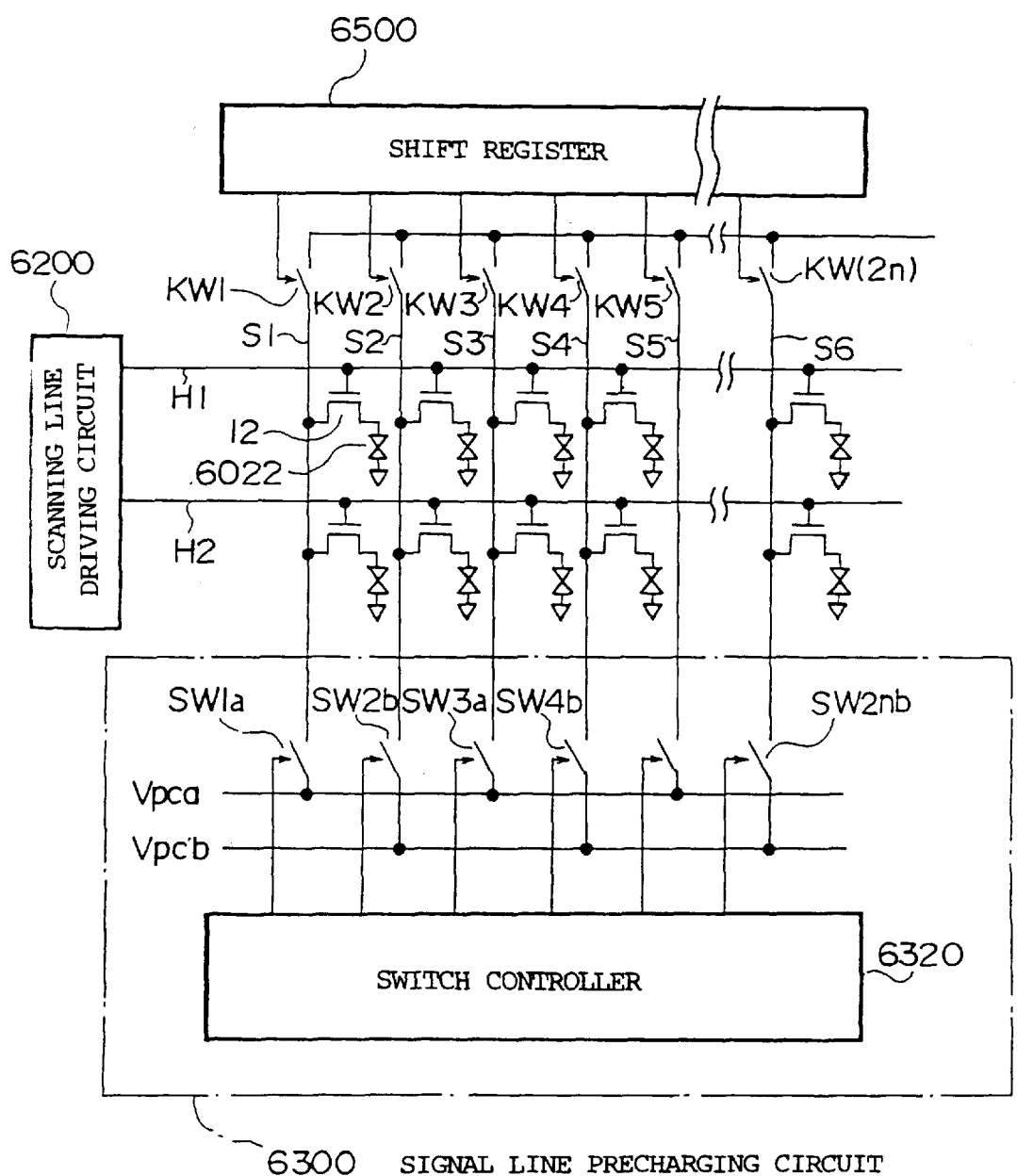
FIG. 66 is a circuit diagram of a liquid crystal display device according to the present invention (in which driving is performed pixel by pixel, and precharging is performed simultaneously for a plurality of pixels, while precharging voltages Vpca and Vpcb are periodically inverted in polarity)
Figure 67:
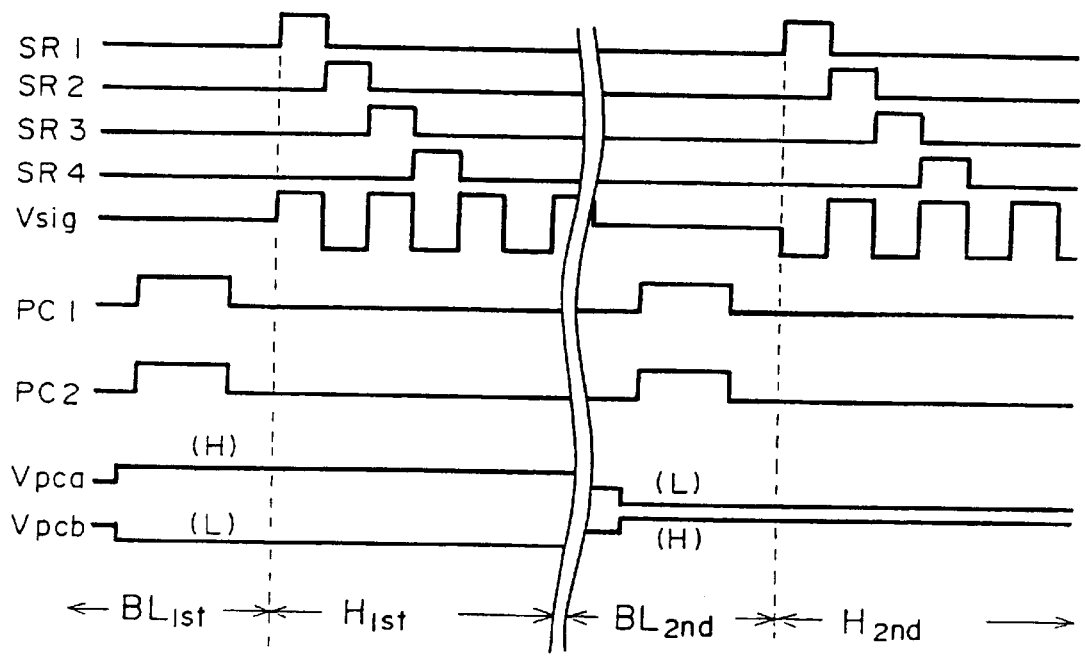
FIG. 67 is a timing chart illustrating an example of the operation of the liquid crystal display device shown in FIG. 66.

Referring to FIGS. 66 and 67, a liquid crystal display device according to a nineteenth embodiment of the invention will be described below.

The feature of the present embodiment is that the levels of the precharging voltages Vpca and Vpcb are inverted every horizontal selection period. This allows the number of switches SW1a, SW2b, SW3a, SW4b, . . . , SW2nb in the signal line precharging circuit 6320 to be reduced to half that employed in the previous embodiment. Therefore, the switches are constructed in a simpler fashion, and the signal line precharging circuit 6300 can be realized with a smaller size.

As clearly shown in FIG. 67, although the levels of the precharging voltages Vpca and Vpcb are periodically inverted, the precharging voltages Vpca and Vpcb are maintained at the same levels during each horizontal selection period (and also during each blanking period immediately prior to the horizontal selection period). In this respect, the present embodiment is the same as the previous embodiment. That is, in the present invention, the precharging voltages Vpca and Vpcb are maintained at the same fixed levels (that is, at the same DC levels) at least during each horizontal selection period (and also during each blanking period immediately prior to each horizontal selection period).

(Twentieth Embodiment)

Figure 68:
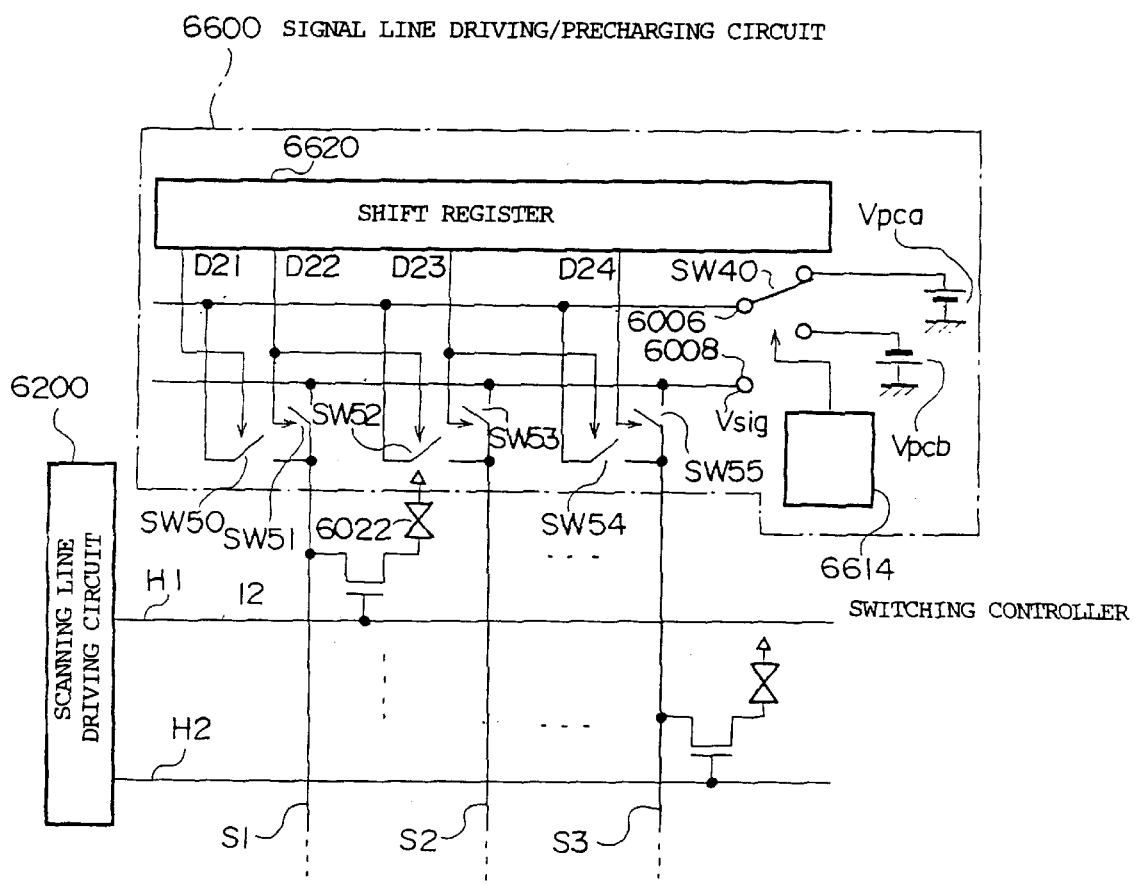
FIG. 68 is a circuit diagram illustrating the major part of a liquid crystal display device in which both precharging and driving on signal lines are performed by a single shift register.

FIG. 68 illustrates a liquid crystal display device according to twentieth embodiment of the invention.

The feature of this embodiment is that the shift register 6324 in the precharging circuit 6300 and the shift register 6500 used to drive the signal lines in the device shown in FIG. 62 are implemented, in this embodiment, by a single common shift register.

This allows the precharging circuit to be constructed in a simpler fashion.

In FIG. 68, reference numeral 6600 denotes a circuit which servers not only as the signal line driving circuit but also as the precharging circuit. The switching controller 6614 controls the on/off operation of a switch 6040 in synchronization with the operation of the shift register 6620. An image signal Vsig is input via an terminal 6008.

In response to the signal D21 output from the shift register 6620, a switch SW50 is turned on, thereby precharging a signal line S1.

After that, a signal "D22" is generated by the shift register 6620. In response to the signal "D22", a switch SW51 is turned on. As a result, the image signal Vsig is supplied over "the signal line S1". At the same time, a switch SW52 is also turned on in response to the signal D22 generated from the shift register 6620, and thus "a signal line S2" is precharged. Similar operation is performed repeatedly so that the image signal Vsig is supplied over a signal line and, at the same time, the next signal line is precharged.

Although in the present embodiment when an image signal is supplied over a certain signal line, precharging is performed at the same time on the immediately following signal line, the precharging may be performed on a signal line located a greater number of lines apart from the signal line on which the image signal is supplied.

(Twenty-first Embodiment)

Figure 69:
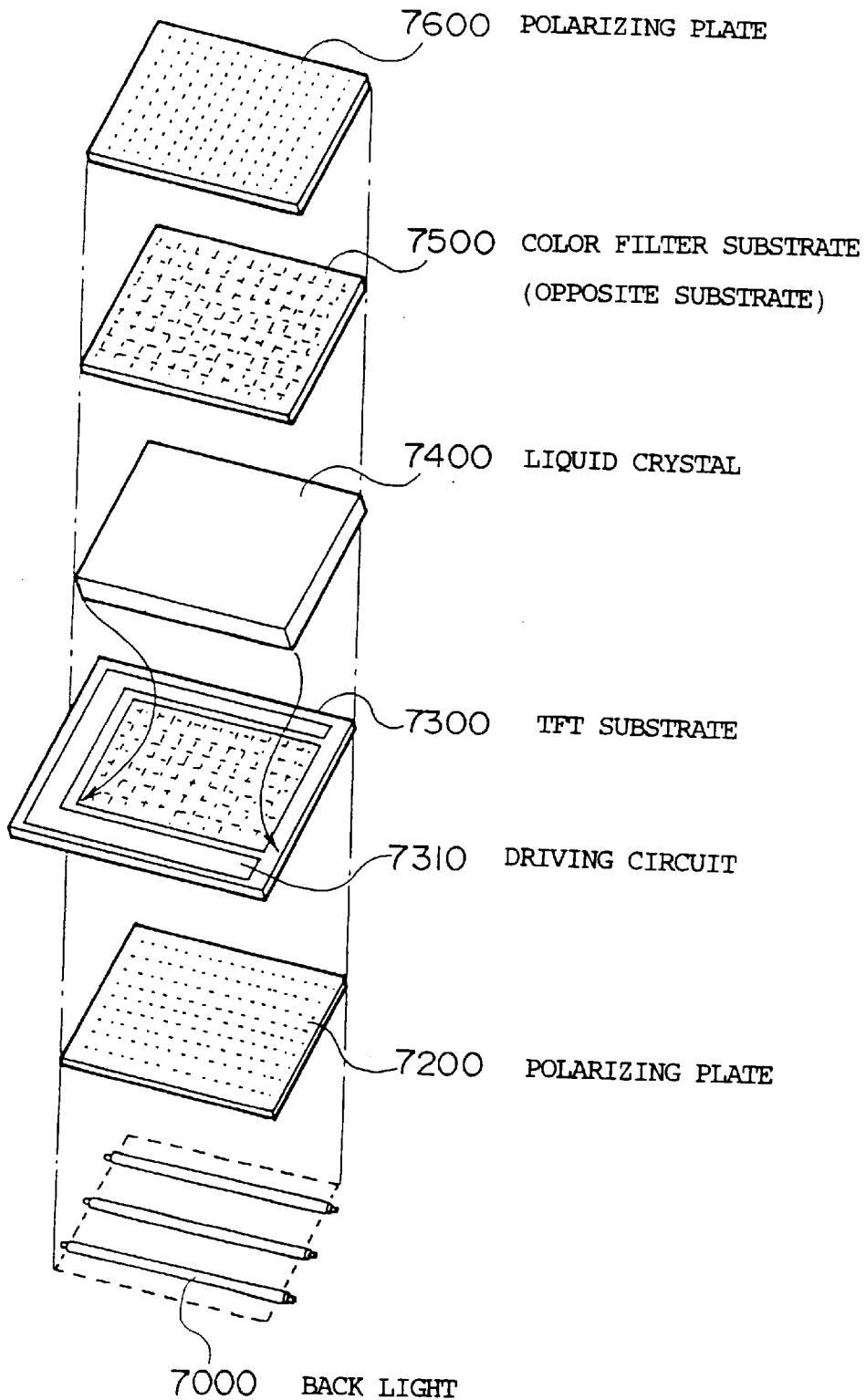
FIG. 69 is a schematic diagram illustrating the structure of a liquid crystal display device according to the present invention.
Figure 70:
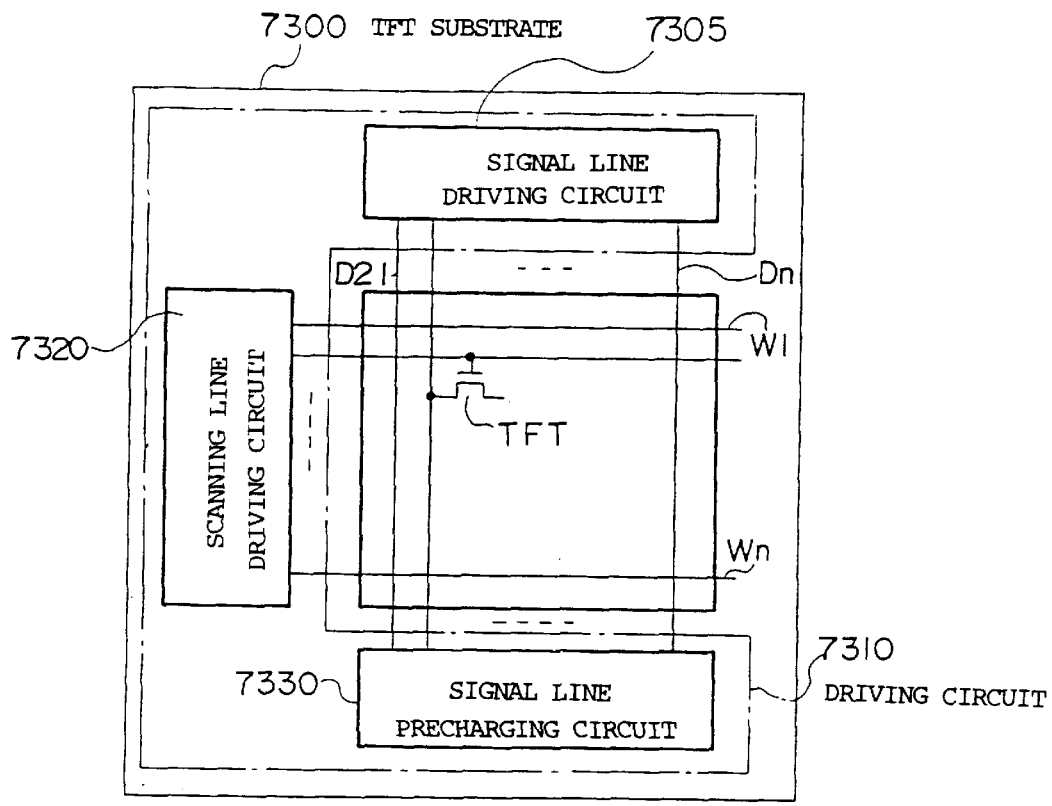
FIG. 70 is a plan view of a liquid crystal panel substrate according to the present invention.

FIGS. 69 and 70 illustrate the general construction of a liquid crystal display device (liquid crystal panel substrate).

As shown in FIG. 69, the liquid crystal display device includes a back light 7000, a polarizing plate 7200, a TFT substrate 7300, a liquid crystal 7400, an opposite substrate (color filter substrate) 7500, and a polarizing plate 7600.

In the present embodiment, as shown in FIG. 70, a driving circuit 7310 is formed on the TFT substrate 7300. The driving circuit 7310 includes a signal line driving circuit 7305, a scanning line driving circuit 7320, and a signal line precharging circuit 7330. On the TFT substrate 7300, scanning lines W1–Wn, signal lines D21–Dn, and pixel TFTs are also formed. It is desirable that these circuits are all formed using the common production process (such as a low temperature polysilicon process).

Figure 71:
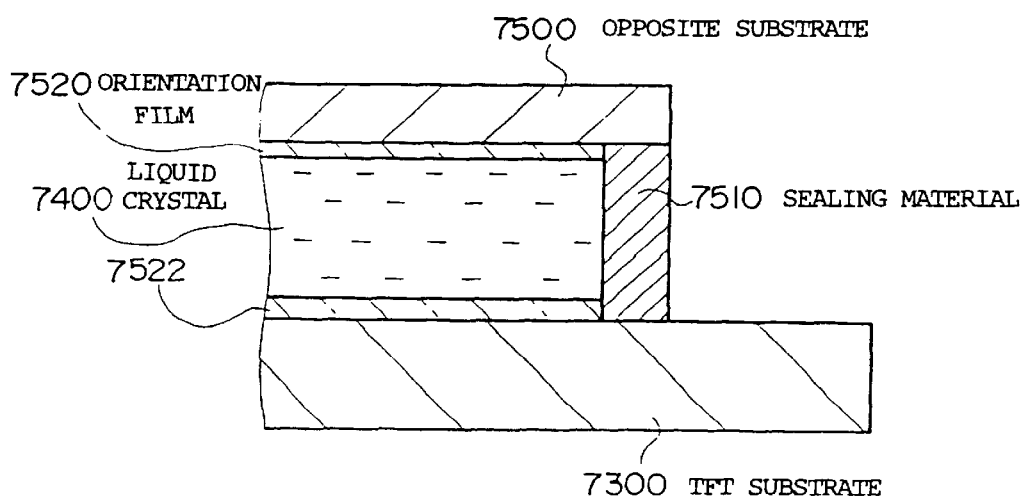
FIG. 71 is a side view, partially cross sectioned, of the liquid crystal panel substrate shown in FIG. 70.

Furthermore, as shown in FIG. 71, the liquid crystal 7400 is disposed in a sealed fashion between the TFT substrate 7300 and the opposite substrate 7500. There are also provided orientation films 7520 and 7522.

While the present invention has been described above with reference to specific embodiments, the description is illustrative of the invention and is not to be construed as limiting the invention. Various modifications and applications may occur to those skilled in the art without departing from the true spirit and scope of the invention. For example, the present invention may also be applied to the driving methods shown in FIGS. 72 and 73 in which a plurality of signal lines are simultaneously driven.

Figure 72:
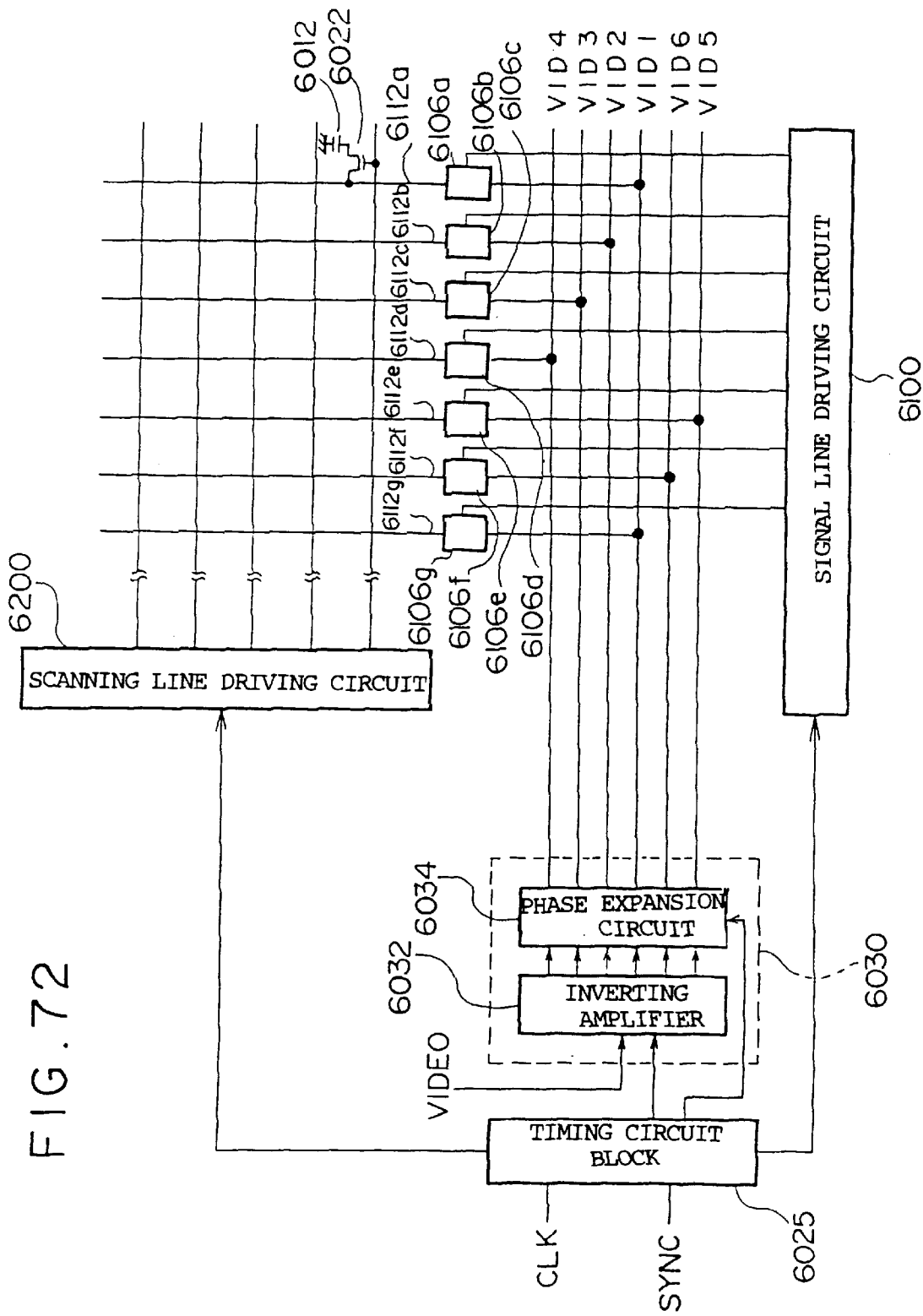
FIG. 72 is a circuit diagram illustrating an example of the construction of a driving circuit for simultaneously driving a plurality of signal lines.

In FIG. 72, there are seven signal lines 6112a–6112g which belong to the same group and which are driven at the same time. That is, in response to a timing signal from a signal line driving circuit 6100, sampling circuits 6106a–6106g are all activated at the same time so that image signals VD1–VD6 are held in parallel by these sampling circuits. In FIG. 72, a timing circuit block 6025 generates a timing signal by which the operation timing of various circuits are determined. A phase expansion circuit 6032 samples and holds an analog image signal VIDEO in response to a reference clock signal, and expands each pixel information into pixel data having a data length equal to an integral multiple of the reference clock. The resultant pixel data is output in parallel. An inverting amplifier 34 amplifies the image signal while periodically inverting the polarity of the image signal.

Figure 73:
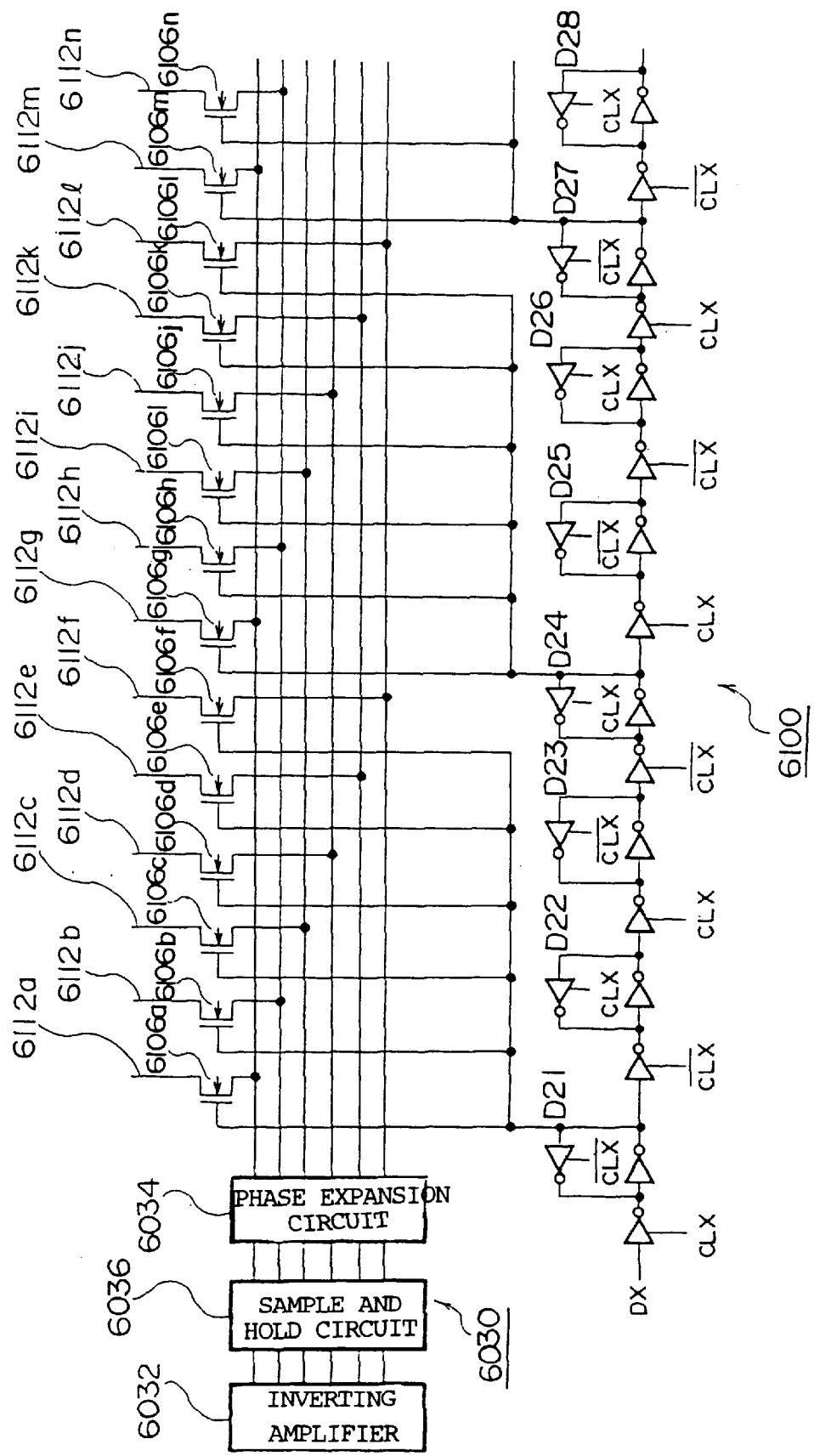
FIG. 73 is a circuit diagram illustrating the details of the sampling circuit and the signal line driving circuit shown in FIG. 72.

FIG. 73 illustrates the details of the sampling circuits 6106a–6106g and the signal line driving circuit 6100. The signal line driving circuit 6100 includes a plurality of clocked inverters each composed of three CMOS inverters. The sampling circuits 6106a–6106g each consist of an NMOS transistor.

As described earlier with reference to FIG. 46A, the present invention is based on the simple technique of switching the connection/disconnection between signal lines and precharging voltages. Therefore, the invention may also be advantageously applied to the driving method shown in FIGS. 72 and 73. In general, the invention may be applied to a wide variety of driving methods to achieve a precise and high-speed precharging operation on signal lines.

Furthermore, the invention may be applied not only to liquid crystal display devices of the active matrix type using TFTs, but also to liquid crystal display devices constructed using MIM elements as switching elements or passive liquid crystal devices using a STN liquid crystal.

What is claimed is:

1. A D/A converter comprising:

a plurality of conversion capacitors having capacitance values defined by factors depending on input bits, each of the conversion capacitors having a first end and a second end, the first end of each of the conversion capacitors being maintained at a fixed voltage;

a coupling capacitor having a first end and a second end, the first end of the coupling capacitor being maintained at a fixed voltage; and a plurality of switches having a common node and disposed between the second end of each of the conversion capacitors and the second end of said coupling capacitor, each of the switches being opened or closed in accordance with said input bits;

wherein an analog voltage corresponding to a digital input value is obtained between the second end of said coupling capacitor and the common node of said switches, such that the designed capacitance values of said plurality of conversion capacitors satisfies equation (1) described below:

$$Coj - dCj > \Sigma_{(i<j)}(Coi + dCi) \text{ (for all } j) \quad (1)$$

where $Ci$: ith conversion capacitance, $Coi$: designed value of the ith conversion capacitance, $dCi$: dispersion of the ith conversion capacitance, $Cj$: jth conversion capacitance, $Coj$: designed value of the jth conversion capacitance, $dCj$: dispersion of the jth conversion capacitance, $\Sigma_{(i<j)}$: sum for all i smaller than j, and for all j: indicating that the equation should be satisfied for all j.

2. The D/A converter according to claim 1, wherein each of the conversion capacitors includes an insulating film and two electrodes formed of at least one of a thin amorphous film and a thin polysilicon film, said insulating film being disposed between said two electrodes.

3. The D/A converter according to claim 1, wherein each of the switches is an analog switch, the switches including thin film transistors (TFTs);

each of the conversion capacitors include an insulating film and two electrodes formed of at least one of a thin amorphous film and a thin polysilicon film, said insulating film being disposed between said two electrodes; and said thin film transistors (TFTs) and said conversion capacitors are formed on a common substrate.

4. A method of designing the D/A converter of claim 1, said method comprising the following steps:

(step 1)
  setting Coi and dCi for all i;
(step 2)
  setting j such that j=2;
(step 3)
  checking whether equation (1) in claim 1 is satisfied or not, and if it is concluded that equation (1) is not satisfied, the value of Coj is modified;
(step 4)
  incrementing j; and
(step 5)
  performing steps 3 and 4 repeatedly for all j.

5. The method of designing the D/A converter of claim 4, wherein Coi is initially set to a value defined by a binary number.

6. A D/A converter comprising:

a plurality of conversion capacitors having capacitance values defined by factors depending on input bits, each of the conversion capacitors having a first end and a second end, the first end of each of the conversion capacitors being maintained at a fixed voltage;

a coupling capacitor having a first end and a second end, the first end of the coupling capacitor being maintained at a fixed voltage; and a plurality of switches having a common node and disposed between the second end of each of the conversion capacitors and the second end of said coupling capacitor, each of the switches being opened or closed in accordance with said input bits;

wherein an analog voltage corresponding to a digital input value is obtained between the second end of said coupling capacitor and the common node of said switches, such that the designed capacitance values of said plurality of conversion capacitors satisfies equation (2) described below:

$$\{Vc \cdot Cs + Vo(Coj - dCj)\}/\{Cs + (Coj - dCj)\} - \{Vc \cdot Cs + Vo(\Sigma_{(i<j)}(Coi + dCi))\}/\{Cs + \Sigma_{(i<j)}(Coi + dCi)\} > -Vth \text{(for all } j) \quad (2)$$

where $Cs$: coupling capacitance, $Vc$: voltage at the other end of the coupling capacitor before the switch is closed, $Vo$: voltage at the other end of the conversion capacitors before the switch is closed, $Coi$: designed value of the ith conversion capacitance, $dCi$: dispersion of the ith conversion capacitance, $Coj$: designed value of the jth conversion capacitance, $dCj$: dispersion of the jth conversion capacitance, $Vth$: maximum change (visually recognizable threshold value) in the output voltage of the D/A converter, which cannot be recognized by human eyes when an image is displayed in such a manner that the brightness of the image corresponds to the output voltage of the D/A converter, $\Sigma_{(i<j)}$: sum for all i smaller than j, for all j: indicating that the equation should be satisfied for all j.

7. A method of designing the D/A converter of claim 6, said method comprising the following steps:

(step 1)
setting Coi and dCi for all i,
(step 2)
setting j such that j=2;
(step 3)
checking whether equation (2) in claim 6 is satisfied or not, and if it is concluded that equation (2) is not satisfied, the value of Coj is modified;
(step 4)
incrementing j; and
(step 5) performing steps 3 and 4 repeatedly for all j.

8. A liquid crystal panel substrate, comprising:
a plurality of scanning lines; a plurality of signal lines intersecting the scanning lines;
thin film elements disposed at respective intersections between the scanning lines and the signal lines, for controlling electrical connections between a liquid crystal and the signal lines; and
a driving circuit for driving said plurality of signal lines that include the D/A converter of claim 1.

9. The liquid crystal panel substrate according to claim 8, wherein said conversion capacitors and said switches are formed by the same production process on the same substrate as the production process and the substrate of the thin film elements.

10. A liquid crystal display device that includes the liquid crystal panel substrate of claim 8.

11. A D/A converter for converting a digital signal that includes n (integer) bits Di (i=1, 2, . . . , n) to an analog output signal Vout, said D/A converter comprising:
n conversion capacitors Cxi corresponding to the respective bits Di of said digital signal and having electrodes;
at least one conversion selection line along which n different voltages Vxi corresponding to the respective bits Di of said digital signal;
an output line via which said analog output signal Vout is output; and
a first reference voltage line connected to one electrode of each of the n capacitors Cxi and maintained at a voltage Vs1; wherein
other electrodes of the conversion capacitors Cxi corresponding to the bits Di of the digital signal in an on-state are connected to said conversion selection line so that conversion charges corresponding to differences between the voltages Vxi and Vs1 are stored in the corresponding conversion capacitors Cxi;
the other electrodes of the conversion capacitors Cxi corresponding to the bits Di of the digital signal in an off-state are connected to a predetermined line; and
after said conversion charges have been stored, the other electrodes are electrically disconnected from at least one of said conversion selection line and said predetermined line and then connected to said output line so that said conversion charges are combined and an analog output signal Vout corresponding to the total charge is output.

12. The D/A converter according to claim 11, further comprising:
a second reference voltage line maintained at a voltage Vs2; and
a reference capacitor Cs formed on said output line, for storing a reference charge corresponding to the difference between the voltages Vs1 and Vs2 on the first and second reference voltage lines;
wherein said predetermined line, to which the other side electrodes of said conversion capacitors Cxi corresponding to the bits Di of the digital signal in the off-state are connected, is said first reference voltage line;
said total charge is the sum of said conversion charges and said reference charge; and
said analog output signal Vout is represented by $$\text{Vout} = (\Sigma Cxi(Di \cdot Vxi + Vs1(1-Di)) + Cs \cdot Vs2)/(\Sigma Cxi + Cs)$$

where Di have a value of 1 when the corresponding bits Di of the digital signal are in the on-state while they have a value of 0 when the corresponding bits Di of the digital signal are in the off-state.

13. The D/A converter according to claim 11, further comprising:
a first switch connected between the other side electrodes of said conversion capacitors Cxi and said conversion selection line;
a second switch connected between the other side electrodes of said conversion capacitors Cxi and said predetermined line; and
a third switch connected between the other side electrodes of said conversion capacitors Cxi and said output line.

14. The D/A converter according to claim 12, further comprising:
a first switch connected between the other side electrodes of said conversion capacitors Cxi and said conversion selection line;
a second switch connected between the other side electrodes of said conversion capacitors Cxi and said first reference voltage line;
a third switch connected between the other side electrodes of said conversion capacitors Cxi and said output line; and
a fourth switch for controlling electric connection so that a voltage is applied to said reference capacitor Cs from at least one of said first reference voltage line and said second reference voltage line.

15. The D/A converter according to claim 11, wherein n conversion selection lines supply n different voltages Vxi.

16. The D/A converter according to claim 13, wherein n conversion selection lines supply n different voltages Vxi.

17. The D/A converter according to claim 11, further comprising:
a high voltage line;
a low voltage line; and
n−1 resistors connected in series between said high voltage line and said low voltage line; wherein
said conversion selection lines include a line connecting one of said resistors directly to said high voltage line; lines connecting adjacent resistors; and a line connecting another of said resistors directly to said low voltage line.

18. The D/A converter according to claim 13, further comprising:
   a high voltage line;
   a low voltage line; and
   n−1 resistors connected in series between said high voltage line and said low voltage line; wherein
   said conversion selection lines include a line connecting one of said resistors directly to said high voltage line; lines connecting adjacent resistors; and a line connecting another of said resistors directly to said low voltage line.

19. The D/A converter according to claim 11, wherein one said conversion selection line is provided such that the voltage supplied on the conversion selection line varies with time so that n different voltages Vxi are supplied.

20. The D/A converter according to claim 13, wherein one said conversion selection line is provided such that the voltage supplied on the conversion selection line varies with time so that n different voltages Vxi are supplied.

21. The D/A converter according to claim 19, further comprising:
   n conversion pulse lines corresponding to the respective n conversion capacitors Cxi;
   wherein, when the time-varying voltage of said conversion selection line reaches a voltage Vxi to be supplied to a corresponding conversion capacitor Cxi, a pulse signal is applied to a corresponding one of said conversion pulse lines; and
   in response to said pulse signal, the voltage Vxi is supplied to the conversion capacitor Cxi.

22. The D/A converter according to claim 20, further comprising:
   n conversion pulse lines corresponding to the respective n conversion capacitors Cxi;
   wherein, when the time-varying voltage of said conversion selection line reaches a voltage Vxi to be supplied to a corresponding conversion capacitor Cxi, a pulse signal is applied to a corresponding one of said conversion pulse lines; and
   in response to said pulse signal, the voltage Vxi is supplied to the conversion capacitor Cxi.

23. The D/A converter according to claim 11, wherein said n different voltages Vxi supplied to said conversion selection lines define a geometric progression with a common ratio of 2.

24. The D/A converter according to claim 13, wherein said n different voltages Vxi supplied to said conversion selection lines define a geometric progression with a common ratio of 2.

25. The D/A converter according to claim 15, wherein said n different voltages Vxi supplied to said conversion selection lines define a geometric progression with a common ratio of 2.

26. The D/A converter according to claim 16, wherein said n different voltages Vxi supplied to said conversion selection lines define a geometric progression with a common ratio of 2.

27. The D/A converter according to claim 17, wherein said n different voltages Vxi supplied to said conversion selection lines define a geometric progression with a common ratio of 2.

28. The D/A converter according to claim 18, wherein said n different voltages Vxi supplied to said conversion selection lines define a geometric progression with a common ratio of 2.

29. The D/A converter according to claim 19, wherein said n different voltages Vxi supplied to said conversion selection lines define a geometric progression with a common ratio of 2.

30. The D/A converter according to claim 20, wherein said n different voltages Vxi supplied to said conversion selection lines define a geometric progression with a common ratio of 2.

31. The D/A converter according to claim 21, wherein said n different voltages Vxi supplied to said conversion selection lines define a geometric progression with a common ratio of 2.

32. The D/A converter according to claim 22, wherein said n different voltages Vxi supplied to said conversion selection lines define a geometric progression with a common ratio of 2.

33. A D/A converter for converting a digital signal that includes n (integer) bits Di (i=1, 2, . . . , n) to an analog output signal Vout, said D/A converter comprising:
   n conversion capacitors Cxi corresponding to the respective bits Di of said digital signal; and
   at least one conversion selection line along which different voltages Vxi are supplied; wherein
   said voltages Vxi and the capacitance values of said conversion capacitors Cxi are set so that conversion charges corresponding to the respective bit values Di of said digital signal are stored in corresponding conversion capacitors Cxi and so that an analog output signal Vout corresponding to at least one of the total value and the sum of said conversion charges is output.

34. A D/A conversion method for converting a digital signal that includes n (integer) bits Di (i=1, 2, . . . , n) to an analog output signal Vout, said method comprising the steps of:
   storing, for each on-state bit of said digital signal, a conversion charge into the corresponding one of n conversion capacitors Cxi in accordance with the corresponding voltage of n different voltages Vi, while maintaining the conversion charges stored in said conversion capacitors Cxi corresponding to the off-state bits Di of said digital signal constant regardless of the bits Di; and
   determining a sum of said conversion charges and supplying an analog output signal Vout corresponding to a total charge equal to the sum of said conversion charges.

35. The D/A conversion method according to claim 34, wherein if the capacitance values of said conversion capacitors Cxi are different from their designed values, said voltages Vi are adjusted so that the corresponding conversion charges become substantially equal to their designed values.

36. The D/A conversion method according to claim 34, wherein
   a reference charge is stored in a reference capacitor so that a corresponding increase occurs in said analog output signal Vout regardless of the on/off state of said digital signal Di; and
   said total charge is the sum of said conversion charges and said reference charge.

37. The D/A conversion method according to claim 34, wherein
   a reference charge is stored in a reference capacitor so that a corresponding increase occurs in said analog output signal Vout regardless of the on/off state of said digital signal Di; and said total charge is the sum of said conversion charges and said reference charge.

38. The D/A conversion method according to claim 37, wherein if the capacitance value of said reference capacitor is different from its designed value, the applied voltage is adjusted so that said reference charge becomes substantially equal to its designed value.

39. A D/A conversion method for converting a digital signal that includes n (integer) bits Di (i=1, 2, . . . , n) to an analog output signal Vout, said method comprising the steps of:

selecting, for each on-state bit Di of said digital signal, one voltage from a plurality of different voltages Vxi in accordance with each on-state bit Di of said digital signal, and storing a corresponding conversion charge into the corresponding one of the n conversion capacitors Cxi, while maintaining the conversion charges stored in said conversion capacitors Cxi corresponding to the off-state bits Di of said digital signal constant regardless of the bits Di; and determining a sum of said conversion charges and supplying an analog output signal Vout corresponding to a total charge equal to the sum of said conversion charges.

40. A liquid crystal panel substrate for use as one of two substrates of a liquid crystal panel, said substrate comprising:

a driving circuit for driving said liquid crystal panel;

a pixel electrode for applying a voltage to a liquid crystal; and a thin film transistor for controlling a supply of voltage to said pixel electrode; wherein said driving circuit includes the D/A converter of claim 11.

41. A liquid crystal panel substrate for use as one of two substrates of a liquid crystal panel, said substrate comprising:

a driving circuit for driving said liquid crystal panel;

a pixel electrode for applying a voltage to a liquid crystal; and a thin film transistor for controlling a supply of voltage to said pixel electrode; wherein said driving circuit includes the D/A converter according to claim 12.

42. The liquid crystal panel substrate according to claim 41, wherein at least one of said conversion capacitors Cxi and said reference capacitor Cs is produced on a common substrate using the same production process as that used to produce said thin film transistor.

43. A liquid crystal display device that includes the liquid crystal panel substrate of claim 40.

44. A liquid crystal display device that includes the liquid crystal panel substrate of claim 42.

45. The liquid crystal display device according to claim 43, wherein one horizontal scanning period includes a scanning signal selection period and a blanking period disposed between said selection period and a subsequent selection period; and the storage of said total charge and the supply of the analog output signal Vout are performed during said blanking period.

46. The liquid crystal display device according to claim 43, wherein one horizontal scanning period includes a scanning signal selection period and a blanking period disposed between said selection period and a subsequent selection period;

the storage of said total charge is started in said blanking period; and in the following horizontal scanning period, said storage of the total charge is completed and the analog output signal Vout is supplied.

47. A method of precharging signal lines of an active matrix type of display device, said display device including a plurality of scanning lines, a plurality of signal lines, and switching elements connected to the respective scanning lines and the respective signal lines, said precharging being performed before supplying an image signal to said signal lines, said method comprising the steps of:

preparing switches such that each signal line has its own switch that selects one of different precharging DC voltages and selectively connects the signal line to the selected precharging DC voltage; and operating said switches so that said signal lines are connected to one of said precharging DC voltages, thereby precharging said signal line into the same polarity as the polarity of said image signal relative to a center voltage of its amplitude.

48. The method of precharging signal lines according to claim 47, wherein interconnection lines are maintained at the respective precharging DC voltages, said interconnection lines being provided such that each precharging DC voltage has its own interconnection line.

49. The method of precharging signal lines according to claim 48, wherein the equivalent capacitance of each interconnection line is greater than the equivalent capacitance of each signal line.

50. The method of precharging signal lines according to claim 47, wherein the precharging polarity is inverted with time every one or more scanning lines.

51. The method of precharging signal lines according to claim 48, wherein the precharging polarity is inverted with time every one or more scanning lines.

52. The method of precharging signal lines according to claim 49, wherein the precharging polarity is inverted with time every one or more scanning lines.

53. The method of precharging signal lines according to claim 47, wherein when the active matrix type of display device is driven line by line, the precharging polarity is periodically inverted every one or more signal lines.

54. The method of precharging signal lines according to claim 47, wherein when the active matrix type of display device is driven pixel by pixel, the precharging polarity is periodically inverted every one or more signal lines.

55. The method of precharging signal lines according to claim 50, wherein said precharging of the signal lines is performed so that at least some signal lines are simultaneously subjected to the precharging during a certain period in a horizontal selection period prior to a horizontal blanking period.

56. The method of precharging signal lines according to claim 53, wherein said precharging of the signal lines is performed so that at least some signal lines are simultaneously subjected to the precharging during a certain period in a horizontal selection period prior to a horizontal blanking period.

57. The method of precharging signal lines according to claim 54, wherein said precharging of the signal lines is performed so that at least some signal lines are simultaneously subjected to the precharging during a certain period in a horizontal selection period prior to a horizontal blanking period.

58. The method of precharging signal lines according to claim 47, wherein when the active matrix type of display device is driven pixel by pixel, said switches connected to the respective signal lines are sequentially switched at predetermined times in a horizontal blanking period and a horizontal selection period before performing said pixel-by-pixel driving operation, thereby precharging the signal lines.

59. The method of precharging signal lines according to claim 47, wherein said different precharging DC voltages correspond to the respective gray levels of said image signal.

60. The method of precharging signal lines according to claim 53, wherein said different precharging DC voltages correspond to the respective gray levels of said image signal.

61. The method of precharging signal lines according to claim 54, wherein said different precharging DC voltages correspond to the respective gray levels of said image signal.

62. The method of precharging signal lines according to claim 55, wherein said different precharging DC voltages correspond to the respective gray levels of said image signal.

63. The method of precharging signal lines according to claim 56, wherein said different precharging DC voltages correspond to the respective gray levels of said image signal.

64. The method of precharging signal lines according to claim 57, wherein said different precharging DC voltages correspond to the respective gray levels of said image signal.

65. The method of precharging signal lines according to claim 58, wherein said different precharging DC voltages correspond to the respective gray levels of said image signal.

66. The method of precharging signal lines according to claim 47, wherein charging/discharging currents of said signal lines are adjusted by controlling a period of time for which said switches are connected to said signal lines thereby precharging said signal lines to predetermined voltage levels.

67. The method of precharging signal lines according to claim 53, wherein charging/discharging currents of said signal lines are adjusted by controlling a period of time for which said switches are connected to said signal lines thereby precharging said signal lines to predetermined voltage levels.

68. The method of precharging signal lines according to claim 54, wherein charging/discharging currents of said signal lines are adjusted by controlling a period of time for which said switches are connected to said signal lines thereby precharging said signal lines to predetermined voltage levels.

69. The method of precharging signal lines according to claim 55, wherein charging/discharging currents of said signal lines are adjusted by controlling a period of time for which said switches are connected to said signal lines thereby precharging said signal lines to predetermined voltage levels.

70. The method of precharging signal lines according to claim 56, wherein charging/discharging currents of said signal lines are adjusted by controlling a period of time for which said switches are connected to said signal lines thereby precharging said signal lines to predetermined voltage levels.

71. The method of precharging signal lines according to claim 57, wherein charging/discharging currents of said signal lines are adjusted by controlling a period of time for which said switches are connected to said signal lines thereby precharging said signal lines to predetermined voltage levels.

72. The method of precharging signal lines according to claim 58, wherein charging/discharging currents of said signal lines are adjusted by controlling a period of time for which said switches are connected to said signal lines thereby precharging said signal lines to predetermined voltage levels.

73. A method of precharging signal lines of an active matrix type of display device, said display device including a plurality of scanning lines; a plurality of signal lines; switching elements connected to the respective scanning lines and the respective signal lines, said precharging being performed before supplying an image signal to said signal lines, said method comprising the steps of:

preparing a first precharging voltage line, a second precharging voltage line having a voltage different from that of said first precharging voltage line, and switches such that each signal line has its own switch that connects the signal line to at least one of said first precharging voltage line and said second precharging voltage line; and operating said switches so that said signal lines are connected to at least one of said first precharging voltage line and said second precharging voltage line thereby precharging said signal lines, wherein the voltages on said first and second precharging voltage lines are periodically inverted.

74. A circuit for precharging signal lines of an active matrix type of display device, said display device including a plurality of scanning lines; a plurality of signal lines; switching elements connected to the respective scanning lines and the respective signal lines, said precharging being performed before supplying an image signal to said signal lines, said circuit comprising:

a first precharging voltage line;

a second precharging voltage line having a voltage different from that of said first precharging voltage line;

switches for selectively connecting said signal lines to at least one of said first precharging voltage line and said second precharging voltage line; and a switching controller for controlling the on/off operation of said switches.

75. A circuit for precharging signal lines of a liquid crystal display device, said display device including a plurality of scanning lines; a plurality of signal lines; switching elements disposed at respective intersections between said scanning lines and said signal lines for controlling the electrical connections between a liquid crystal and the signal lines, said precharging being performed before supplying an image signal to said signal lines, said circuit comprising:

a first precharging voltage line;

a second precharging voltage line having a voltage different from that of said first precharging voltage line;

first switches provided such that each signal line has its own first switch for switching connection/disconnection between said signal line and said first precharging voltage line;

second switches provided such that each signal line has its own second switch for switching connection/disconnection between said signal line and said second precharging voltage line; and a switching controller for controlling the on/off operation of said first and second switches.

76. The circuit according to claim 75, further comprising a shift register for generating a pulse used to precharge said signal lines in a pixel-by-pixel fashion.

77. The circuit according to claim 76, wherein said shift register also operates as a shift register for sequentially supplying an image signal to said signal lines.

78. A liquid crystal panel substrate having the circuit for precharging signal lines of claim 74.

79. The liquid crystal panel substrate according to claim 78, wherein the same production process is used to produce on the same substrate said circuit for precharging signal lines and switching elements for controlling the electrical connections between the liquid crystal and the signal lines, said switches being disposed at respective intersections between said scanning lines and said signal lines.

80. A liquid crystal display device that includes the liquid crystal panel substrate of claim 78.

81. A liquid crystal display device that includes the liquid crystal panel substrate of claim 79.

* * * * *